US008694877B2

(12) United States Patent
Parthasarathy et al.

(10) Patent No.: US 8,694,877 B2
(45) Date of Patent: *Apr. 8, 2014

(54) MAX-LOG-MAP EQUIVALENCE LOG LIKELIHOOD RATIO GENERATION SOFT VITERBI ARCHITECTURE SYSTEM AND METHOD

(75) Inventors: Sivagnanam Parthasarathy, Carlsbad, CA (US); Lun Bin Huang, San Diego, CA (US); Alessandro Risso, San Diego, CA (US)

(73) Assignee: STMicroelectronics, Inc., Coppell, TX (US)

( * ) Notice: Subject to any disclaimer, the term of this patent is extended or adjusted under 35 U.S.C. 154(b) by 383 days.

This patent is subject to a terminal disclaimer.

(21) Appl. No.: 12/924,707

(22) Filed: Oct. 1, 2010

(65) Prior Publication Data

US 2011/0197112 A1    Aug. 11, 2011

Related U.S. Application Data

(60) Provisional application No. 61/247,899, filed on Oct. 1, 2009.

(51) Int. Cl.
*H03M 13/03* (2006.01)

(52) U.S. Cl.
USPC ........... 714/795; 714/796; 714/792; 375/262; 375/265; 375/341

(58) Field of Classification Search
USPC ................. 714/755, 786, 780, 792, 794–796; 702/9; 375/262, 341, 265
See application file for complete search history.

(56) References Cited

U.S. PATENT DOCUMENTS

| 6,492,918 | B1 | 12/2002 | Rezzi et al. | |
|---|---|---|---|---|
| 6,662,338 | B1 * | 12/2003 | Rezzi et al. | 714/795 |
| 2004/0010749 | A1 * | 1/2004 | Ozdemir | 714/795 |

OTHER PUBLICATIONS

Fossorier et al. (May 1998) "On the Equivalence Between Sova and Max-Log-Map Decodings"; IEEE Communication Letters; 2(5):137.

Chip Fleming (July 5, 2002) "A Tutorial on Convolutional Coding With Viterbi Decoding"; http://web.aanet.com.au/~ospiropo/tech/viterbi/TIC1Tutorial_Viterbi.pdf; 28 Pages.

* cited by examiner

*Primary Examiner* — Guy Lamarre
(74) *Attorney, Agent, or Firm* — Graybeal Jackson LLP

(57) ABSTRACT

A modified soft output Viterbi algorithm (SOVA) detector receives a sequence of soft information values and determines a best path and an alternate path for each soft information value and further determines, when the best and alternate paths lead to the same value for a given soft information value, whether there is a third path departing from the alternate path that leads to an opposite decision with respect to the best path for a given soft information value. The SOVA detector then considers this third path when updating the reliability of the best path. The modified SOVA detector achieves max-log-map equivalence effectively through the Fossorier approach and includes modified reliability metric units for the first N stages of the SOVA detector, where N is the memory depth of a given path, and includes conventional reliability metric units for the remaining stages of the detector.

18 Claims, 53 Drawing Sheets

| $A_{k+2}$ | $A_{k+1}$ | $A_k$ | $A_{k-1}$ |
|---|---|---|---|
| 0 | 0 | 0 | 0 |
| 1 | 1 | 0 | 0 |
| 0 | 0 | 1 | 0 |
| 1 | 1 | 1 | 0 |

Reg 0, Reg 1, Reg 2, Reg 3

| | $A_{k+4}$ | $A_{k+3}$ | $A_{k+2}$ | $A_{k+1}$ | $A_k$ | $A_{k-1}$ |
|---|---|---|---|---|---|---|
| Reg 0 | 0 | 0 | 1 | 1 | 0 | 0 |
| Reg 1 | 1 | 0 | 1 | 1 | 0 | 0 |
| Reg 2 | 0 | 1 | 1 | 1 | 0 | 0 |
| Reg 3 | 1 | 1 | 1 | 1 | 0 | 0 |

| | $A_{k+5}$ | $A_{k+4}$ | $A_{k+3}$ | $A_{k+2}$ | $A_{k+1}$ | $A_k$ | $A_{k-1}$ |
|---|---|---|---|---|---|---|---|
| Reg 0 | 0 | 0 | 0 | 1 | 1 | 0 | 0 |
| Reg 1 | 1 | 0 | 0 | 1 | 1 | 0 | 0 |
| Reg 2 | 0 | 1 | 0 | 1 | 1 | 0 | 0 |
| Reg 3 | 1 | 1 | 0 | 1 | 1 | 0 | 0 |

|       | $A_{k+6}$ | $A_{k+5}$ | $A_{k+4}$ | $A_{k+3}$ | $A_{k+2}$ | $A_{k+1}$ | $A_k$ | $A_{k-1}$ |
|-------|---|---|---|---|---|---|---|---|
| Reg 0 | 0 | 0 | 1 | 0 | 1 | 1 | 0 | 0 |
| Reg 1 | 1 | 0 | 1 | 0 | 1 | 1 | 0 | 0 |
| Reg 2 | 0 | 1 | 1 | 0 | 1 | 1 | 0 | 0 |
| Reg 3 | 1 | 1 | 1 | 0 | 1 | 1 | 0 | 0 |

MAX-LOG-MAP EQUIVALENCE LOG LIKELIHOOD RATIO GENERATION SOFT VITERBI ARCHITECTURE SYSTEM AND METHOD

PRIORITY CLAIM

The present application claims the benefit of U.S. Provisional Patent Application No. 61/247,899, filed Oct. 1, 2009, which application is incorporated herein by reference in its entirety.

TECHNICAL FIELD

Embodiments are related generally to electronic circuits, and more particularly to a Viterbi detector and technique for recovering information from a read signal wherein a modified Viterbi approach achieves max-log-map equivalence through a more efficient implementation that reduces power consumption and reduces physical size of the implementation.

BACKGROUND

The traditional soft output Viterbi algorithm (SOVA) receives soft decisions/inputs or soft information values for each bit of information being communicated, where a soft information value includes information on both the value of a bit of data the reliability that bit of data. From these soft information values the SOVA computes log-likelihood ratios (LLRs) for each bit as the minimum difference between the log of the probability of the path leading to a 0 or 1 decision for a given bit and the log of the probability of the path leading to the opposite decision for the bit. The log of the probability of the path is represented by path metric value which is the sum of a state metric and a branch metric at time a time k. The difference between the path metrics is considered only if the best path and its alternate lead to a different decision. In this case the log-likelihood ratio LLR is computed in the same way as for the max-log-map algorithm, which is another decoding algorithm as will be appreciated by those skilled in the art. The path metric difference is minimized to thereby maximize the probability (path metric) of the path leading to a decision that a bit is a 1 versus an alternate path leading to a decision that a bit is a 0. As will be appreciated by those skilled in the art, the SOVA does not perform optimally when the alternate path leads to the same decision for the bit as the best path. In this situation the traditional SOVA considers the path metric difference in updating reliability information.

SUMMARY

In one embodiment, a modified soft output Viterbi algorithm (SOVA) detector receives a sequence of soft information values. The detector determines a best path and an alternate path for each of these soft information values and further determines, when the best and alternate paths lead to the same value for a given soft information value, whether there is a third path departing from the alternate path that leads to an opposite decision with respect to the best path for a given soft information value. The modified SOVA detector then considers this third path when updating the reliability of the best path. Embodiments are directed to a modified SOVA detector that achieves max-log-map equivalence effectively through the Fossorier approach but with an efficient implementation that reduces power consumption and physical size of the implementation, as will be described in more detail below. More specifically, in one embodiment the modified SOVA detector includes modified reliability metric units for the first N stages of the detector, where N is the memory depth of a given path, and includes conventional reliability metric units for the remaining stages of the detector.

BRIEF DESCRIPTION OF THE DRAWINGS

FIG. 4B shows the corresponding contents of the Viterbi-detector shift registers of FIG. 2 for the trellis diagram of FIG. 4A.

FIG. 5B shows the corresponding contents of the Viterbi-detector shift registers of FIG. 2 for the trellis diagram of FIG. 5A.

FIG. 6B shows the corresponding contents of the Viterbi-detector shift registers of FIG. 2 for the trellis diagram of FIG. 6A.

FIG. 7B shows the corresponding contents of the Viterbi-detector shift registers of FIG. 2 for the trellis diagram of FIG. 7A.

FIG. 8B shows the corresponding contents of the Viterbi-detector shift registers of FIG. 2 for the trellis diagram of FIG. 8A.

FIG. 9B shows the corresponding contents of the Viterbi-detector shift registers of FIG. 2 for the trellis diagram of FIG. 9A.

FIG. 10B shows the corresponding contents of the Viterbi-detector shift registers of FIG. 2 for the trellis diagram of FIG. 10A.

DESCRIPTION

One approach to address this sub-optimal performance situation is that proposed by Fossorier et al. in Fossorier, Marc P. C., et al., "On The Equivalence Between SOVA and Max-Log-MAP Decodings", IEEE Communications Letters, vol. 2, No. 5, pp. 137-139, May 1998. This approach claims that if there is a third path departing from the alternate path that leads to an opposite decision with respect to the best path, this path should be considered in updating of the reliability of the best path. Embodiments are directed to a modified Viterbi approach that achieves max-log-map equivalence effectively through the Fossorier approach but with an efficient implementation that reduces power consumption and physical size of the implementation, as will be described in more detail below.

In the present description, certain details are set forth in conjunction with the described embodiments to provide a sufficient understanding. One skilled in the art will appreciate, however, that the embodiments may be practiced without these particular details. Furthermore, one skilled in the art will appreciate that the example embodiments described below do not limit the scope of the present disclosure, and will also understand that various modifications, equivalents, and combinations of the disclosed embodiments and components of such embodiments are within the scope of the present disclosure. Embodiments including fewer than all the components of any of the respective described embodiments may also be within the scope although not expressly described in detail below. Finally, the operation of well-known components and/or processes has not been shown or described in detail below to avoid unnecessarily obscuring the present disclosure.

Figure 1:
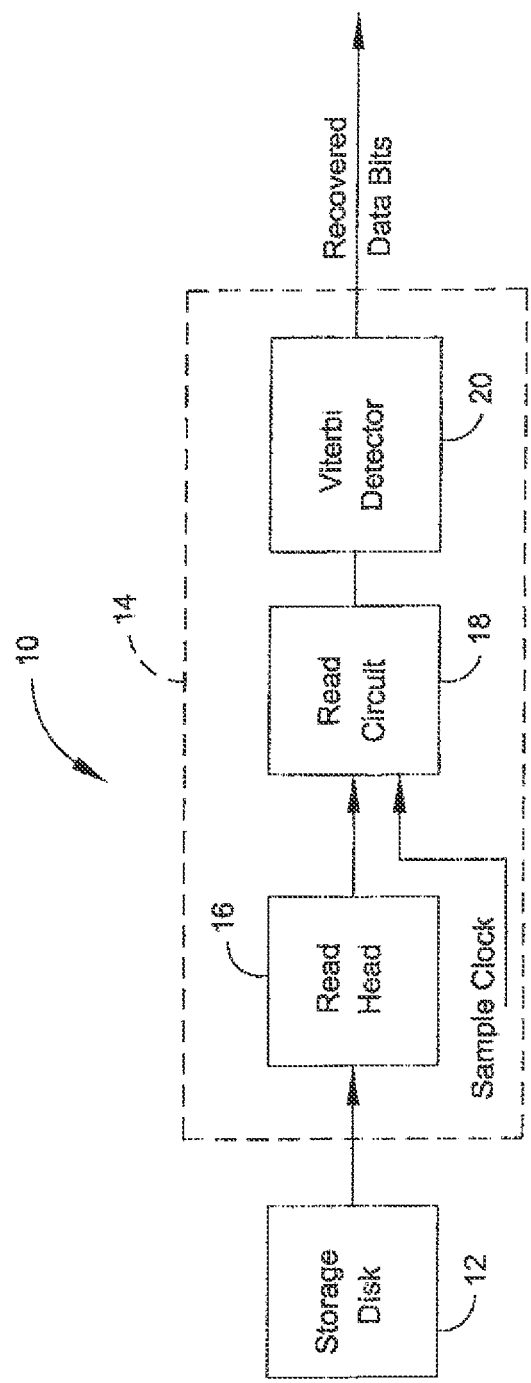
FIG. 1 is a block diagram of a conventional disk-drive read channel.

An overview of conventional read channels, Viterbi detectors, and data recovery techniques follows to assist understanding of embodiments described thereafter. FIG. 1 is a circuit block diagram of part of a conventional disk drive 10, which includes a magnetic storage disk 12 and a read channel 14 for reading data from the disk 12. The read channel 14 includes a read head 16 for sensing the data stored on the disk 12 and for generating a corresponding read signal. A read circuit 18 amplifies and samples the read signal and digitizes the samples, and a digital Viterbi detector 20 recovers the stored data from the digitized samples.

Typically, the greater the data-storage density of the disk 12, the greater the noise the read head 16 picks up while reading the stored data, and thus the lower the SNR of the read signal. The disk 12 typically has a number of concentric data tracks (not shown in FIG. 1) that each have a respective number of data-storage locations. The storage density of the disk 12 is a function of the distances between storage locations along the circumferences of the respective tracks and the distances between respective tracks. The smaller these distances, the higher the storage density, and thus the closer the surrounding storage locations to the read head 16 when it is reading the surrounded location. The closer the surrounding locations to the read head 16, the greater the magnitudes of the magnetic fields that these locations respectively generate at the head 16, and thus the greater the Inter Symbol Interference (ISI). The greater the ISI, the smaller the root-mean-square (rms) amplitude of the read signal. In addition, as the storage density increases, the media noise increases. Generally, the media noise results from the uncertainty in the shapes of the read pulses that constitute the read signal. This uncertainty is caused by unpredictable variations in the positions of the data storage locations from one data-write cycle to the next. Moreover, for a given disk spin rate, as the linear storage density along the tracks increases, the bandwidth of the read head 16 must also increase. This increase in bandwidth causes an increase in the white noise generated by the read head 16. The SNR of the read signal for a particular storage location is the ratio of the rms amplitude of the corresponding read pulse to the sum of the amplitudes of the corresponding media and white noise. Thus, the lower the rms amplitudes of the read pulses and the greater the amplitudes of the media and/or white noise, the lower the SNR of the read signal.

Unfortunately, the Viterbi detector 20 often requires the read signal from the head 16 to have a minimum SNR, and thus often limits the data-storage density of the disk 12. Typically, the accuracy of the detector 20 decreases as the SNR of the read signal decreases. As the accuracy of the detector 20 decreases, the number and severity of read errors, and thus the time needed to correct these errors, increases. Specifically, during operation of the read channel 14, if the error processing circuit (not shown) initially detects a read error, then it tries to correct the error using conventional error-correction techniques. If the processing circuit cannot correct the error using these techniques, then it instructs the read channel 14 to re-read the data from the disk 12. The time needed by the processing circuit for error detection and error correction and the time needed by the read channel 14 for data re-read increase as the number and severity of the read errors increase. As the error-processing and data re-read times increase, the effective data-read speed of the channel 14, and thus of the disk drive 10, decreases. Therefore, to maintain an acceptable effective data-read speed, the read channel 14 is rated for a minimum read-signal SNR. Unfortunately, if one decreases the SNR of the read signal below this minimum, then the accuracy of the read channel 14 degrades such that at best, the effective data-read speed of the disk drive 10 falls below its maximum rated speed, and at worst, the disk drive 10 cannot accurately read the stored data.

Referring to FIG. 1, the digital Viterbi detector 20 "recovers" the data stored on the disk 12 from the digitalized samples of the read signal generated by the read circuit 18. Specifically, the read head 16 reads data from the disk 12 in a serial manner. That is, assuming the stored data is binary data, the read head 16 senses one or more bits at a time as the surface of the disk 12 spins it, and generates a series of sense voltages that respectively correspond to the sensed bits. This series of sense voltages composes the read signal, which consequently represents these sensed data bits in the order in which the head 16 sensed them. Unfortunately, because the disk 12 spins relatively fast with respect to the read head 16, the read signal is not a clean logic signal having two distinct levels that respectively represent logic 1 and logic 0. Instead, the read signal is laden with noise and inter-symbol interference (ISI), and thus more closely resembles a continuous analog signal than a digital signal. Using the sample clock, which is generated with circuitry that is omitted from FIG. 1, the read circuit 18 samples the read signal at points that correspond to the read head 16 being aligned with respective bit storage locations on the surface of the disk 12. The read circuit 18 digitizes these samples, and from these digitized samples, the Viterbi detector 20 ideally generates a sequence of bit values that is the same as the sequence of bit values stored on the disk 12 as described below.

Figure 2:
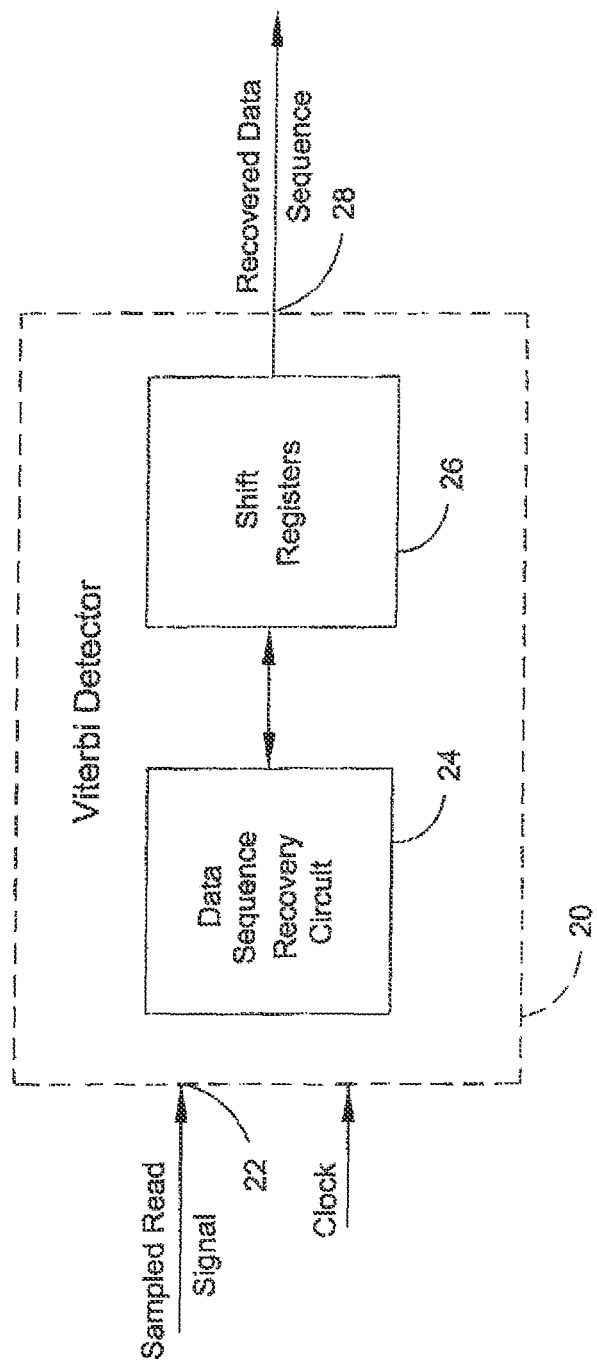
FIG. 2 is a block diagram of the conventional Viterbi detector of FIG. 1.

FIG. 2 is a block diagram of the Viterbi detector 20 of FIG. 1. The detector 20 receives the digitized read-signal samples from the read circuit 18 (FIG. 1) on an input terminal 22. A data-sequence-recovery circuit 24 processes these samples to identify the bits represented by the read signal and then provides these identified bits to shift registers 26, which reproduce the stored data sequence from these bits. The detector 20 then provides this reproduced data sequence on an output terminal 28 as the recovered data sequence.

For example purposes, the operation of the Viterbi detector 20 is discussed in conjunction with an Extended Partial Response 2 (EPR2) data-recovery protocol, it being understood that the concepts discussed here generally apply to other Viterbi detectors and other data-recovery protocols.

Assuming a noiseless read signal and binary stored data, the read circuit 18, which in this example is designed to implement the EPR2 protocol, generates ideal digitized read-signal samples B having three possible relative values: −1, 0, and 1. These values represent respective voltage levels of the read signal, and are typically generated with a 6-bit analog-to-digital (ND) converter. For example, according to one 6-bit convention, −1=111111, 0=000000, and 1=011111. The value of the ideal sample B at the current sample time k, $B_k$, is related to the bit values of the stored data sequence according to the following equation:

$$B_k = A_k - A_{k-1} \quad \quad 1)$$

$A_k$ is the current bit of the stored data sequence, i.e., the bit that corresponds to the portion of the read signal sampled at the current sample time k. Likewise, $A_{k-1}$ is the immediately previous bit of the stored data sequence, i.e., the bit that corresponds to the portion of the read signal sampled at the immediately previous sample time k−1. Table I includes a sample portion of a sequence of bit values A and the corresponding sequence of ideal samples B for sample times k–k+6.

TABLE I

|   | k | k+1 | k+2 | k+3 | k+4 | k+5 | k+6 |
|---|---|-----|-----|-----|-----|-----|-----|
| A | 0 | 1   | 1   | 0   | 1   | 0   | 0   |
| B | 0 | 1   | 0   | −1  | 1   | −1  | 0   |

Referring to Table I, $B_{k+1}=A_{k+1}-A_k=1$, $B_{k+2}=A_{k+2}-A_{k+1}=0$, and so on. Therefore, by keeping track of the immediately previous bits A, one can easily calculate the value of current bit A from the values of the immediately previous bit A and the current sample B. For example, by rearranging equation (1), we get the following:

$$A_k = B_k + A_{k-1} \quad \quad 2)$$

Equation (2) is useful because $B_k$ and $A_{k-1}$ are known and $A_k$ is not. That is, we can calculate the unknown value of bit $A_k$ from the values of the current sample $B_k$ and the previously calculated, and thus known, bit $A_{k-1}$. It is true that for the very first sample $B_k$ there is no previously calculated value for $A_{k-1}$. But the values of $A_k$ and $A_{k-1}$ can be determined from the first $B_k$ that equals 1 or −1, because for 1 and −1 there is only one respective solution to equation (1). Therefore, a data sequence can begin with a start value of 010101 . . . to provide accurate initial values for $B_k$, $A_k$, and $A_{k-1}$.

Unfortunately, the read signal is virtually never noiseless, and thus the read circuit 18 generates non-ideal, i.e., noisy, digitized samples Z, which differ from the ideal samples B by respective noise components. Table II includes an example sequence of noisy samples Z that respectively corresponds to the ideal samples B and the bits A of Table 1.

TABLE II

|   | k   | k+1 | k+2  | k+3  | k+4 | k+5  | k+6 |
|---|-----|-----|------|------|-----|------|-----|
| A | 0   | 1   | 1    | 0    | 1   | 0    | 0   |
| B | 0   | 1   | 0    | −1   | 1   | −1   | 0   |
| Z | 0.1 | 0.8 | −0.2 | −1.1 | 1.2 | −0.9 | 0.1 |

For example, the difference between $Z_k$ and $B_k$ equals a noise component of 0.1, and so on.

According to one technique, a maximum-likelihood detector (not shown) recovers the bits A of the stored data sequence by determining and then using the sequence of ideal samples B that is "closest" to the sequence of noisy samples Z. The closest sequence of samples B is defined as being the shortest Euclidean distance λ from the sequence of samples Z. Thus, for each possible sequence of samples B, the detector 20 calculates the respective distance λ according to the following equation:

$$\lambda = \sum_{y=k}^{y=k+n} (Z_y - B_y)^2 \quad \quad 3)$$

For example, for the B and Z sequences of Table II, one gets:

$$\lambda = (0.1-0)^2 + (0.8-1)^2 + (-0.2-0)^2 + (-1.1--1)^2 + (1.2-1)^2 + (-0.9--1)^2 + (0.1-0)^2 = 0.16 \quad \quad 4)$$

Referring again to Tables I and II, there are seven samples B in each possible sequence of B samples. Because the bits A each have two possible values (0 and 1) and because the sequence of B samples is constrained by equations (1) and (2), there are $2^7$ possible sequences of B samples (the sequence of B samples in Tables I and II is merely one of these possible sequences). Using equation (4), a maximum-likelihood detector should calculate $2^7$ λ values, one for each possible sequence of B samples. The sequence of B samples that generates the smallest λ value is the closest to the generated sequence of Z samples. Once the maximum-likelihood detector identifies the closest sequence of B samples, it uses these B samples in conjunction with equation (2) to recover the bits A of the stored data sequence.

Unfortunately, because most sequences of Z samples, and thus the corresponding sequences of B samples, include hundreds or thousands of samples, this maximum-likelihood technique is typically too computationally complex and time consuming to be implemented in a practical manner. For example, for a relatively short data sequence having one thousand data bits A, i=999 in equation (3) such that the Z sequence includes 1000 Z samples and there are $2^{1000}$ possible B sequences that each include 1000 B samples. Therefore, using equation (3), the maximum-likelihood detector would have to calculate $2^{1000}$ values for λ, each of these calculations involving 1000 Z samples and 1000 B samples! Consequently, the circuit complexity and time required to perform these calculations would likely make the circuitry for a maximum-likelihood detector too big, too expensive, or too slow for use in a conventional disk drive.

Therefore, referring to FIGS. 3-11, the Viterbi detector 20 (FIG. 2) implements a technique called dynamic programming to identify the sequence of ideal B samples that is closest to the sequence of actual Z samples. Dynamic programming is less computationally intensive than the above-described technique because it experiences only a linear increase in processing complexity and time as the length of the data stream grows. Conversely, the above-described technique experiences an exponential increase in processing complexity and time as the length of the data stream grows.

Figure 3:
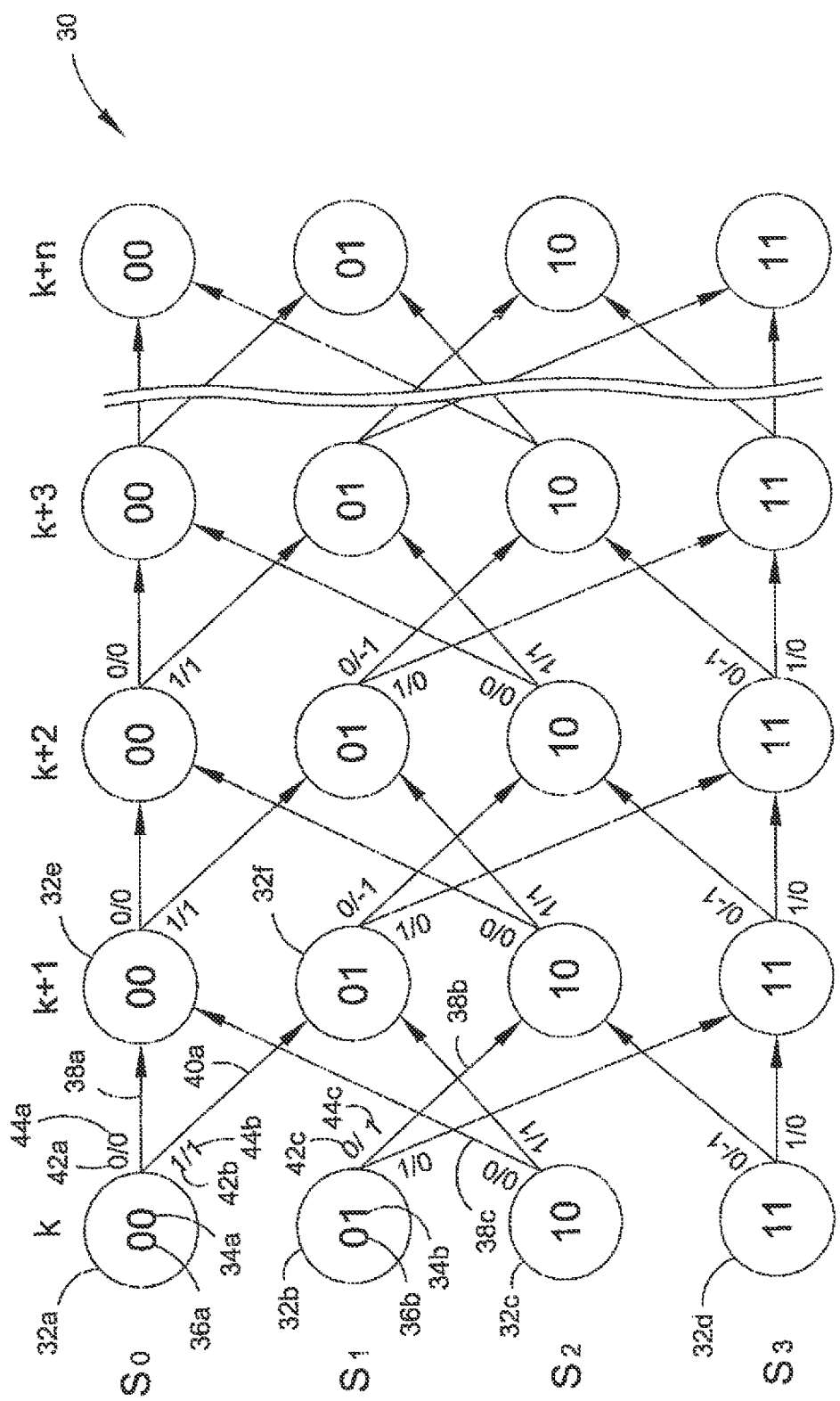
FIG. 3 is a conventional trellis diagram for the Viterbi detector of FIG. 2.

Referring to FIG. 3, dynamic programming is best explained using a trellis diagram 30, which represents a detection algorithm that the Viterbi detector 20 executes. The trellis 30 includes possible data-stream states S0-S3 at Z sample times k-k+n, and for example purposes is constructed for the Viterbi detector 20 operating according to an EPR2 data-recover protocol, it being understood that trellises for other data-recovery protocols have similar characteristics. Also, one should understand that the trellis 30 is not a physical circuit or device. It is merely a state diagram that illustrates the operation of the Viterbi detector 20 as it implements dynamic programming according to an EPR2 data-recovery protocol.

As illustrated by the trellis 30, at any particular Z sample time k-k−n, the two most recent bits A and $A_{-1}$ of the binary data sequence have one of four possible states S: S0=00, S1=01, S2=10, and S3=11. Therefore, the trellis 30 includes one column of state circles 32 for each respective sample time k-k+n. Within each circle 32, the right-most bit 34 represents a possible value for the most recent bit A of the data sequence at the respective sample time, and the left-most bit 36 represents a possible value for the second most recent bit A. For example, in the circle 32b, the bit 34b represents a possible value (logic 1) for the most recent bit A of the data sequence at sample time k, $A_k$, and the bit 34b represents a possible value (logic 0) for the second most recent bit $A_{k-1}$. Each circle 32 includes possible values for the most recent and second most recent bits A and $A_{-1}$, respectively, because according to equation (1), B depends on the values of the most recent bit A and the second most recent bit $A_{-1}$. Therefore, the Viterbi detector 20 can calculate the respective B sample for each circle 32 from the possible data values A and $A_{-1}$ within the circle.

Also as illustrated by the trellis 30, only a finite number of potential state transitions exist between the states S at one sample time k-k+n and the states S at the next respective sample time k+1-k+n+1. "Branches" 38 and 40 represent these possible state transitions. Specifically, each branch 38 points to a state having logic 0 as the value of the most recent data bit A, and each branch 40 points to a state having logic 1 as the value of the most recent data bit A. For example, if at sample time k the state is S0 (circle 32a) and the possible value of the next data bit $A_{k+1}$ is logic 0, then the only choice for the next state S at k+1 is S0 (circle 32e). Thus, the branch 38a represents this possible state transition. Likewise, if at sample time k the state is S0 (circle 32a) and possible value of the next data bit $A_{k+1}$ is logic 1, then the only choice for the next state S at k+1 is S1 (circle 32f). Thus, the branch 40a represents this possible state transition. Furthermore, the value 42 represents the value of the next data bit $A_1$ pointed to by the respective branch 38 or 40, and the value 44 represents the value of B that the next data bit $A_1$ and equation (1) give. For example, the value 42c (logic 0) represents that the branch 38b points to logic 0 as the possible value of the next data bit $A_{k+1}$, and the value 44c (−1) represents that for the branch 38b, equation (1) gives $B_{k+1}=0(A_{k+1})-1(A_k)=-1$.

In addition, the trellis 30 illustrates that for the sequence of bits A, the state transitions "fully connect" the states S at each sampling time to the states S at each respective immediately following sample time. In terms of the trellis 30, fully connected means that at each sampling time k-k+n, each state S0-S3' has two respective branches 38 and 40 entering and two respective branches 38 and 40 leaving. Therefore, the trellis 30 is often called a fully connected trellis.

Furthermore, the trellis 30 illustrates that the pattern of state transitions between adjacent sample times is time invariant because it never changes. In terms of the trellis 30, time invariant means that the pattern of branches 38 and 40 between states at consecutive sample times is the same regardless of the sampling times. That is, the branch pattern is independent of the sampling time. Therefore, the trellis 30 is often called a fully connected trellis.

Still referring to FIG. 3, in operation, the Viterbi detector 20 calculates the "lengths" of the "paths" through the trellis 30 and recovers the sequence of data bits A that corresponds to the "shortest" path. Each path is composed of respective serially connected branches 38 or 40, and the length λ of each path (often called the path metric λ) equals the sum of the lengths X of the branches (often called the branch metrics X) that compose the path. Each branch length X is represented by the following equation:

$$X_y = (Z_y - By)^2 \qquad 5)$$

And each path length λ is represented by the following equation:

$$\lambda_S = \sum_{y=k}^{y=k+n} X_y \qquad 6)$$

Thus, during each sampling period between the respective sample times k-k+n, the Viterbi detector 20 updates the respective length λ of each path by adding the respective branch length X thereto. The path lengths λ are actually the same values as given by equation (3) for the sequences of B samples represented by the paths through the trellis 30. But major differences between the closest-distance and dynamic-programming techniques are 1) dynamic programming updates each path length λ once during each sample period instead of waiting until after the read circuit 18 has generated all of the samples Z, and 2) dynamic programming calculates and updates the path lengths λ for only the surviving paths through the trellis 30 (one to each state S as discussed below), and thus calculates significantly fewer λ values than the closest-distance technique. These differences, which are explained in more detail below, significantly reduce the processing complexity and time for data recovery as compared with the maximum-likelihood technique.

To minimize the number of trellis paths and path lengths λ that it monitors, the Viterbi detector 20 monitors only the "surviving" paths through the trellis 30 and updates and saves only the path lengths $\lambda_s$ of these surviving paths. The surviving path to a possible state S at a particular sample time is the path having the shortest length $\lambda_s$. For example, each of the states S0-S3 of the trellis 30 typically has one respective surviving path at each sample time k-k+n. Therefore, the number of surviving paths, and thus the computational complexity per sample period, depends only on the number of possible states S and not on the length of the data sequence. Conversely, with the maximum-likelihood technique described above, the computational complexity per sample period depends heavily on the length of the data sequence. Thus, the computational complexity of the dynamic-programming technique increases linearly as the length of the data sequence increases, whereas the computational complexity of the closest-distance technique increases exponentially as the length of the data sequence increases. For example, referring to the 1000-bit data sequence discussed above in conjunction with FIG. 2, the Viterbi detector 20 updates only four path lengths $\lambda_{S0}$-$\lambda_{S3}$ (one for each state S0-S3) using dynamic programming as compared to $2^{1000}$ path lengths $\lambda$ using the maximum-likelihood technique! If one increases the length of the data sequence by just one bit, the detector 20 continues to update only four path lengths $\lambda_{S0}$-$\lambda_{S3}$ using dynamic programming whereas the detector 20 must calculate twice as many path lengths $\lambda$-$2^{1001}$=$2\times2^{1000}$—using the maximum-likelihood technique!

Figure 4A:
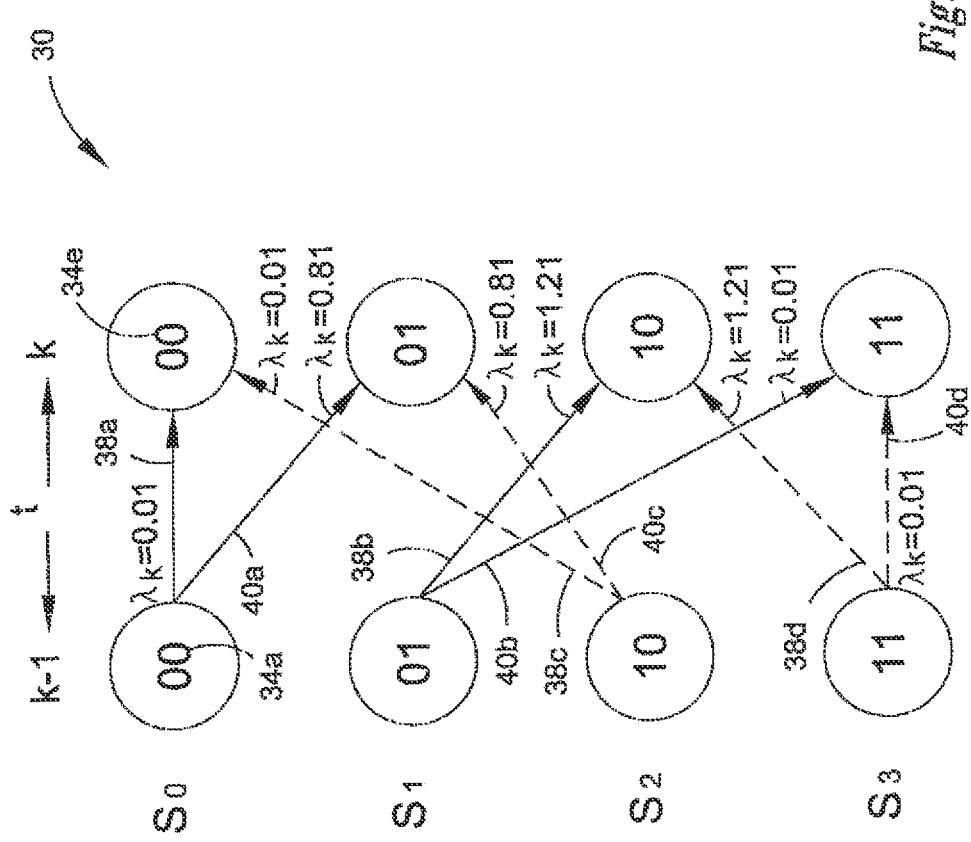
FIG. 4A is a trellis diagram at a sample time during the recovery of a data sequence by the Viterbi detector of FIG. 2.
Figure 4D:
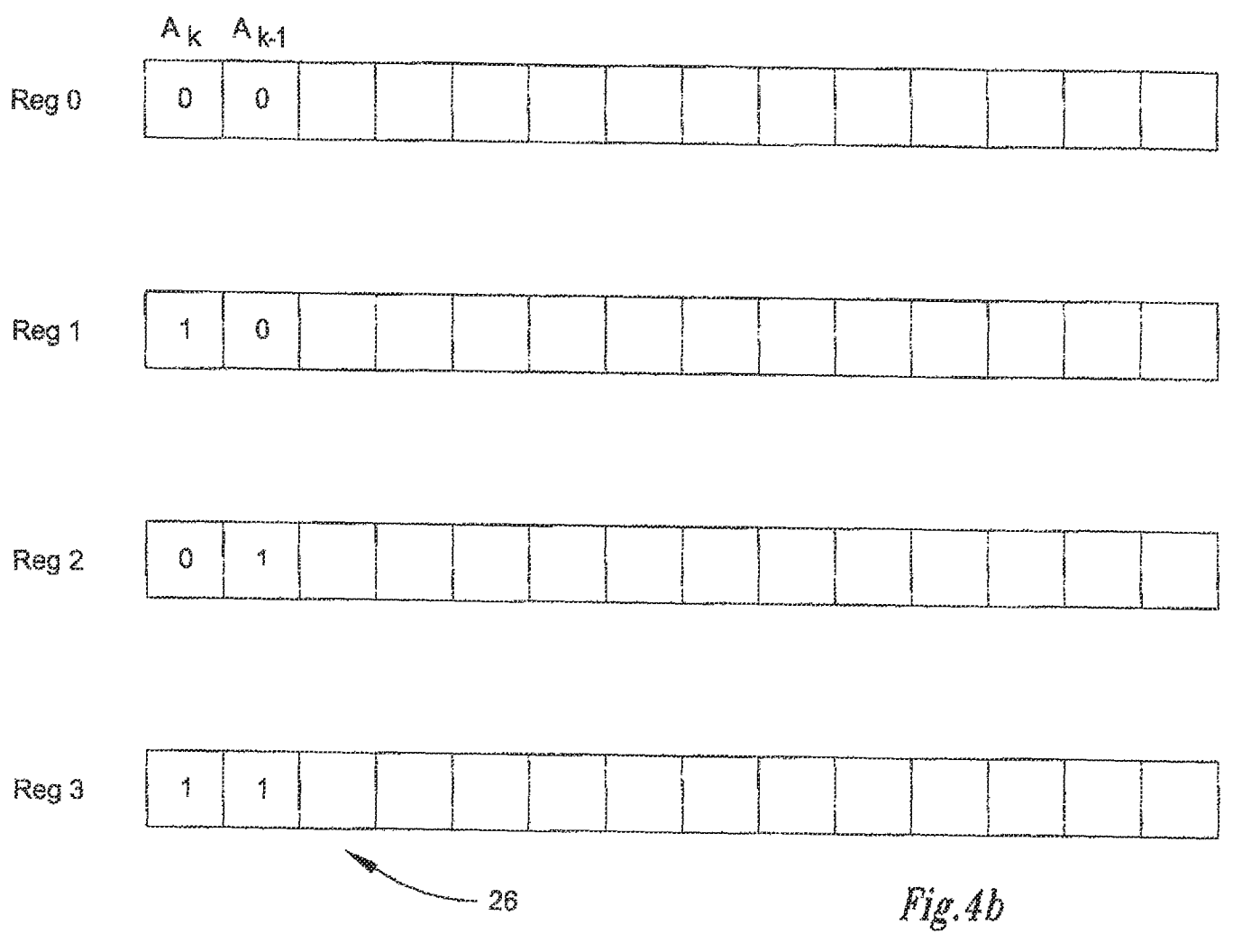

Referring to FIGS. 4A-11, an example of the operation of the Viterbi detector 20 of FIG. 2 is discussed where the detector 20 uses dynamic programming to recover the data sequence A of Table II using the sequence of Z samples also of Table II. FIGS. 3A, 4A, . . . , and 11 show the trellis diagram 30 and the surviving paths at respective sample times k−1-k+6, and FIGS. 3B, 4B, . . . , and 10B show the contents of four (one for each state S0-S3) shift registers Reg0-Reg3—these registers compose the shift register 26 of the detector 20—at the respective sample times. As discussed below, the surviving paths eventually converge such that the contents of the registers 26 are the same by the time the detector 20 provides the recovered data sequence on its output terminal 28.

Referring to FIG. 4A and Table II, the trellis 30 begins at sample time k−1, which is a don't-care state because the data sequence A actually begins at sample time k. During the sampling period t, which is the period between the sampling times k−1 and k, the Viterbi detector 20 (FIG. 2) receives the sample $Z_k$=0.1 on the input terminal 22. Next, the recovery circuit 24 of the detector 20 calculates the branch lengths $X_k$ for each of the respective branches 38 and 40 in accordance with equation (5). To perform these calculations, the circuit 24 uses the B samples 44 that are associated with the branches 38 and 40 as shown in FIG. 3. Table III shows the components $Z_k$ and $B_k$ and the resulting branch lengths $X_k$ and path lengths $\lambda_k$ of this calculation.

TABLE III

|  | $Z_k$ | $B_k$ | $X_k$ | $\lambda_k$ |
| --- | --- | --- | --- | --- |
| Branch 38a | 0.1 | 0 | 0.01 | 0.01 |
| Branch 40a | 0.1 | 1 | 0.81 | 0.81 |
| Branch 38b | 0.1 | −1 | 1.21 | 1.21 |
| Branch 40b | 0.1 | 0 | 0.01 | 0.01 |
| Branch 38c | 0.1 | 0 | 0.01 | 0.01 |
| Branch 40c | 0.1 | 1 | 0.81 | 0.81 |
| Branch 38d | 0.1 | −1 | 1.21 | 1.21 |
| Branch 40d | 0.1 | 0 | 0.01 | 0.01 |

Because the branch lengths $X_k$ between the states at sample times k−1 and k are the first branch lengths calculated, $\lambda_k$=$X_k$ for all branches. The path lengths $\lambda_k$ from Table III label the respective branches in FIG. 4A for clarity.

Next, the recovery circuit 24 identifies the shortest path to each state at sample time k, i.e., the surviving paths. Referring to state S0 at sample time k, both incoming paths have lengths $\lambda_k$=0.01. Therefore, both paths technically survive. But for ease of calculation, the recovery circuit 24 arbitrarily eliminates the path originating from the highest state (S2 here) at time k−1, i.e., the path along branch 38c. Alternatively, the recovery circuit 24 could eliminate the path along branch 38a instead. But as discussed below, the detector 20 recovers the proper data sequence regardless of the path that the circuit 24 eliminates. Similarly, referring to states S1-S3 at time k, both of their respective incoming paths have equal lengths $\lambda_k$, and thus the circuit 24 arbitrarily eliminates the path originating from the respective highest state. For clarity, the surviving paths are shown in solid line, and the eliminated paths are shown in dashed line.

Referring to FIG. 4B, once the Viterbi detector 20 identifies the surviving paths, the recovery circuit 24 loads the data bits A that compose the surviving paths into the respective shift registers Reg0-Reg3 of the shift register block 26 (FIG. 2). Reg0-Reg3 respectively correspond to the surviving paths ending at the states S0-S3. For example, referring to FIG. 4A, the recovery circuit 24 loads $A_k$=0 and $A_{k-1}$=0 into Reg0 because the surviving path, here branch 38a, connects bit 34a, which is $A_{k-1}$=0, with bit 34e, which is $A_k$=0. These bits are shifted into the left side of Reg0 such that they occupy the register locations indicated by the "$A_k$" and "$A_{k-1}$" legends above Reg0-Reg3. Thus, the most recent value, here $A_k$, always occupies the left most location of Reg0. Likewise, $A_k$ and $A_{k-1}$ for the other surviving paths, here branches 40a, 38b, and 40b, are respectively shifted into Reg1-Reg3.

Figure 5A:
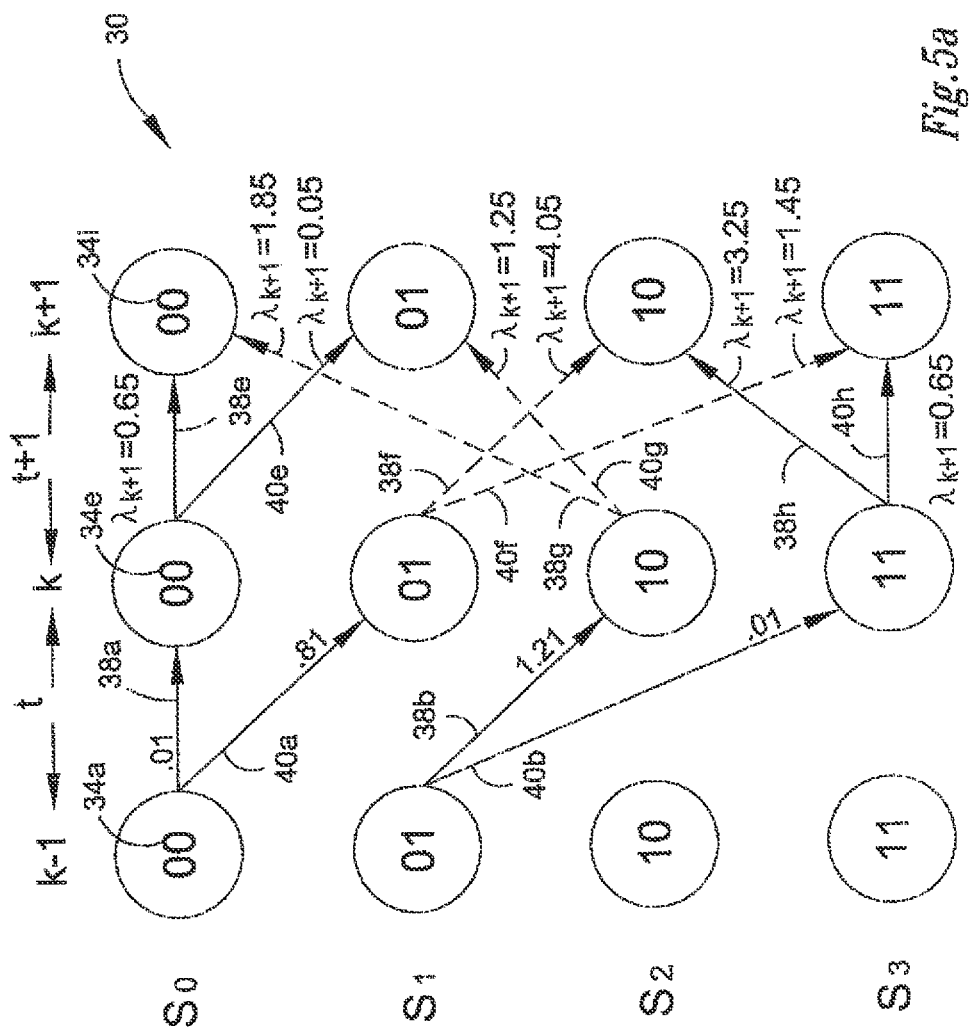
FIG. 5A is the trellis diagram of FIG. 4A at a subsequent sample time.

Referring to FIG. 5A, during the sampling period t+1 between the sample times k and k+1, the Viterbi detector 20 receives the sample $Z_{k+1}$=0.8. Next, the recovery circuit 24 calculates the branch length $X_{k+1}$ for each of the respective branches 38 and 40 between k and k+1 in accordance with equation (5), and updates the previous surviving path lengths $\lambda_k$ to get the new path lengths $\lambda_{k+1}$ according to equation (6). To perform these calculations, the circuit 24 uses the B samples 44 that are associated with the branches 38 and 40 as shown in FIG. 3. Table IV shows the components $Z_{k+1}$ and $B_{k+1}$ and the resulting branch lengths $X_{k+1}$ and path lengths $\lambda_{k+1}$ of this calculation.

TABLE IV

|  | $Z_{k+1}$ | $B_{k+1}$ | $X_{k+1}$ | $\lambda_{k+1}$ |
| --- | --- | --- | --- | --- |
| Branch 38e | 0.8 | 0 | 0.64 | 0.65 |
| Branch 40e | 0.8 | 1 | 0.04 | 0.05 |
| Branch 38f | 0.8 | −1 | 3.24 | 4.05 |
| Branch 40f | 0.8 | 0 | 0.64 | 1.45 |
| Branch 38g | 0.8 | 0 | 0.64 | 1.85 |
| Branch 40g | 0.8 | 1 | 0.04 | 1.25 |
| Branch 38h | 0.8 | −1 | 3.24 | 3.25 |
| Branch 40h | 0.8 | 0 | 0.64 | 0.65 |

The path lengths $\lambda_{k+1}$ from Table IV label the respective branches in FIG. 5A for clarity.

Next, the recovery circuit 24 identifies the shortest path to each state at time k+1, i.e., the surviving paths, which are shown in solid line in FIG. 5A. Referring to the state S0 at time k+1, the path that includes the branch 38e ($\lambda_{k+1}$=0.65) is shorter than the path that includes the branch 30g ($\lambda_{k+1}$=1.85). Therefore, the recovery circuit 24 eliminates the latter path, which is shown in dashed line, and updates the surviving path length $\lambda_{S0}$ for state S0 to equal to 0.65. Similarly, referring to the states S1-S3 at time k+1, the recovery circuit 24 eliminates the paths that include branches 40g, 38f, and 40f, respectively, and updates the surviving path lengths as follows: $\lambda_{S1}$=0.05, $\lambda_{S2}$=3.25, and $\lambda_{S3}$=0.65.

Figure 5B:
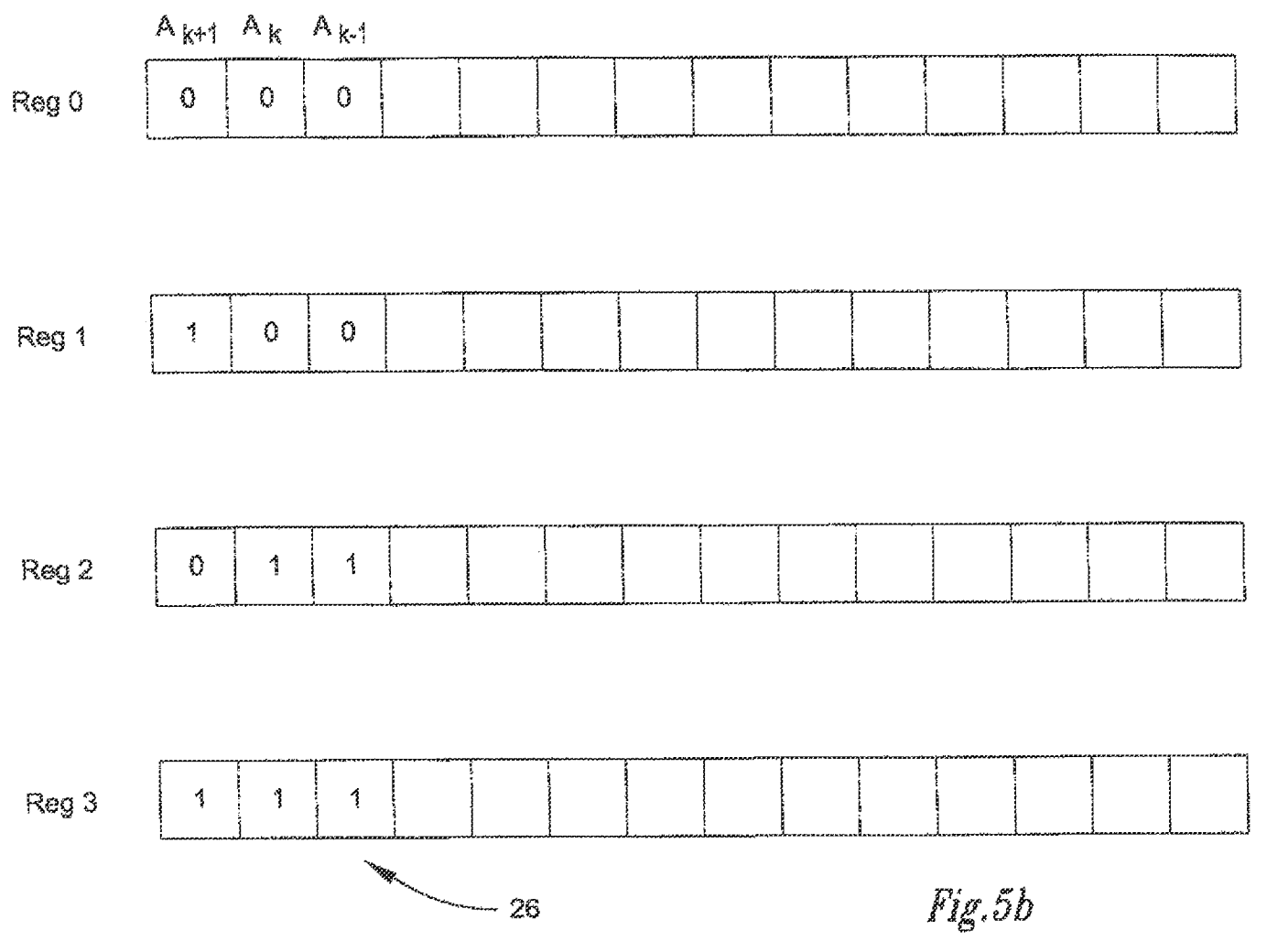

Referring to FIG. 5B, once the recovery circuit 24 identifies the surviving paths, it loads the data bits A that compose the surviving paths into the respective shift registers Reg0-Reg3. For example, referring to FIG. 5A, the recovery circuit 24 right shifts $A_{k+1}$=0 into Reg0 because the surviving path for S0, here the path that includes branches 38a and 38e, passes through S0 at k and k−1 and thus includes bits 34a ($A_{k-1}$=0), 34e ($A_k$=0), and 34i ($A_{k+1}$=0). Conversely, because the surviving path for S1 now passes through S0 at time k, the circuit 24 right shifts $A_{k+1}$=1 into Reg1 and loads $A_k$=$A_{k-1}$=0 from Reg0 into Reg1. Thus, Reg1 now includes the bits A that compose the surviving path to S1 at time k+1. Likewise, because the surviving path for S2 now passes through S3 at time k, the circuit 24 right shifts $A_{k+1}=0$ into Reg2 and loads $A_k=A_{k-1}=1$ from Reg3 into Reg2. Thus, Reg2 now includes the bits A that compose the surviving path to S2 at time k+1. Furthermore, because the surviving path for S3 passes through S3 and k and S1 and k+1, the recovery circuit 24 merely right shifts $A_{k+1}=1$ into Reg3.

Figure 6A:
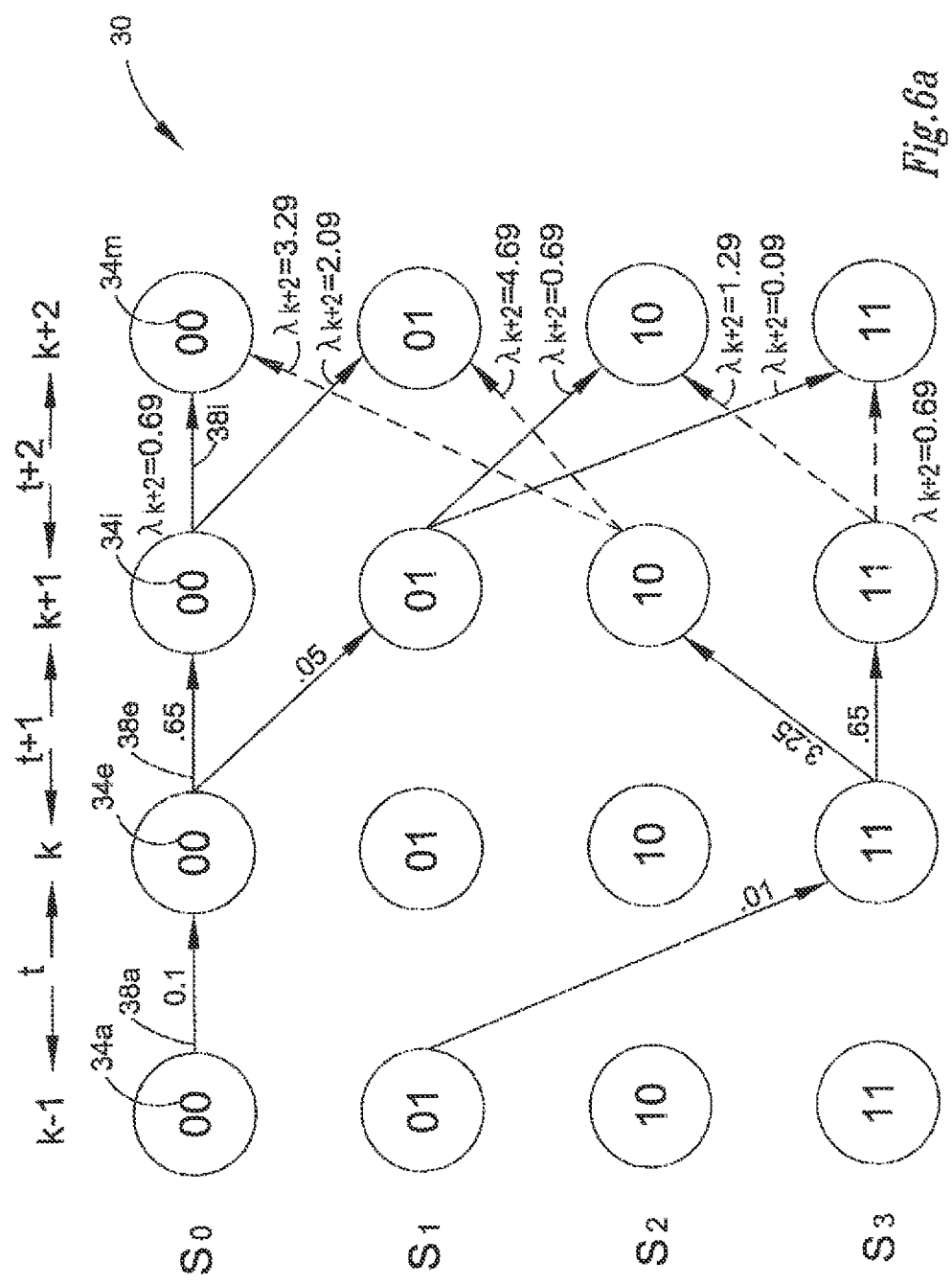
FIG. 6A is the trellis diagram of FIG. 5A at a subsequent sample time.

Referring to FIG. 6A, during the sampling period t+2 between sample times k+1 and k+2, the Viterbi detector 20 receives a sample $Z_{k+2}=0.2$. Next, the recovery circuit 24 calculates the branch lengths $X_{k+2}$ for the respective branches 38 and 40 in accordance with equation (5), and updates the surviving path lengths $\lambda_{k+1}$ to get the new path lengths $\lambda_{k+2}$ according to equation (6). The new path lengths $\lambda_{k+2}$ label the respective branches originating from the states S at time k+1 for clarity.

Next, the recovery circuit 24 identifies the surviving paths to each state S at time k+2 in a manner similar to that discussed above in conjunction with FIG. 5A. The surviving paths are in solid line, the eliminated branches between k+1 and k+2 are in dashed line, and the previously eliminated branches are omitted for clarity. One can see that at time k, the surviving paths converge at S0. That is, all of the surviving paths to the states S at time k+2 pass through S0 at time k. Thus, the recovery circuit 24 has recovered $A_k=0$, which, referring to Table II, is the correct value for $A_k$ in the data sequence A.

Referring to FIG. 6B, once the recovery circuit 24 identifies the surviving paths, it shifts or loads the data bits A that compose the surviving paths into the respective shift registers Reg0-Reg3 as discussed above in conjunction with FIG. 5B. For example, referring to FIG. 6A, the recovery circuit 24 merely right shifts $A_{k+2}=0$ into Reg0 because the surviving path to S0, here the path that includes branches 38a, 38e, and 38i, passes through S0 at times k−1, k, and k+1 and thus includes bits 34a ($A_{k-1}=0$), 34e ($A_k=0$), 34i ($A_{k+1}=0$), and 34m ($A_{k+2}=0$). Likewise, the recovery circuit 24 shifts or loads the bits $A_{k+2}, A_{k+1}, A_k,$ and $A_{k-1}$ that compose the other surviving paths into Reg1-Reg3. One can see that each of the locations $A_k$ in Reg0-Reg3 stores the same value, here logic 0. This confirms the convergence of the surviving paths to S0 at time k as discussed above in conjunction with FIG. 6A. Therefore, it follows that when the $A_k$ bits are shifted out of Reg0-Reg3, respectively, each bit $A_k$ will equal logic 0, which is the recovered value of the bit $A_k$. Thus, the output terminal 28 (FIG. 2) of the Viterbi detector 20 can be connected to the right-shift output of any one of the registers Reg0-Reg3.

Figure 7A:
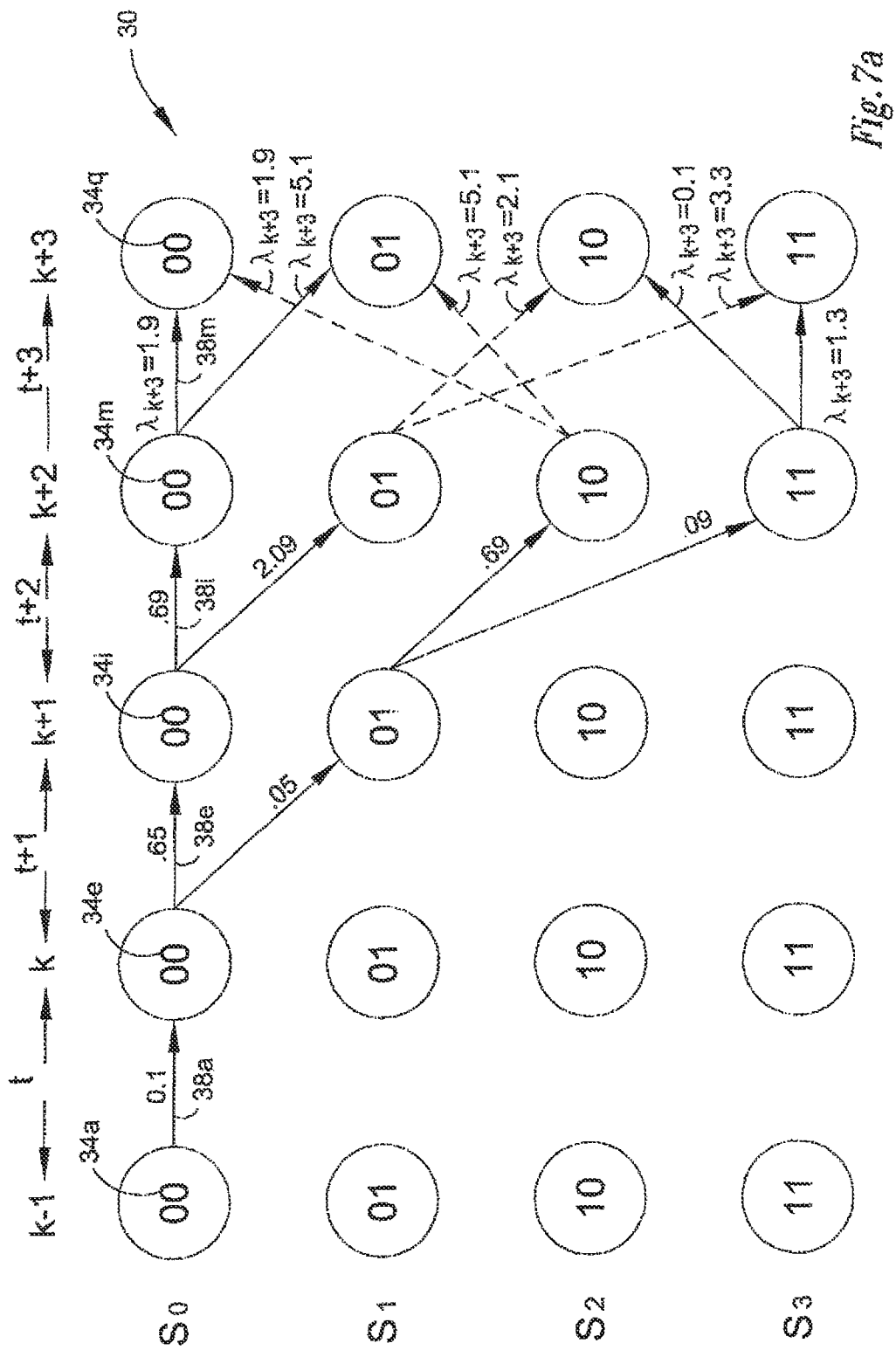
FIG. 7A is the trellis diagram of FIG. 6A at a subsequent sample time.

Referring to FIG. 7A, during the sampling period t+3 between the sample times k+2 and k+3, the Viterbi detector 20 receives the sample $Z_{k+3}=-1.1$. Next, the recovery circuit 24 calculates the branch lengths $X_{k+3}$ for the respective branches 38 and 40 in accordance with equation (5), and updates the path lengths $\lambda_{k+2}$ to get the new path lengths $\lambda_{k+3}$ according to equation (6). The new path lengths $\lambda_{k+3}$ label the respective branches originating from the states S at time k+2 for clarity.

Next, the recovery circuit 24 identifies the surviving paths (solid lines) to each state S at time k+3. One can see that each of the states S0 and S1 technically have two surviving paths because the path lengths $\lambda_{k+3}$ for these respective pairs of paths are equal (both $\lambda_{k+3}=1.9$ for S0 and both $\lambda_{k+3}=5.1$ for S1). Therefore, as discussed above in conjunction with FIGS. 4A and 4B, the recovery circuit 24 arbitrarily selects the respective paths that pass through the lowest state S at k+2 as the surviving paths for S0 and S1.

Figure 7B:
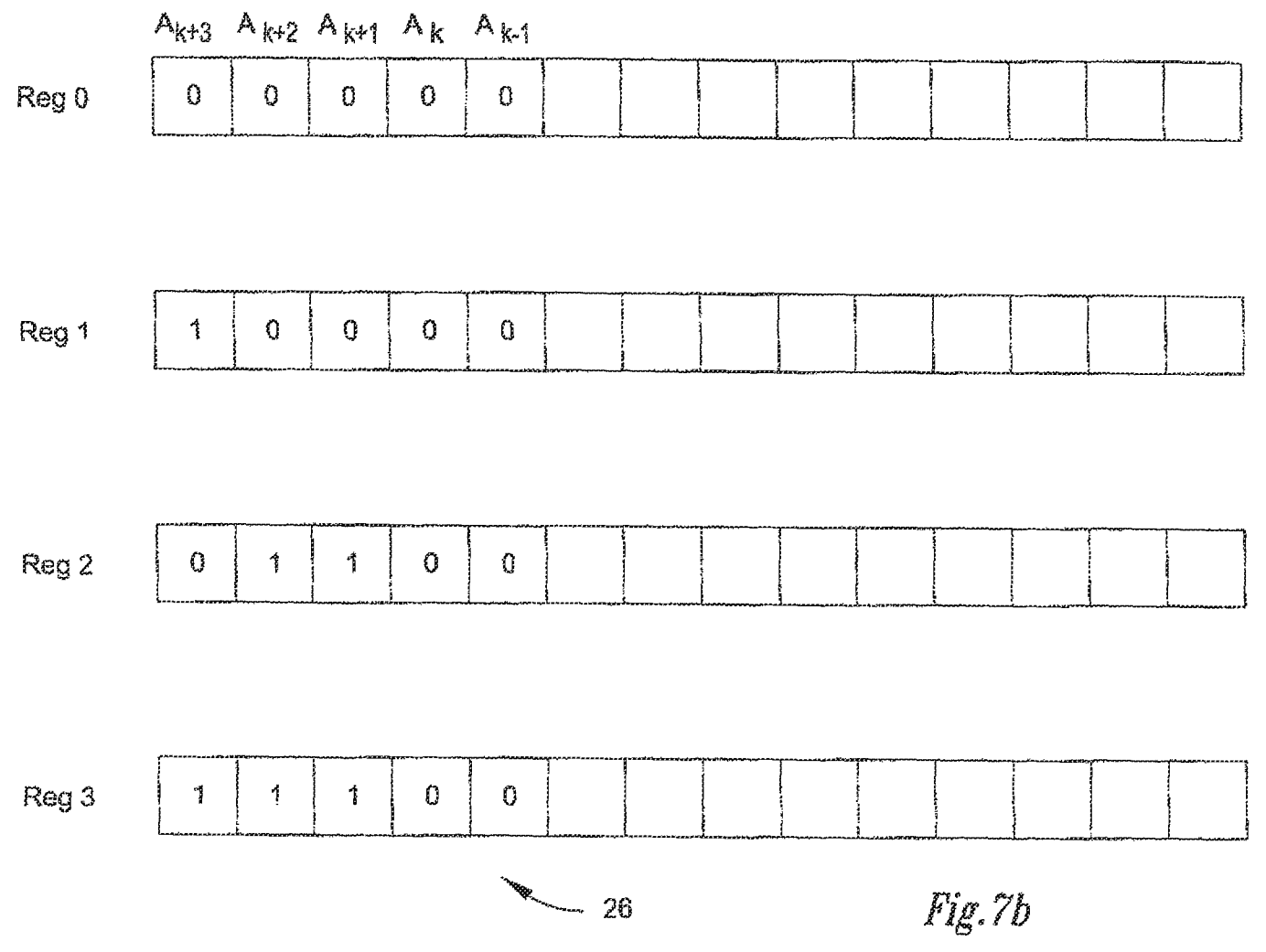

Referring to FIG. 7B, once the recovery circuit 24 identifies the surviving paths, it left shifts or loads the data bits A that compose the surviving paths into the respective shift registers Reg0-Reg3. For example, referring to FIG. 7A, the recovery circuit 24 right shifts $A_{k+3}=0$ into Reg0 because the surviving path to S0—here the arbitrarily selected path that includes branches 38a, 38e, 38l, and 38m—passes through S0 at times k−1-k+2 and thus includes bits 34a ($A_{k-1}=0$), 34e ($A_k=0$), 34i ($A_{k+1}=0$), 34m ($A_{k+2}=0$), and 34q ($A_{k+3}=0$). Likewise, the recovery circuit 24 shifts or loads as appropriate the bits $A_{k+3}, A_{k+2}, A_{k+1}, A_k,$ and $A_{k-1}$ of the other surviving paths into Reg1-Reg3.

Figure 8A:
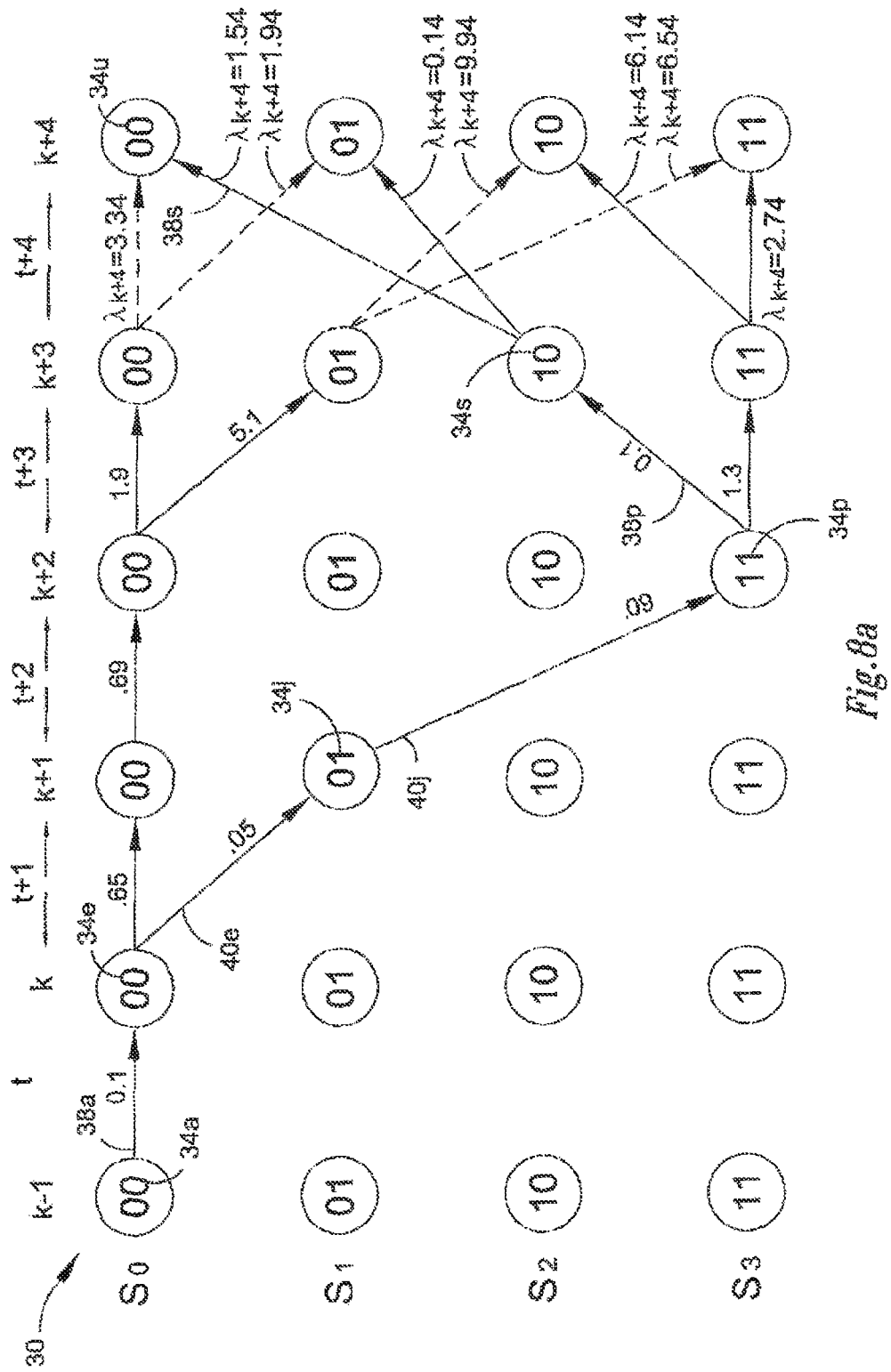
FIG. 8A is the trellis diagram of FIG. 7A at a subsequent sample time.

Referring to FIG. 8A, during the sampling period t+4 between the sampling times k+3 and k+4, the Viterbi detector 20 receives a sample $Z_{k+4}=1.2$. Next, the recovery circuit 24 calculates the branch length $X_{k+4}$ for each of the respective branches 38 and 40 in accordance with equation (5), and updates the path lengths $\lambda_{k+3}$ to generate the new path lengths $\lambda_{k+4}$ according to equation (6). The path lengths $\lambda_{k+4}$ label the respective branches originating from the states S at time k+3 for clarity.

Next, the recovery circuit 24 identifies the surviving paths to each state S at time k+4. One can see that at time k+1 the surviving paths converge at S1, and that at time k+2 the surviving paths converge at S3. Thus, in addition to bit $A_k$, the recovery circuit 24 has recovered $A_{k+1}=1$ and $A_{k+2}=1$, which, referring to Table II, are the correct values for the $A_{k+1}$ and $A_{k+2}$ bits of the data sequence A.

Referring to FIG. 8B, once the recovery circuit 24 identifies the surviving paths, it right shifts or loads the data bits A that compose the surviving paths into the respective shift registers Reg0-Reg3. For example, the recovery circuit 24 right shifts $A_{k+4}=0$ and loads $A_{k+2}=A_{k+1}=1$ from Reg3 into the respective locations of Reg0. Referring to FIG. 8A, the circuit 24 does this because the surviving path to S0 at k+4—here the path that includes the branches 38a, 40e, 40j, 38p, and 38s—passes through S2 at k+3, S3 at k+2, S1 at k+1, and S0 at k and k−1, and thus includes bits 34a ($A_{k-1}=0$), 34e ($A_k=0$), 34j ($A_{k+1}=1$), 34p ($A_{k+2}=1$), 34s ($A_{k+3}=0$), and 34u ($A_{k+4}=0$). Likewise, the recovery circuit 24 shifts or loads as appropriate the bits $A_{k+4}, A_{k+3}, A_{k+2}, A_{k+1}, A_k,$ and $A_{k-1}$ of the other surviving paths into Reg1-Reg3, respectively. One can see that each of the bits $A_{k-1}-A_{k+2}$ in Reg0-Reg3 has the same respective value, here $A_{k-1}=0, A_k=0, A_{k+1}=1, A_{k+2}=1$. This confirms the convergence of the surviving paths to S1 at time k+1 and to S3 at time k+2 as discussed above in conjunction with FIG. 8A.

Figure 9A:
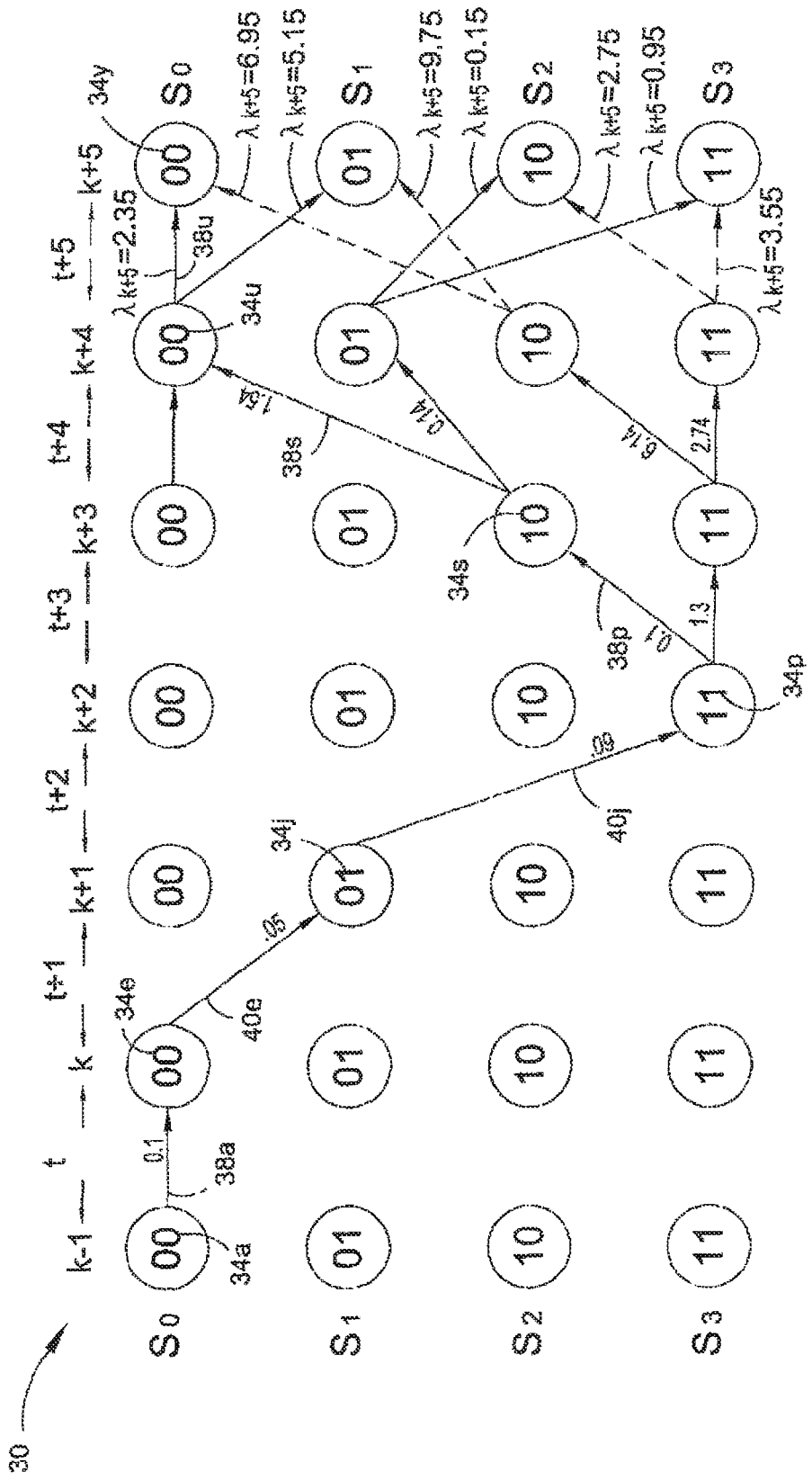
FIG. 9A is the trellis diagram of FIG. 8A at a subsequent sample time.

Referring to FIG. 9A, during the sampling period t+5 between sample times k+4 and k+5, the Viterbi detector 20 receives a sample $Z_{k+5}=-0.9$. Next, the recovery circuit 24 calculates the branch length $X_{k+5}$ for each of the respective branches 38 and 40 in accordance with equation (5), and updates the path lengths $\lambda_{k+4}$ to generate the new path lengths $\lambda_{k+5}$ according to equation (6). The updated path lengths $\lambda_{k+5}$ label the respective branches originating from the states S at time k+4 for clarity.

Next, the recovery circuit 24 identifies the surviving paths to each state S at time k+5. One can see that at time k+3, the surviving paths converge at S2. Thus, in addition to bits $A_k, A_{k+1},$ and $A_{k+2}$, the recovery circuit 24 has recovered $A_{k+3}=0$, which, referring to Table II, is the correct value for the bit $A_{k+3}$ of the data sequence A.

Referring to FIG. 9B, once the recovery circuit 24 identifies the surviving paths, it right shifts or loads the data bits A that compose the surviving paths into the respective shift registers Reg0-Reg3. For example, the recovery circuit 24 right shifts $A_{k+5}=0$ into Reg0. The circuit 24 does this because referring to FIG. 9A, the surviving path to S0 at k+5—here the path that includes branches 38a, 40e, 40j, 38p, 38s, and 38u—passes through S0 at k+4, S2 at k+3, S3 at k+2, S1 at k+1, and S0 at k and k−1 and thus includes bits 34a ($A_{k-1}=0$), 34e ($A_k=0$), 34j ($A_{k+1}=1$), 34p ($A_{k+2}=1$), 34s ($A_{k+3}=0$), 34u ($A_{k+4}=0$), and 34v ($A_{k+5}=0$). Likewise, the recovery circuit 24 shifts or loads as appropriate the bits $A_{k+5}$, $A_{k+4}$, $A_{k+3}$, $A_{k+2}$, $A_{k+1}$, $A_k$, and $A_{k-1}$ of the other surviving paths into Reg1-Reg3. One can see that the bits $A_{k-1}$-$A_{k+3}$ in Reg0-Reg3 are respectively the same, here $A_{k-1}=0$, $A_k=0$, $A_{k+1}=1$, $A_{k+2}=1$, and $A_{k+3}=0$. This confirms the convergence of the surviving paths to S2 at time k+3 as discussed above in conjunction with FIG. 9A.

Figure 10A:
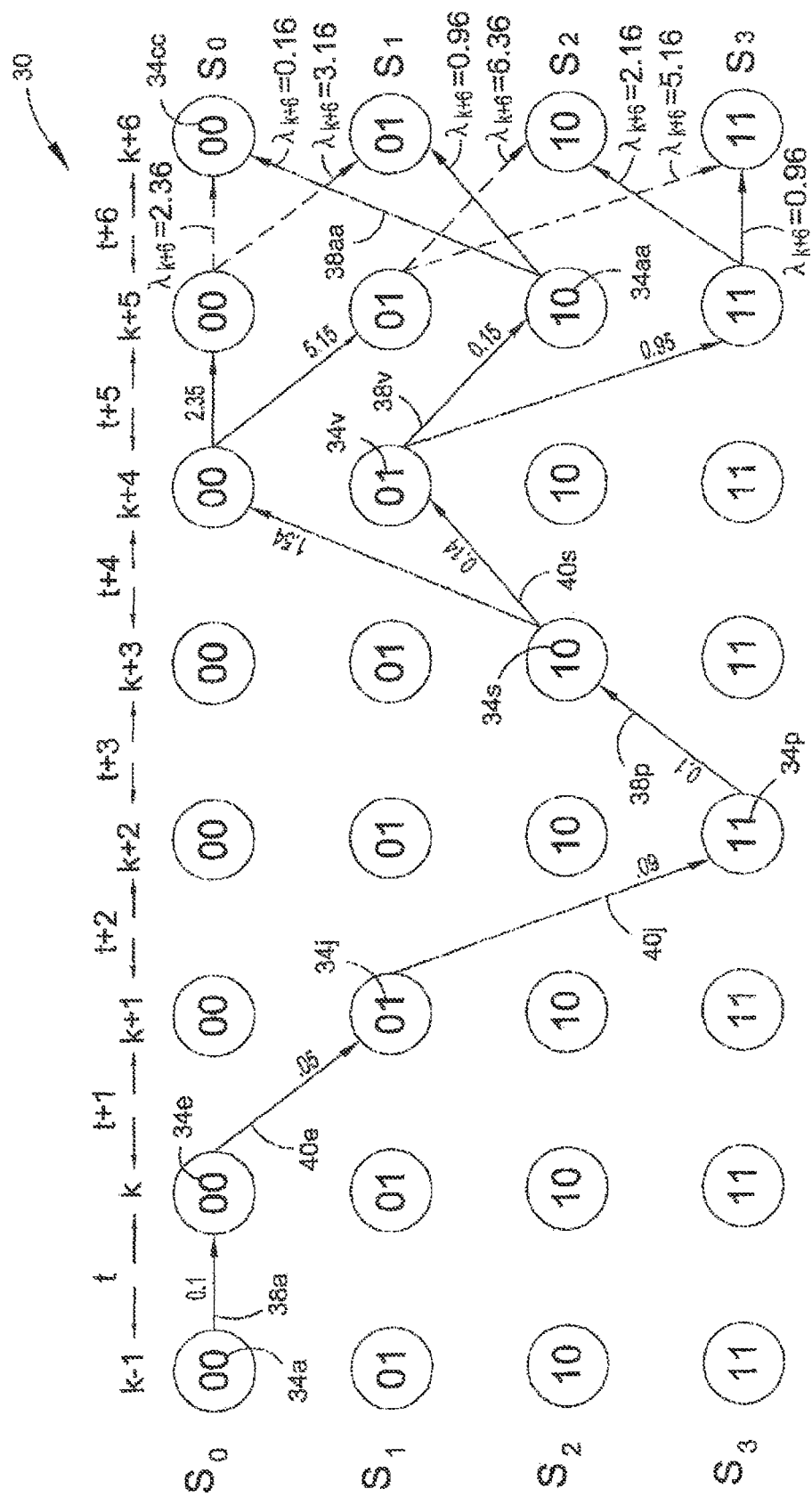
FIG. 10A is the trellis diagram of FIG. 9A at a subsequent sample time.

Referring to FIG. 10A, during the sampling period t+6 between sample times k+5 and k+6, the Viterbi detector 20 receives a sample $Z_{k+6}=0.1$. The recovery circuit 24 calculates the branch length $X_{k+6}$ for each of the respective branches 38 and 40 in accordance with equation (5), and updates the path lengths $\lambda_{k+5}$ to generate the new path lengths $\lambda_{k+6}$ according to equation (6). The updated path lengths $\lambda_{k+6}$ label the respective branches originating from the states S at time k+5 for clarity.

Next, the recovery circuit 24 identifies the surviving paths to each state S at time k+6. One can see that at time k+4, the surviving paths converge at S1. Thus, in addition to bits $A_k$-$A_{k+3}$, the recovery circuit 24 has recovered $A_{k+4}=1$, which referring to Table II, is the correct value for the bit $A_{k+4}$ of the data sequence A.

Referring to FIG. 10B, once the recovery circuit 24 identifies the surviving paths, it right shifts or loads the data bits A that compose the surviving paths into the respective shift registers Reg0-Reg3. For example, the recovery circuit 24 right shifts $A_{k+6}=0$ and loads $A_{k+4}=1$ from Reg2 into Reg0. The circuit 24 does this because referring to FIG. 10A, the surviving path to S0 at k+6—here the path that includes branches 38a, 40e, 40j, 38p, 40s, 38v, and 38aa—passes through S2 at k+5, S0 at k+4, S2 at k+3, S3 at k+2, S1 at k+1, and S0 at k and k−1 and thus includes bits 34a ($A_{k-1}=0$), 34e ($A_k=0$), 34j ($A_{k+1}=1$), 34p ($A_{k+2}=1$), 34s ($A_{k+3}=0$), 34v ($A_{k+4}=1$), 34aa ($A_{k+5}=0$), and 34 cc ($A_{k+6}=0$). Likewise, the recovery circuit 24 shifts or loads as appropriate the bits $A_{k+6}$, $A_{k+5}$, $A_{k+4}$, $A_{k+3}$, $A_{k+2}$, $A_{k+1}$, $A_k$, and $A_{k-1}$ of the other surviving paths into Reg1-Reg3, respectively. One can see that the bits $A_{k-1}$-$A_{k+4}$ in Reg0-Reg3 are respectively the same, here $A_{k-1}=0$, $A_k=0$, $A_{k+1}=1$, $A_{k+2}=1$, $A_{k+3}=0$, and $A_{k+4}=1$. This confirms the convergence of the surviving paths to S1 at time k+4 as discussed above in conjunction with FIG. 10A.

Figure 11:
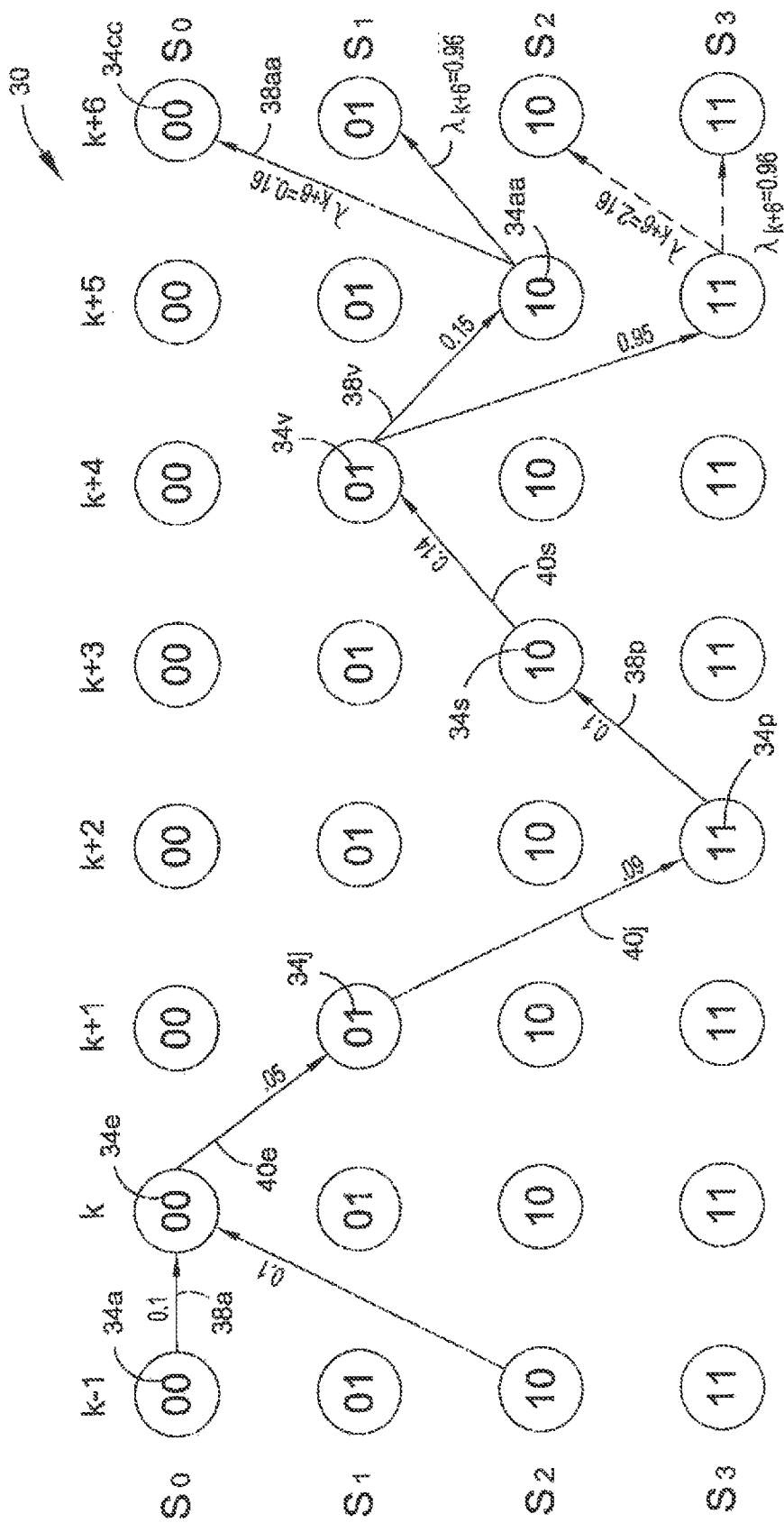
FIG. 11 is the trellis diagram of FIG. 10A showing the surviving paths only.

FIG. 11 is the trellis diagram 30 of FIG. 10A showing only the surviving paths for clarity.

Referring again to FIGS. 4A-11, the latency of the Viterbi detector 20 of FIG. 2 is 4. Referring to FIGS. 7A-8B, the most samples Z that the detector 20 must process before times one must wait the surviving paths converge is 4. For example, the surviving paths do not converge at k+1, and thus the bit $A_{k+1}$ is not the same in all the registers Reg0-Reg3, until the sample time k+4. Therefore, the Viterbi detector 20 must process four samples $Z_{k+1}$-$Z_{k+4}$ before the bit $A_{k+1}$ is valid, i.e., before the value of the bit $A_{k+1}$ is the same in all of the registers Reg0-Reg3.

The Viterbi detector 20 continues to recover the remaining bits of the data sequence A in the same manner as described above in conjunction with FIGS. 4A-11. Because the detector 20 updates only 8 path lengths $\lambda_{k+6}$ and chooses only 4 surviving paths per sample period T regardless of the length of the data sequence A, the processing complexity and time increase linearly, not exponentially, with the length of the data sequence.

Although the trellis 30 is shown having four states S0-S3 to clearly illustrate the dynamic-programming technique, the EPR2 Viterbi detector 20 typically implements a trellis having two states, S0=0 and S1=1, to minimize the complexity of its circuitry.

Figure 12:
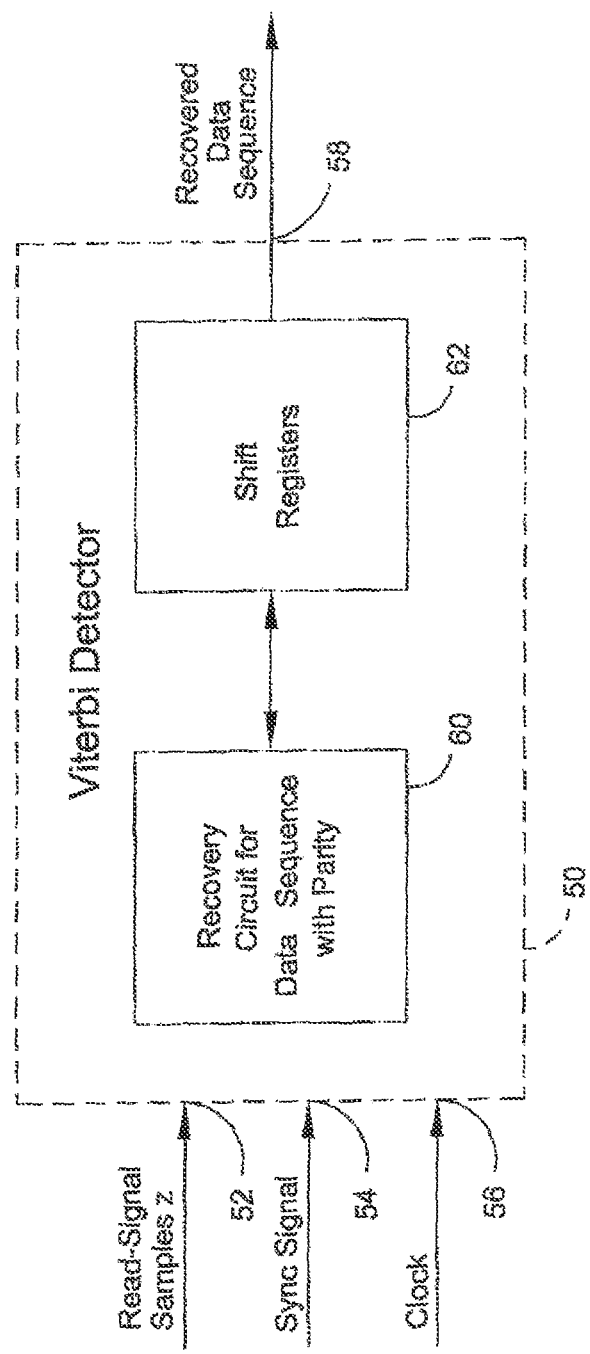
FIG. 12 is a block diagram of a parity-sensitive Viterbi detector according to an embodiment.
Figure 13:
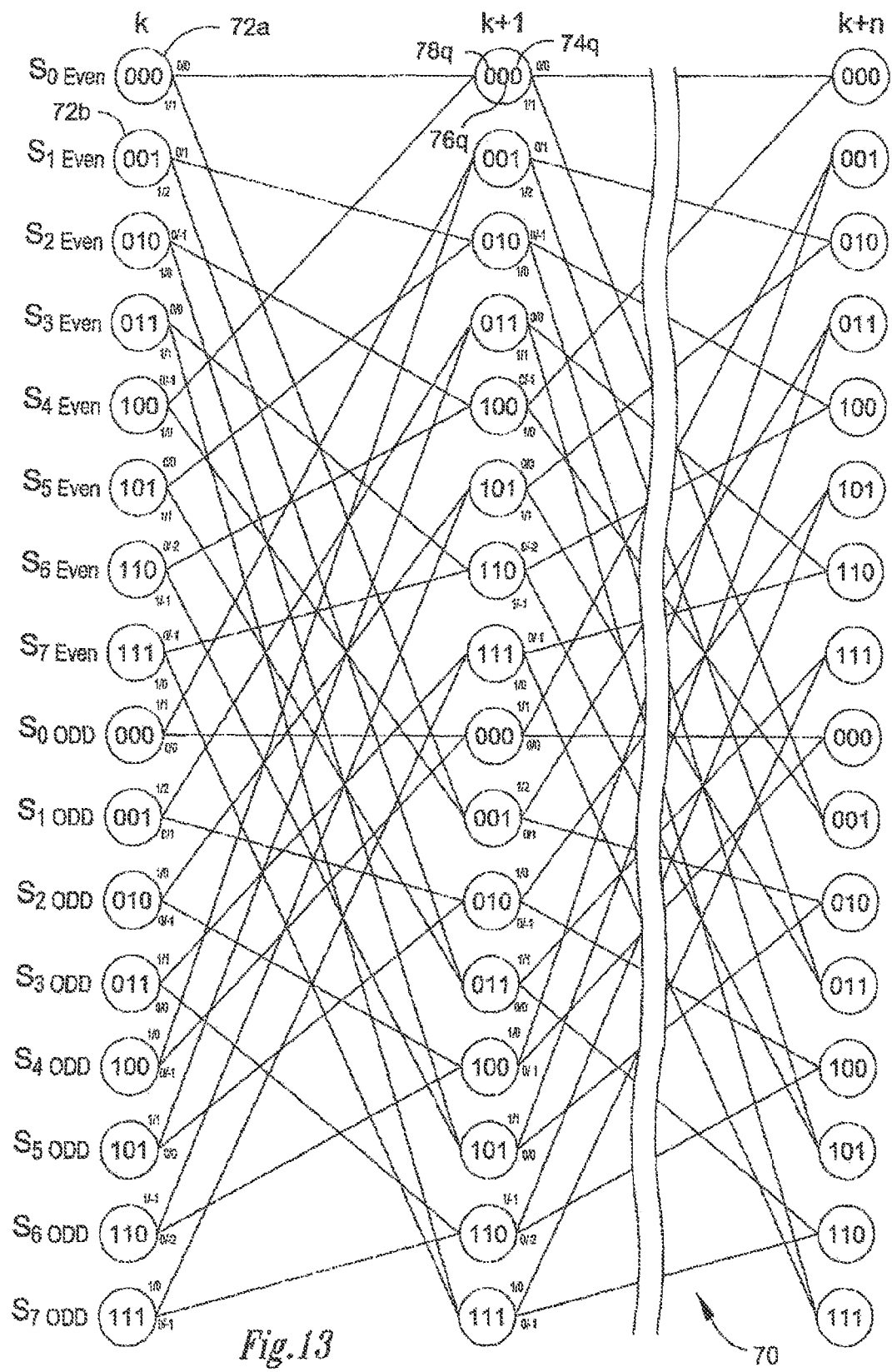
FIG. 13 is a trellis diagram for the Viterbi detector of FIG. 12 according to an embodiment.
Figure 14A:
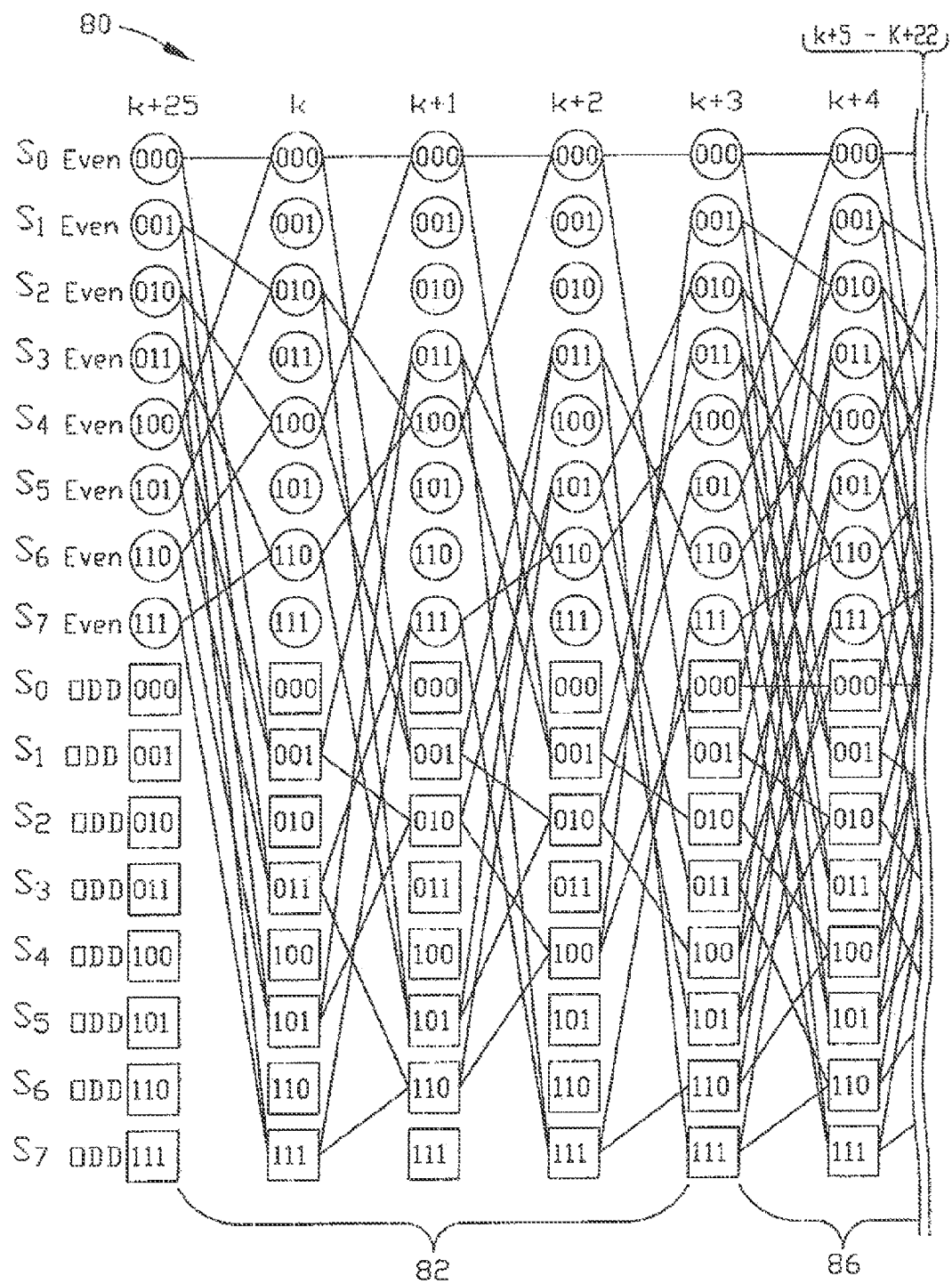
FIG. 14 is a trellis diagram for the Viterbi detector of FIG. 12 according to another embodiment.
Figure 14B:
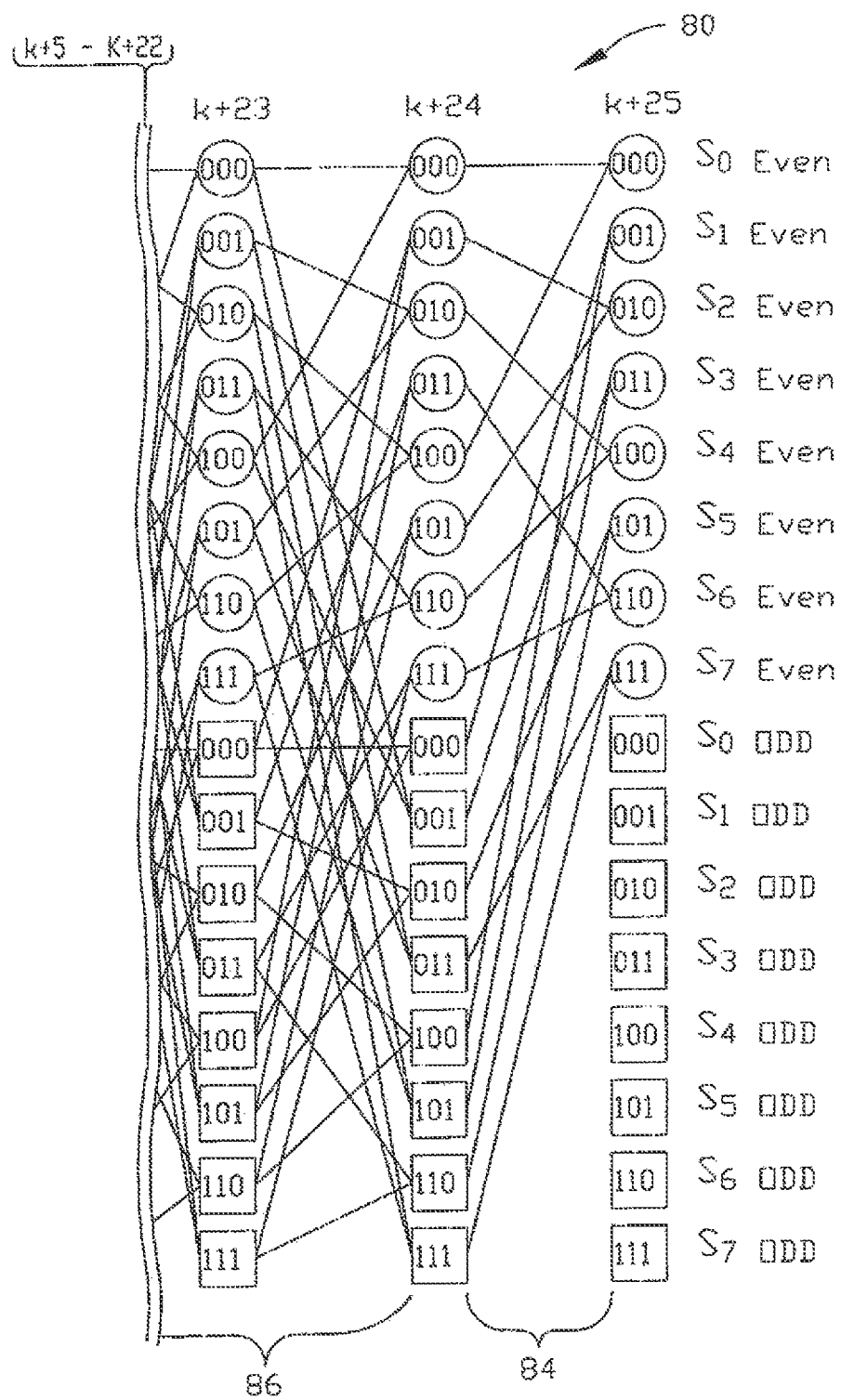
Figure 15:
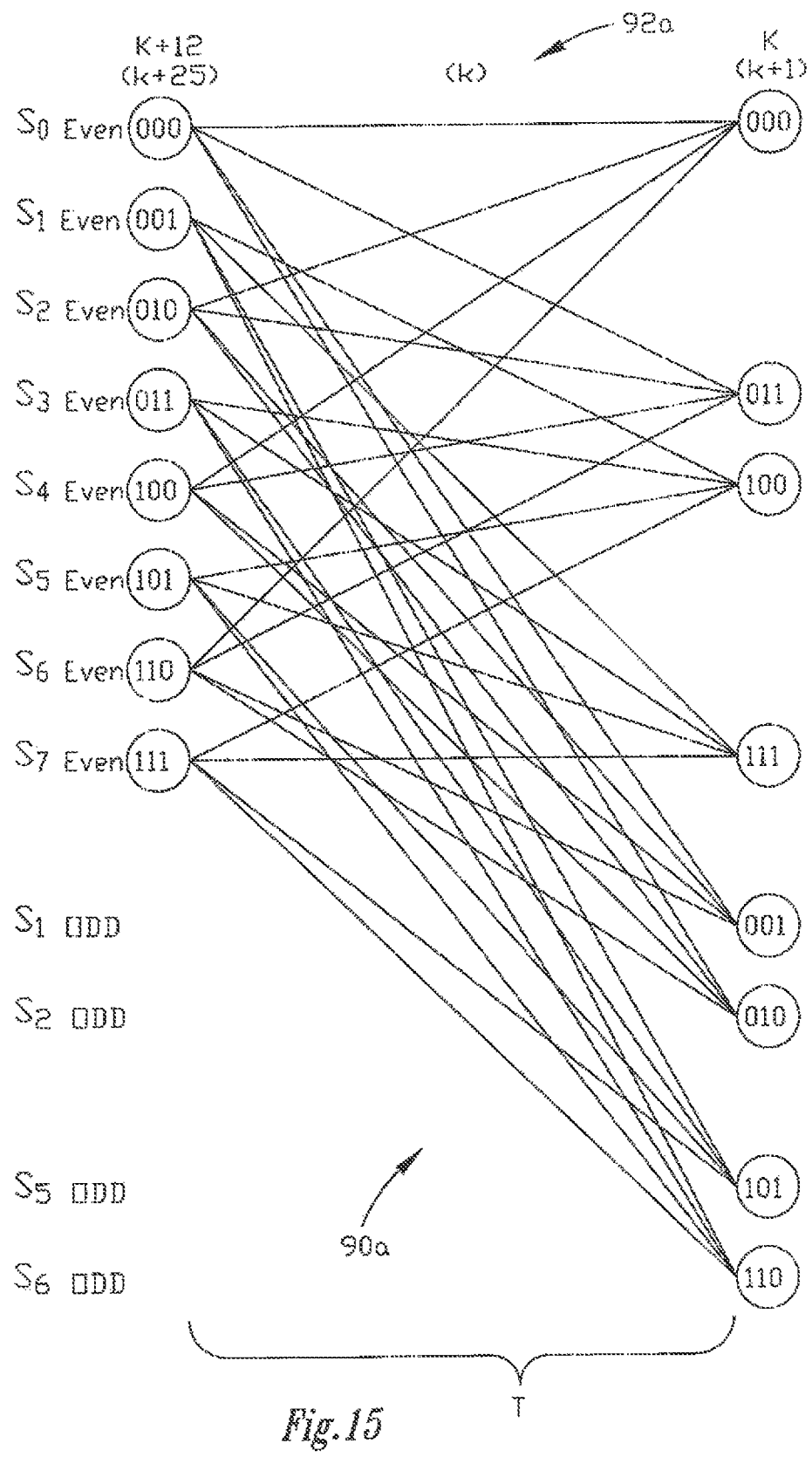
FIGS. 15-18 are respective portions of a trellis diagram for the Viterbi detector of FIG. 12 according to yet another embodiment.
Figure 16:
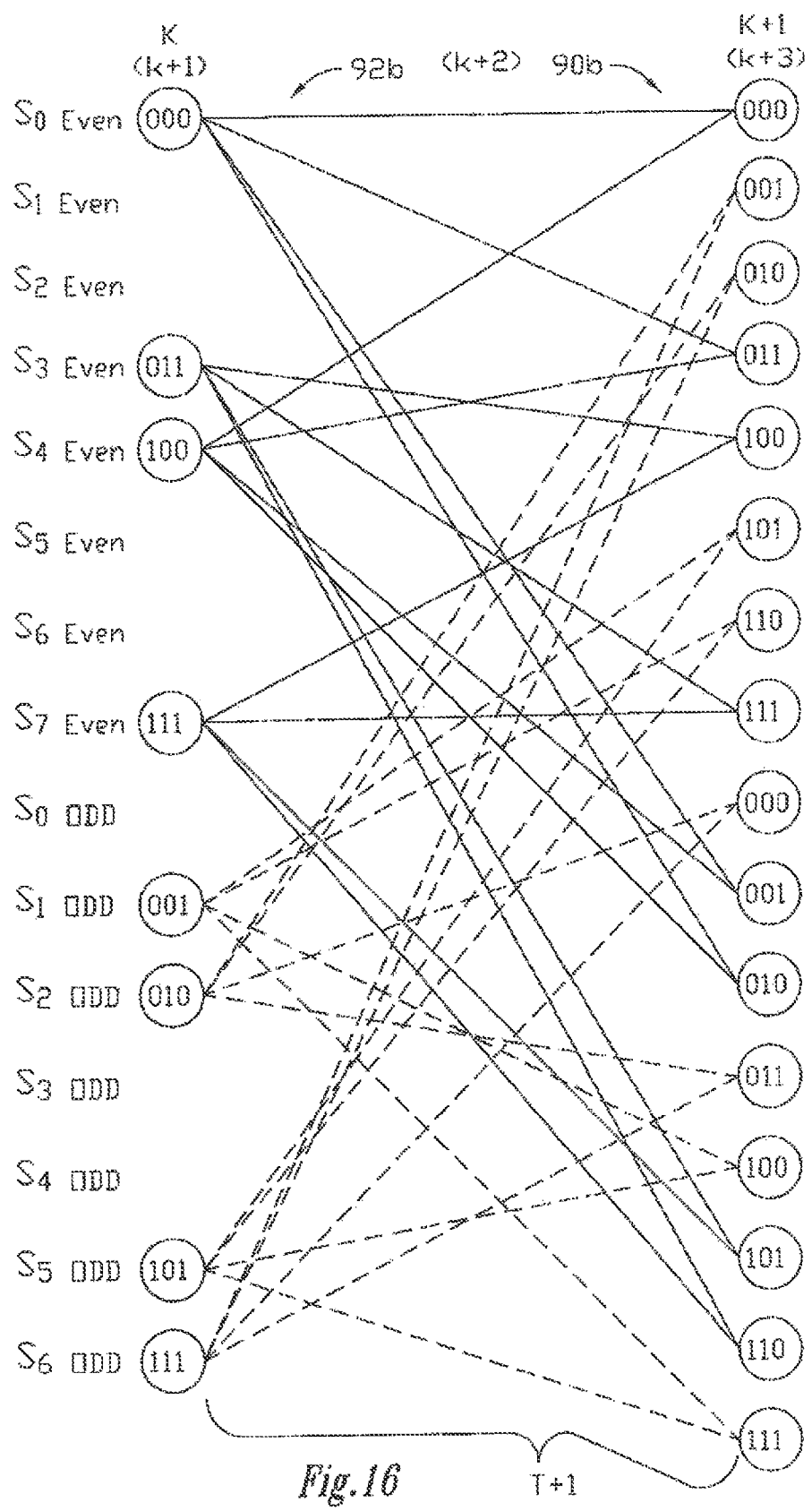
Figure 17:
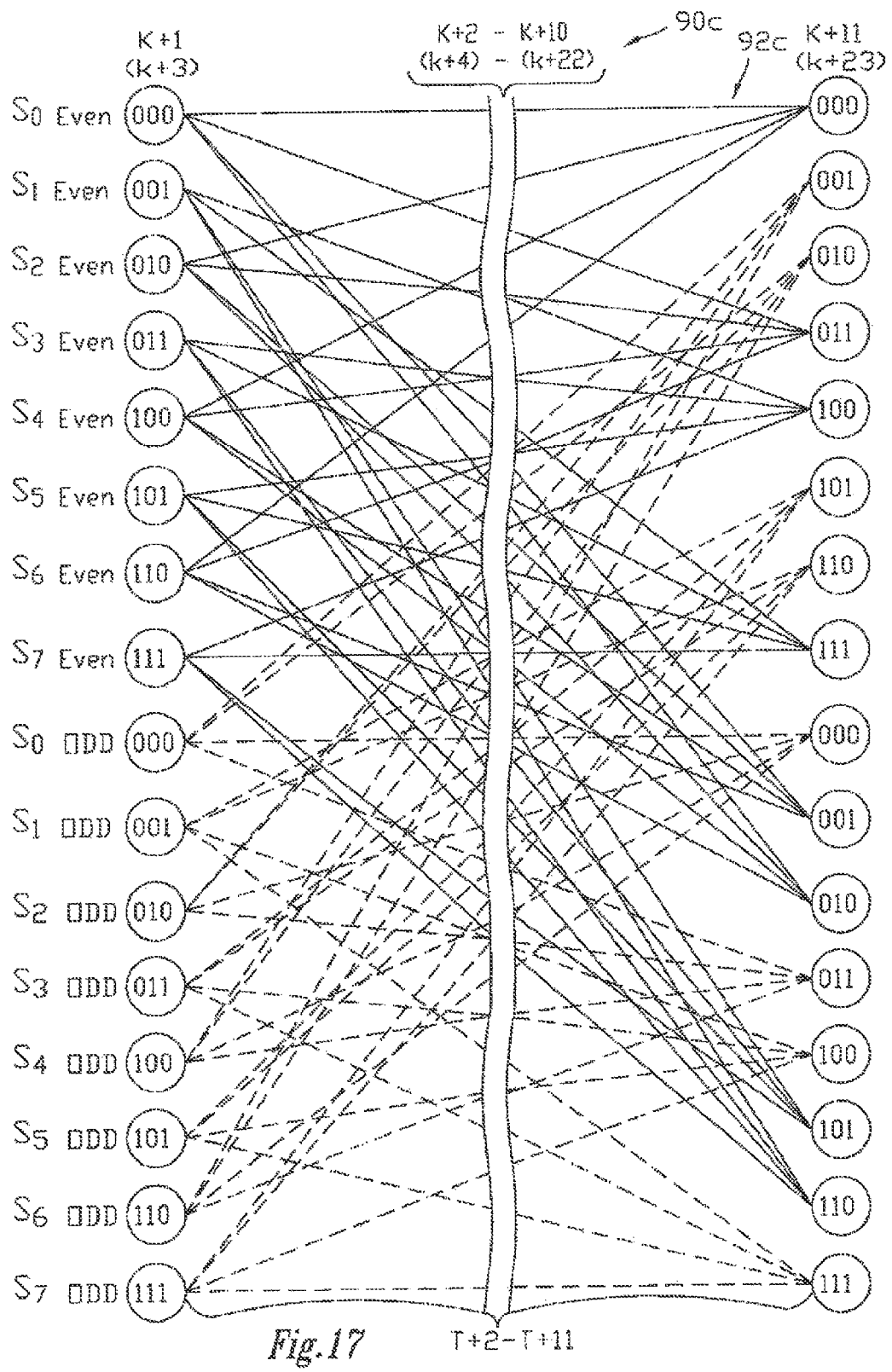
Figure 18:
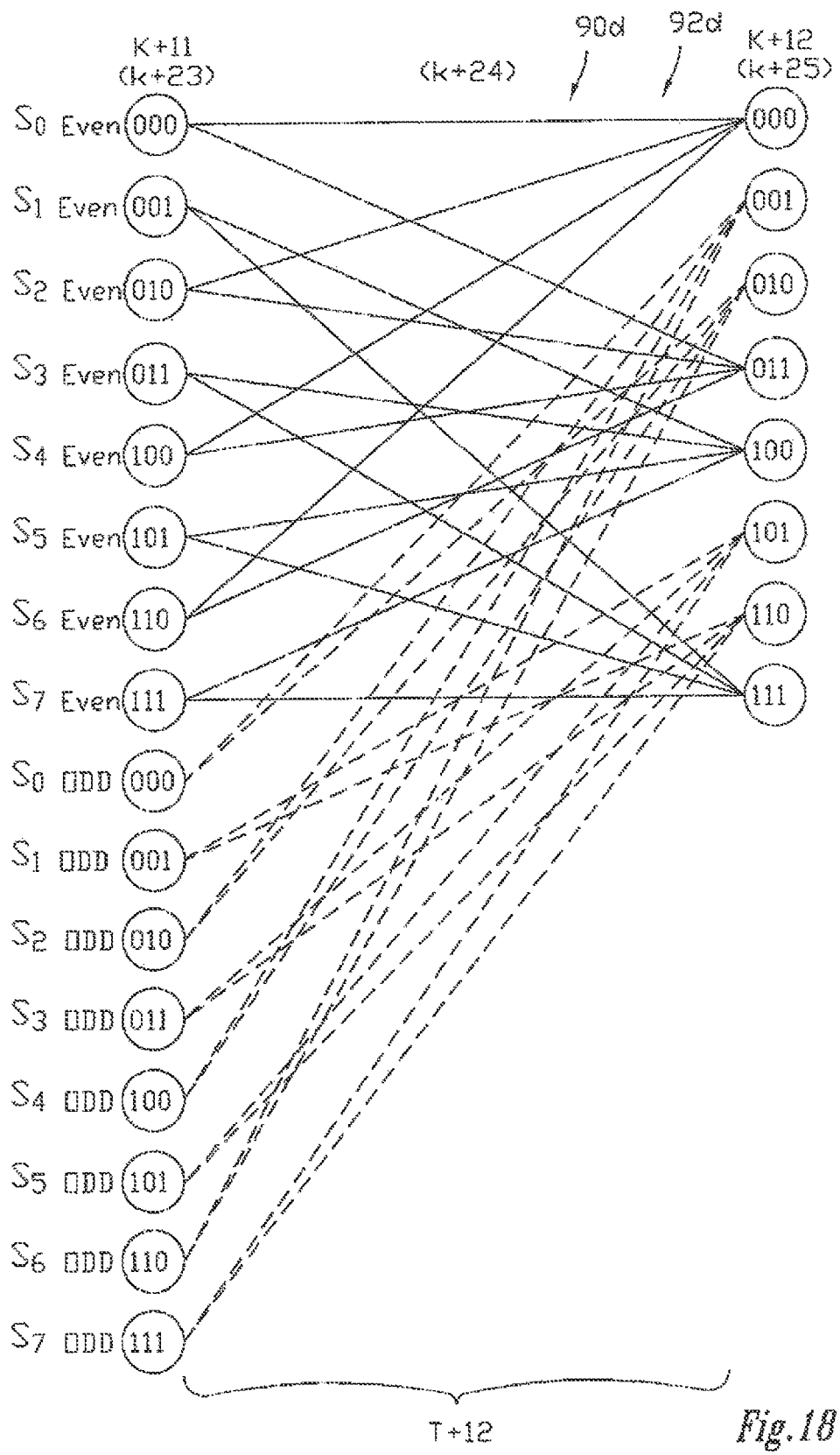

FIG. 12 is a block diagram of a parity-sensitive Viterbi detector according to an embodiment. FIGS. 13-18 are trellis diagram for the Viterbi detector of FIG. 12 according to various embodiments. The operation and various aspects of the embodiments of FIGS. 12-18 are similar to the operation and aspects of the Viterbi detector of FIG. 2. These aspects are discussed in the context of the disk-drive system of FIG. 19. Further aspects are disclosed in U.S. Pat. No. 6,492,918 as discussed with respect to FIG. 19 as is incorporated by reference.

FIGS. 12-18 show a Viterbi detector, having an input terminal configured to receive a signal that represents a sequence of values. Further, along with a register; and a recovery circuit coupled to the input terminal and to the register, the circuit is further configured to recover only groups of values having a predetermined parity. That is, the recovery circuit may only recover all groups having odd parity or all groups having even parity; e.g., the same off or even parity. Then, the Viterbi detector is configured to load the recovered groups into the register. This is describe in greater detail in the context of FIG. 19.

Figure 19:
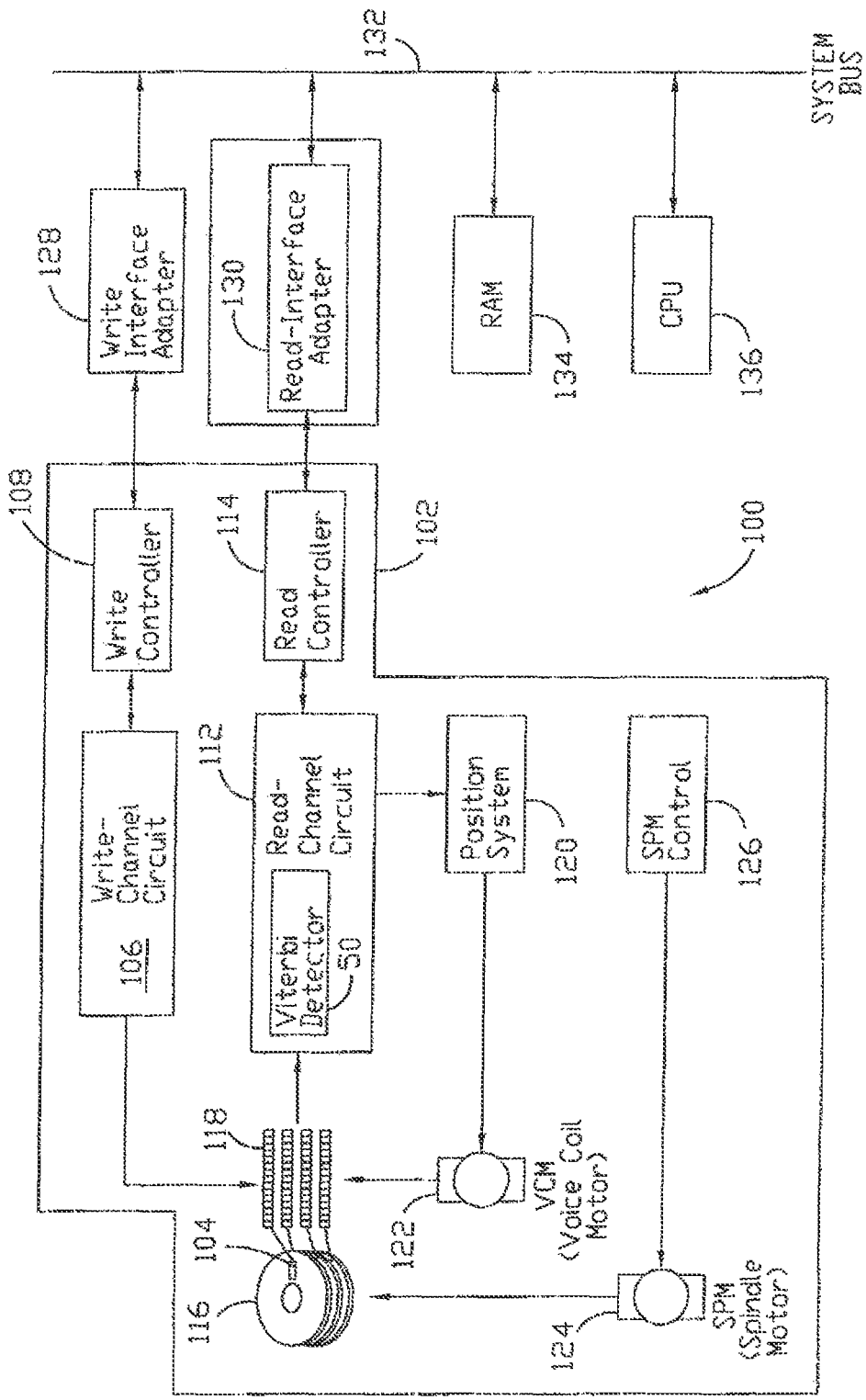
FIG. 19 is a block diagram of a disk-drive system that incorporates the Viterbi detector of FIG. 12 according to an embodiment.

FIG. 19 is a block diagram of a disk-drive system 100 according to an embodiment. Specifically, the disk-drive system 100 includes a disk drive 102, which incorporates the Viterbi detector 50 of FIG. 12. The disk drive 102 includes a combination write/read head 104, a write-channel circuit 106 for generating and driving the head 104 with a write signal, and a write controller 108 for interfacing the write data to the write-channel circuit 106. In one embodiment, the write-channel circuit 106 includes the data encoder disclosed in U.S. patent application entitled CODE AND METHOD FOR ENCODING DATA, which is now U.S. Pat. No. 6,492,918, which is heretofore incorporated by reference. The disk drive 102 also includes a read-channel circuit 112 for receiving a read signal from the head 104 and for recovering the written data from the read signal, and includes a read controller 114 for organizing the read data. In one embodiment, the read-channel circuit 112 is similar to the read channel 14 of FIG. 1 except that it includes the data decoder disclosed in U.S. patent application entitled CODE AND METHOD FOR ENCODING DATA, which is now U.S. Pat. No. 6,492,918, the read head 16 is omitted, and the Viterbi detector 20 is replaced with the Viterbi detector 50. The disk drive 142 further includes a storage medium such as one or more disks 116, each of which may contain data on one or both sides. The write/read head 104 writes/reads the data stored on the disks 116 and is connected to a movable support arm 118. A position system 120 provides a control signal to a voice-coil motor (VCM) 122, which positionally maintains/moves the arm 118 so as to positionally maintain/radially move the head 104 over the desired data on the disks 116. A spindle motor (SPM) 124 and a SPM control circuit 126 respectively rotate the disks 116 and maintain them at the proper rotational speed.

The disk-drive system 100 also includes write and read interface adapters 128 and 130 for respectively interfacing the write and read controllers 108 and 114 to a system bus 132, which is specific to the system used. Typical system busses include ISA, PCI, S-Bus, Nu-Bus, etc. The system 100 also typically has other devices, such as a random access memory (RAM) 134 and a central processing unit (CPU) 136 coupled to the bus 132.

The traditional SOVA computes the LLR as the minimum difference between the log of the probability of the path leading to a 0 or 1 decision and the log of the probability of the path leading to the opposite decision. Note that the log of the probability of the path is represented by path metric value which is the sum of the state metric and the branch metric at time 'k'.

The difference between the path metrics is considered only if the best path and its alternate lead to a different decision. In this case the LLR is computed in the same way as the max-log-map system. By minimizing the path metric difference one maximizes the probability (path metric) of the path leading to decision 1 .vs. the path leading to decision 0.

Figure 20:
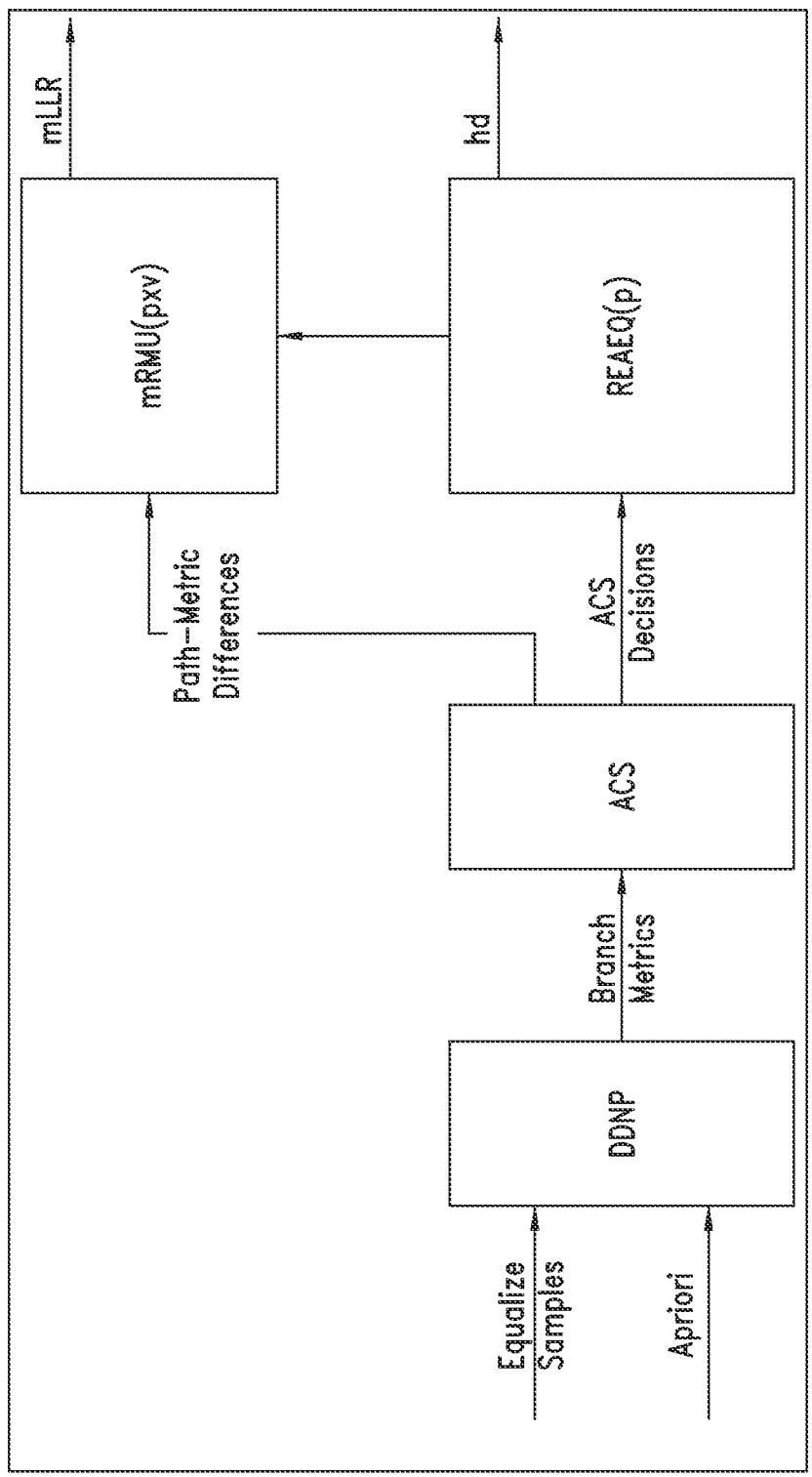
FIG. 20 is a functional block diagram of a modified SOVA detector according to one embodiment.
Figure 21:
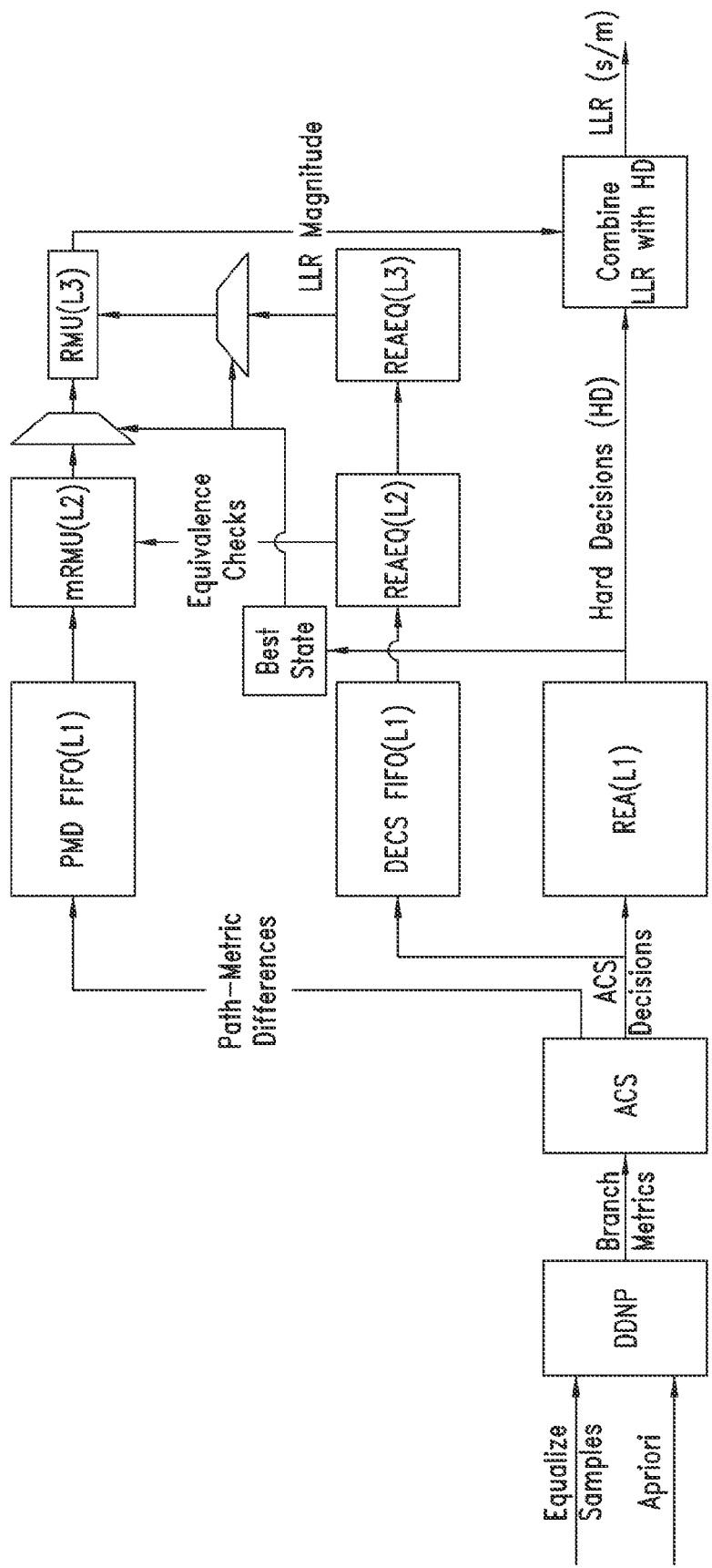
FIG. 21 is a functional block diagram illustrating the internal organization of the modified SOVA detector of FIG. 20 according one embodiment.
Figure 22:
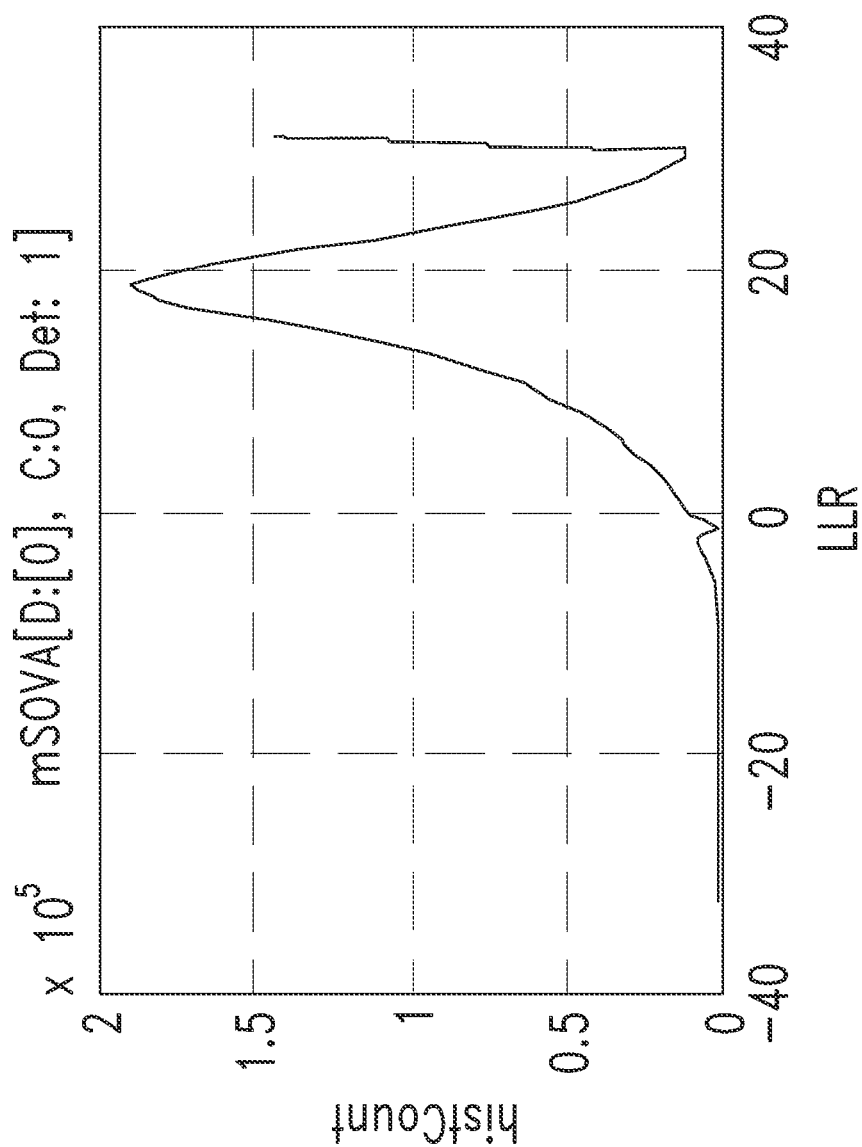
FIGS. 22-45 are graphs illustrating operation of the modified soft output Viterbi Algorithm detector according to embodiments.
Figure 23:
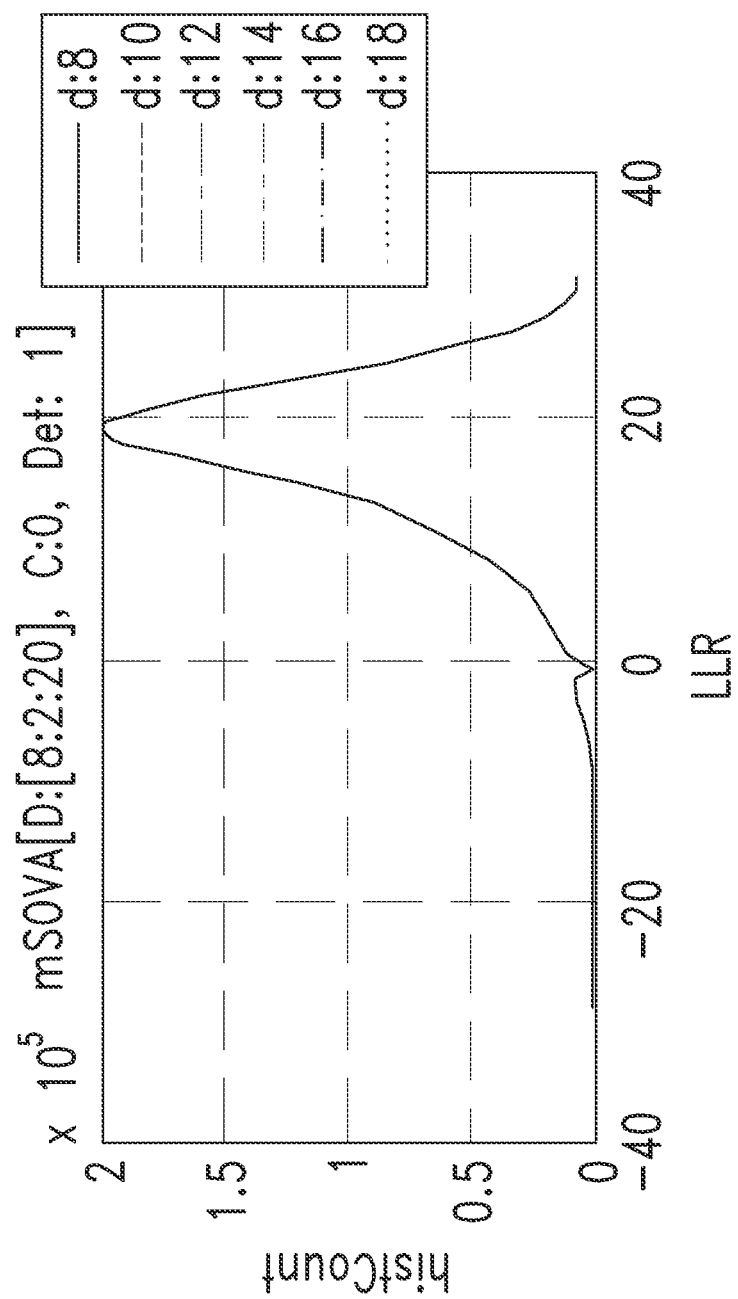
Figure 24:
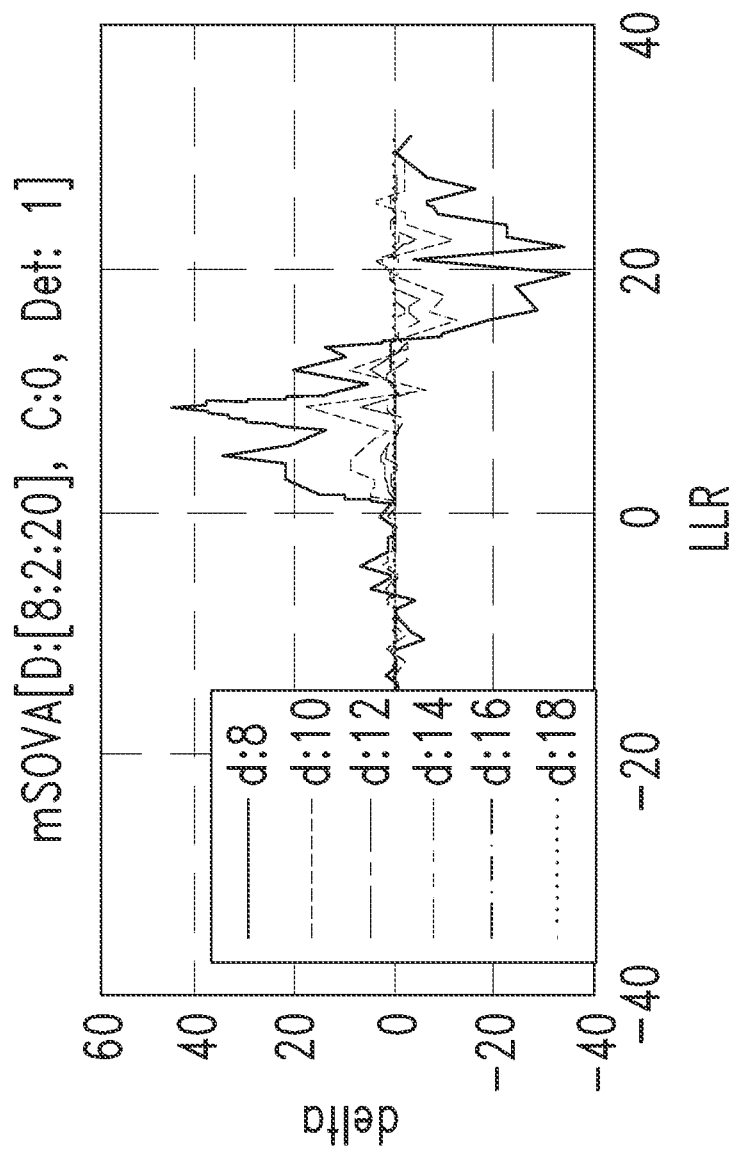
Figure 25:
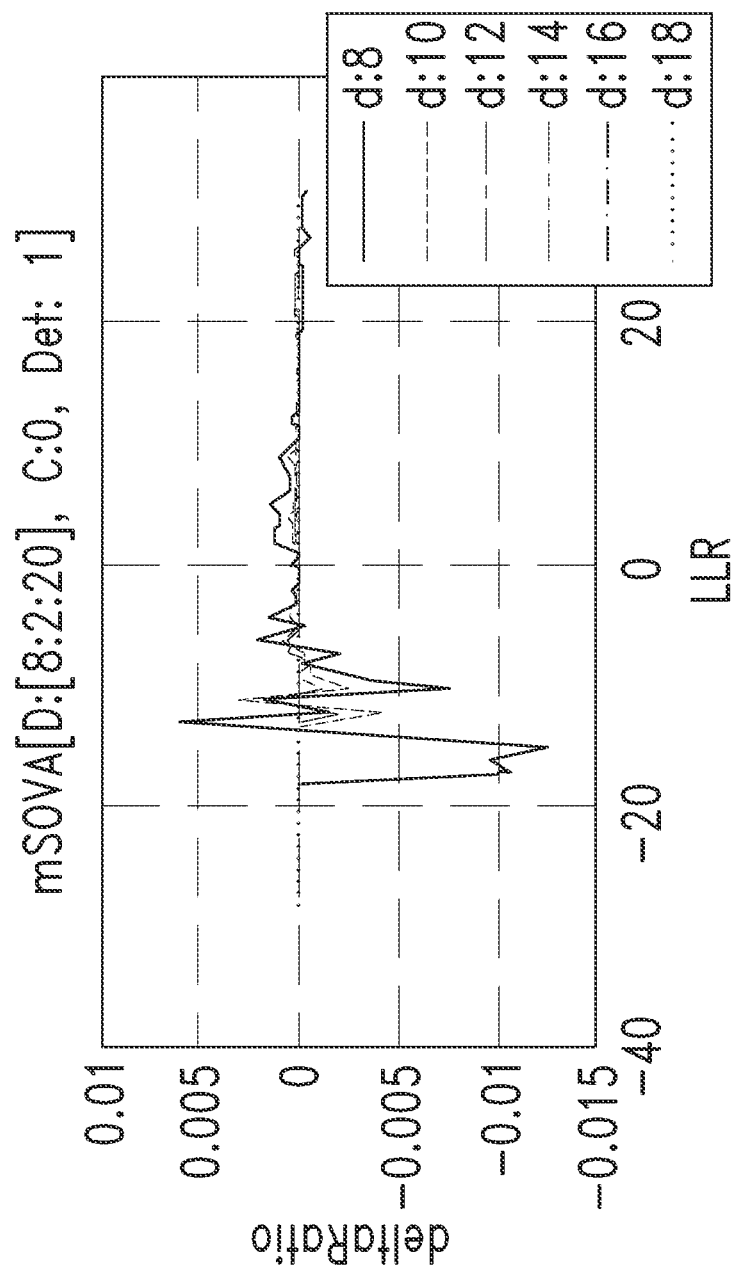
Figure 26:
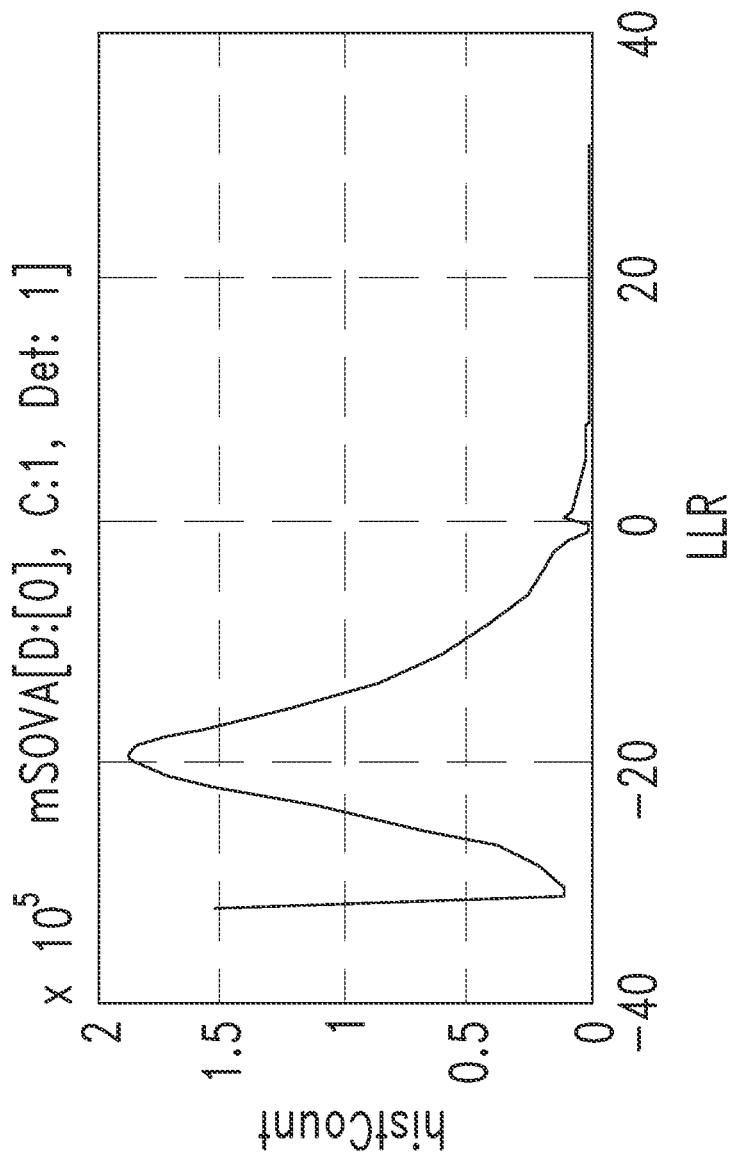
Figure 27:
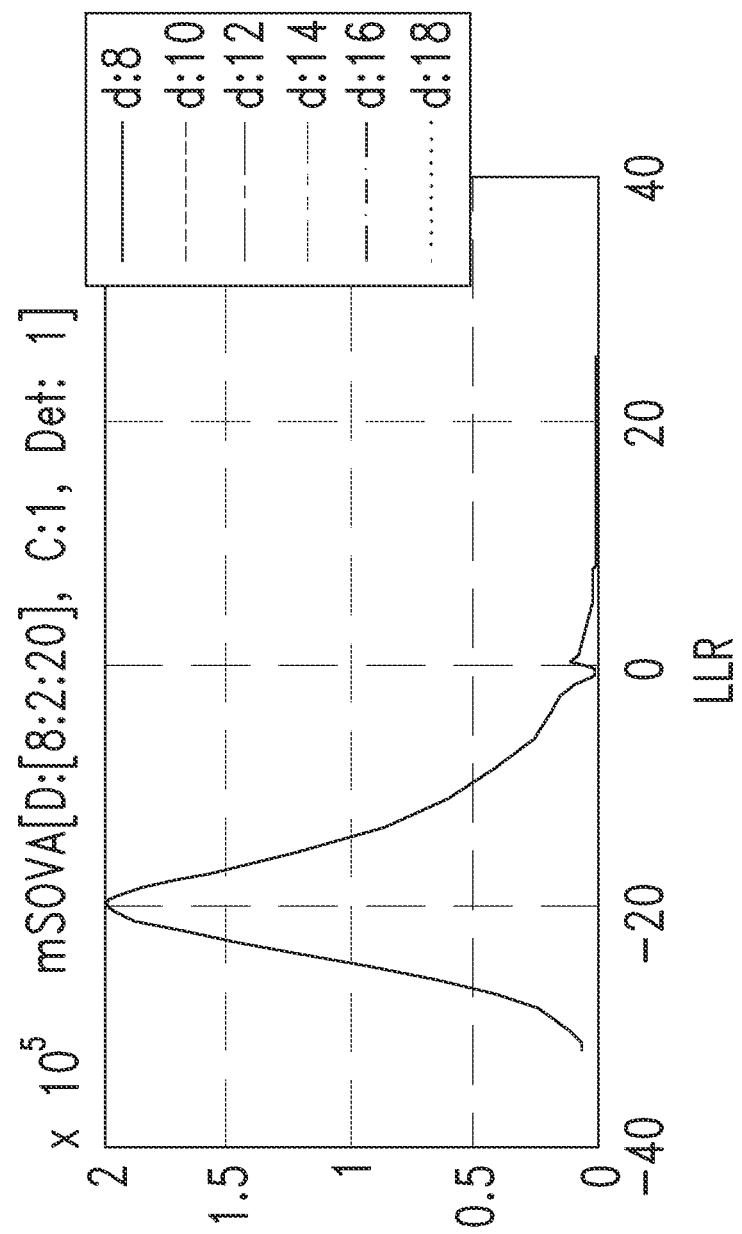
Figure 28:
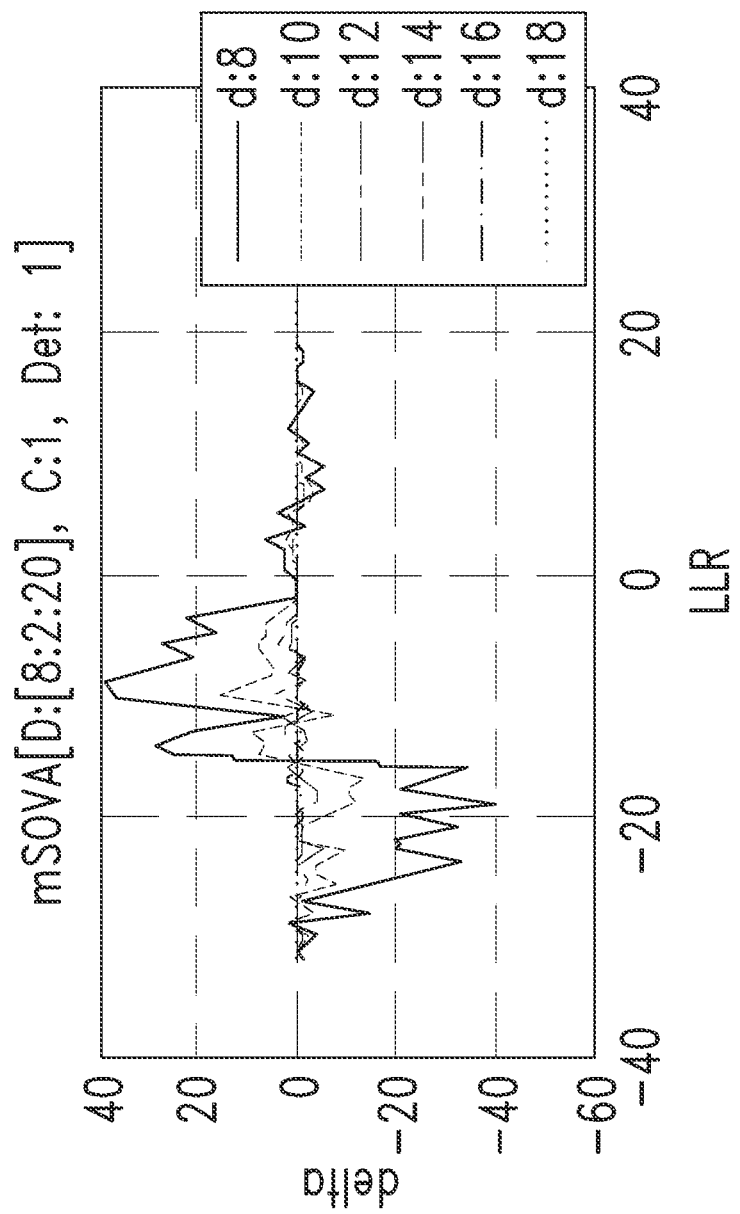
Figure 29:
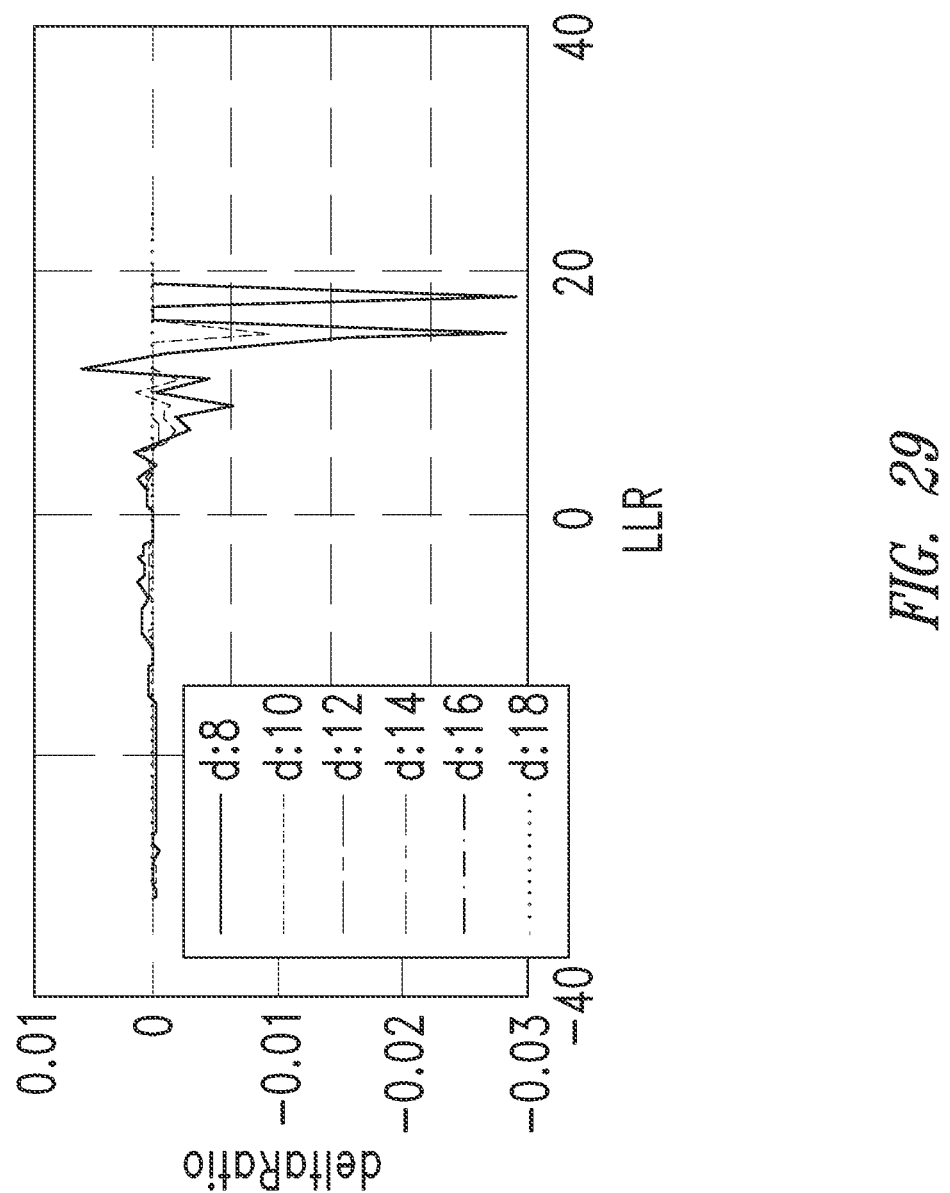
Figure 30:
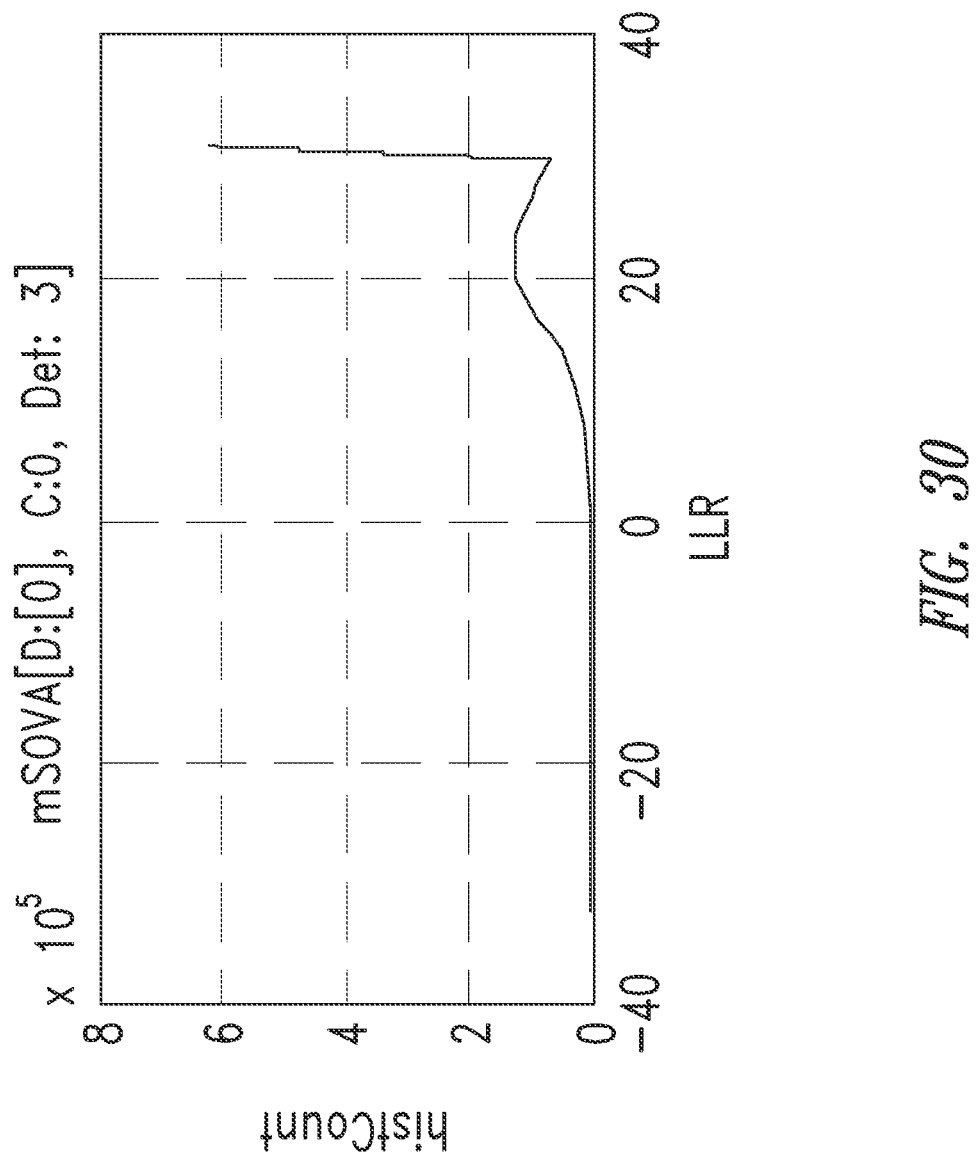
Figure 31:
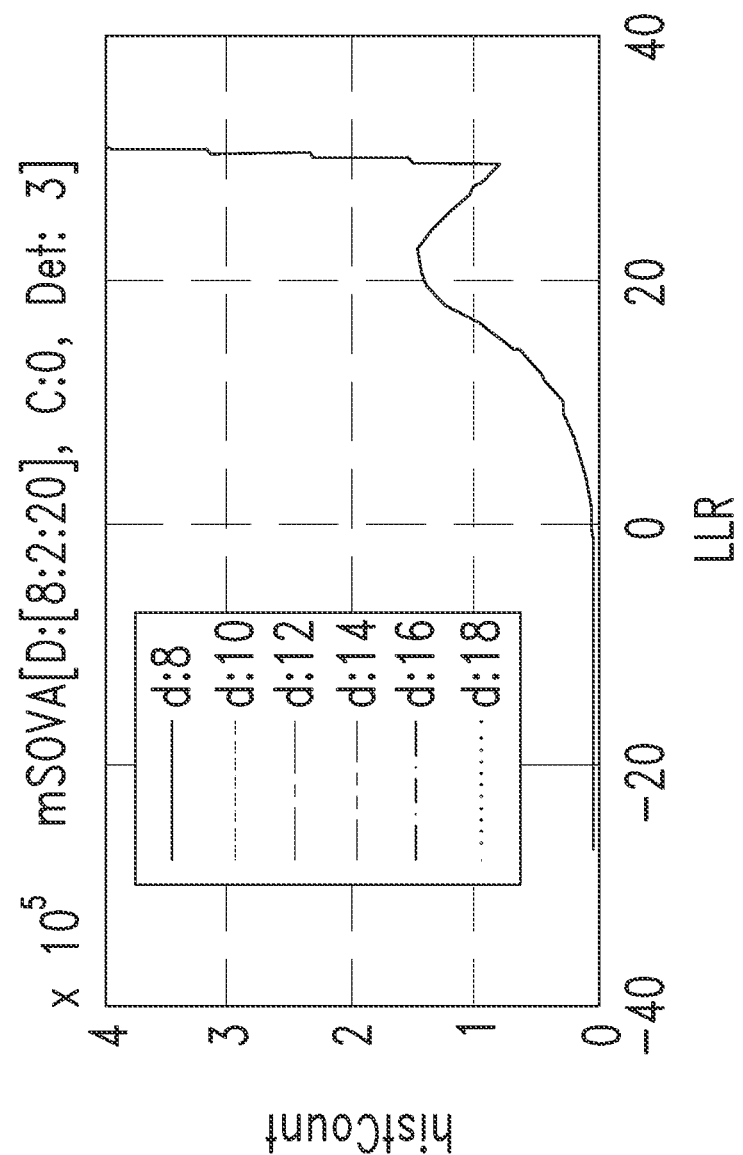
Figure 32:
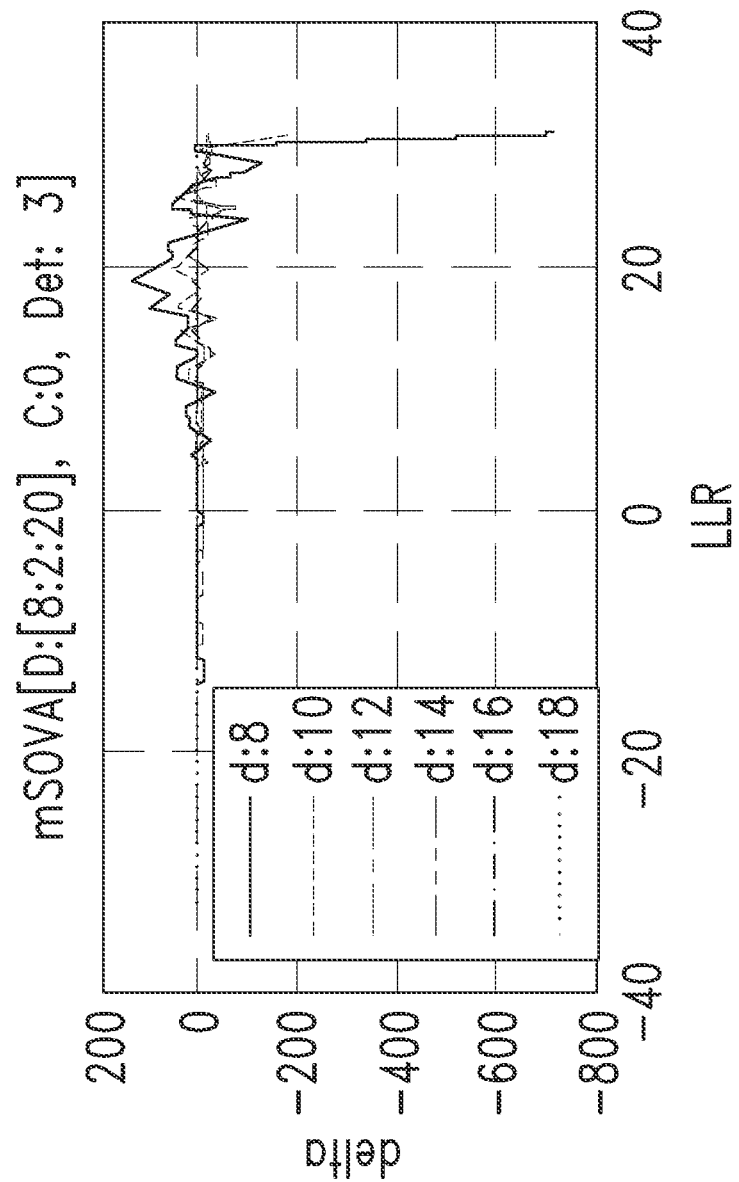
Figure 33:
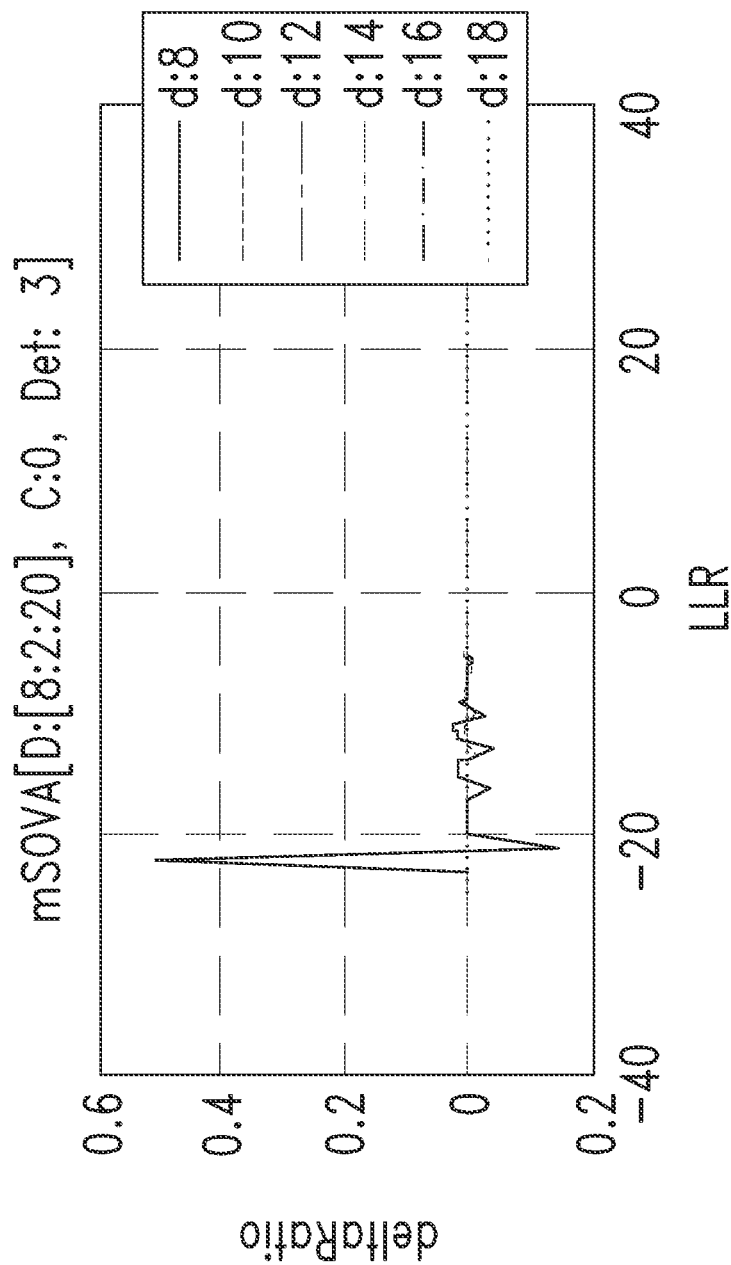
Figure 34:
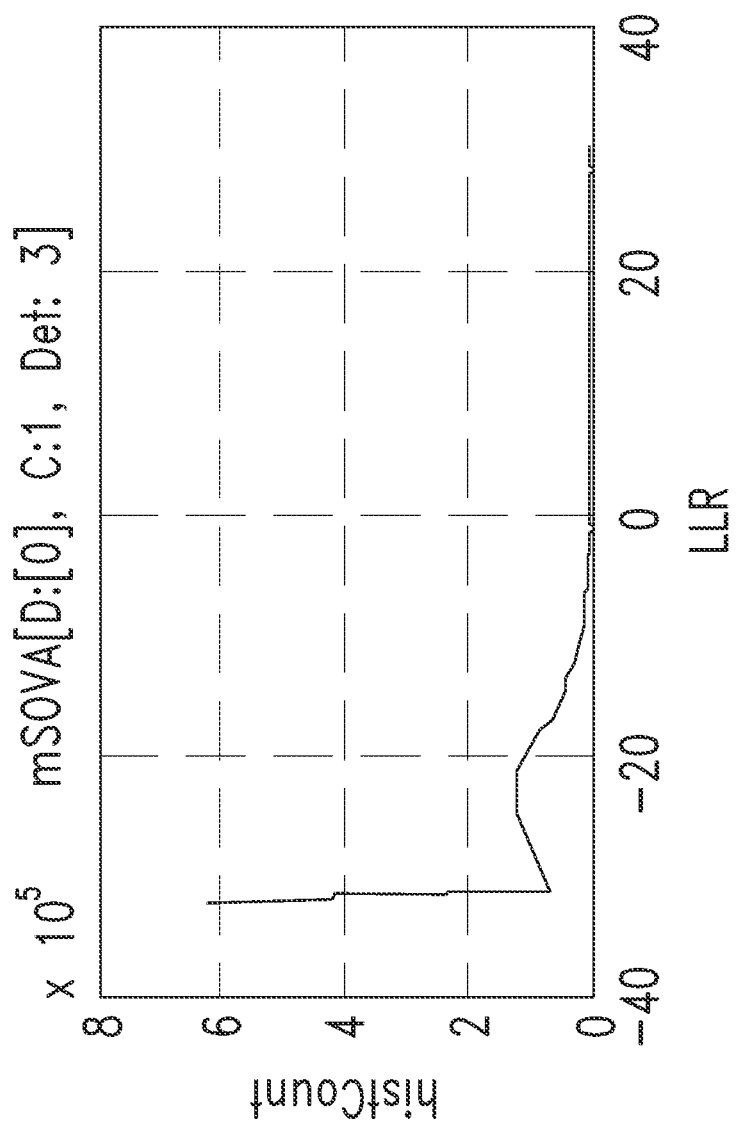
Figure 35:
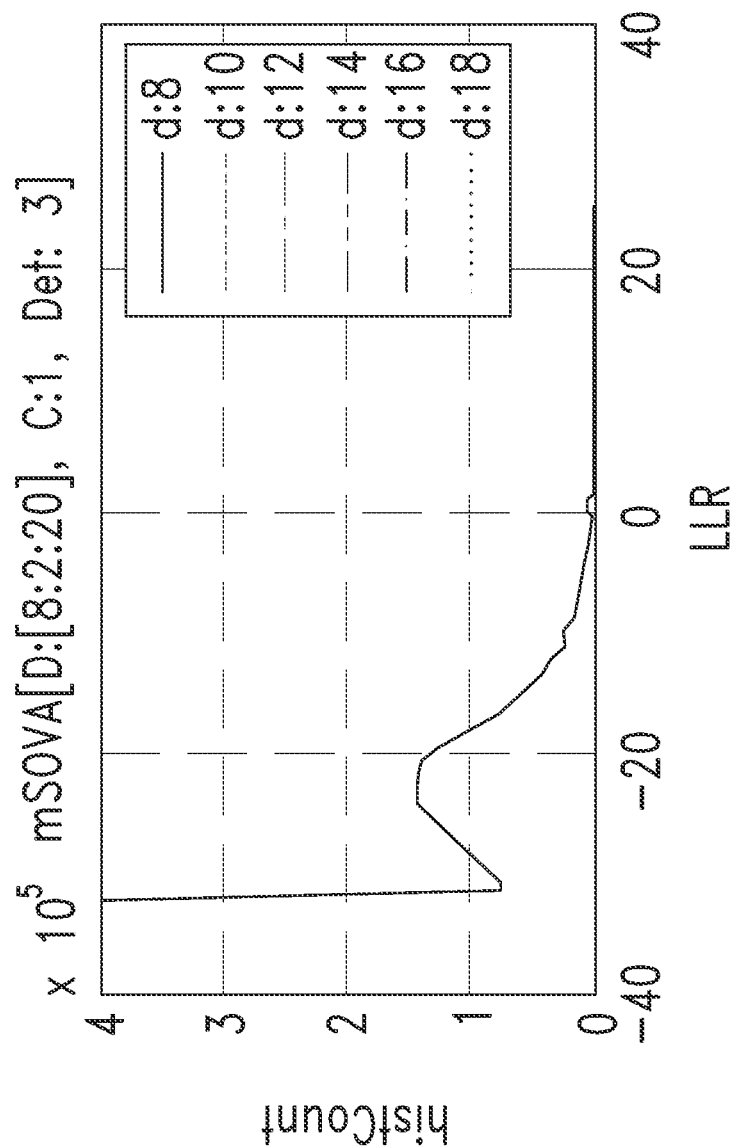
Figure 36:
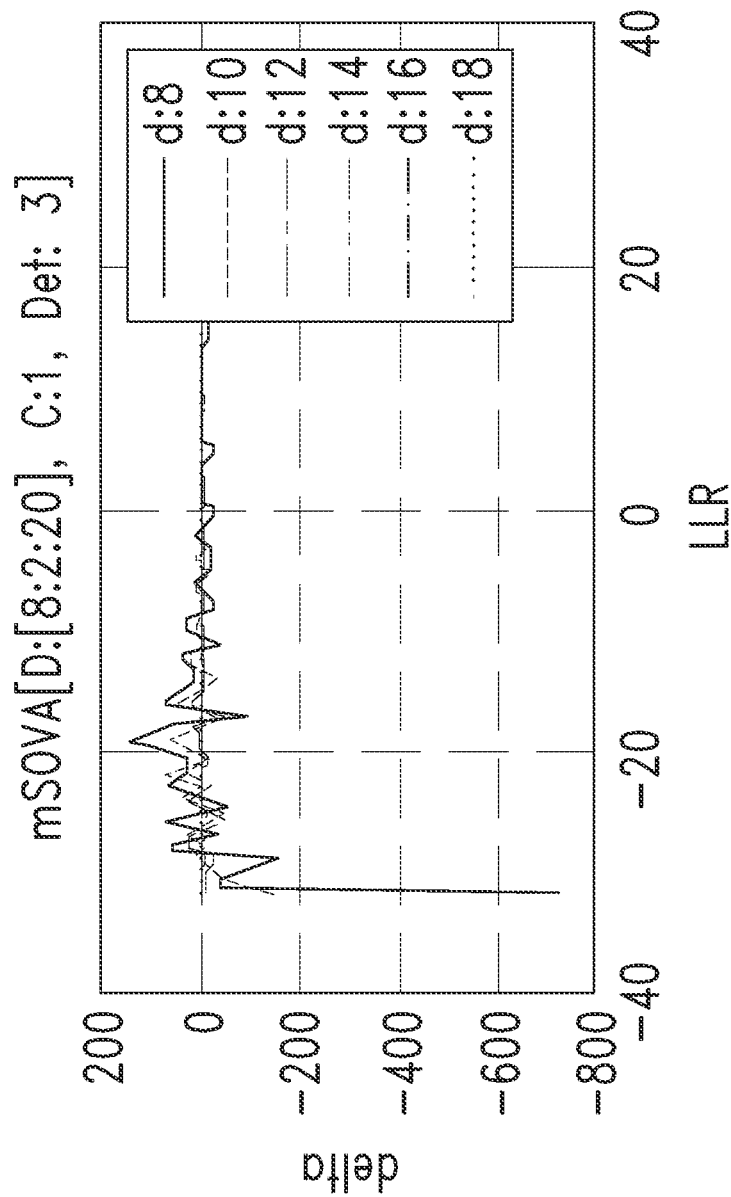
Figure 37:
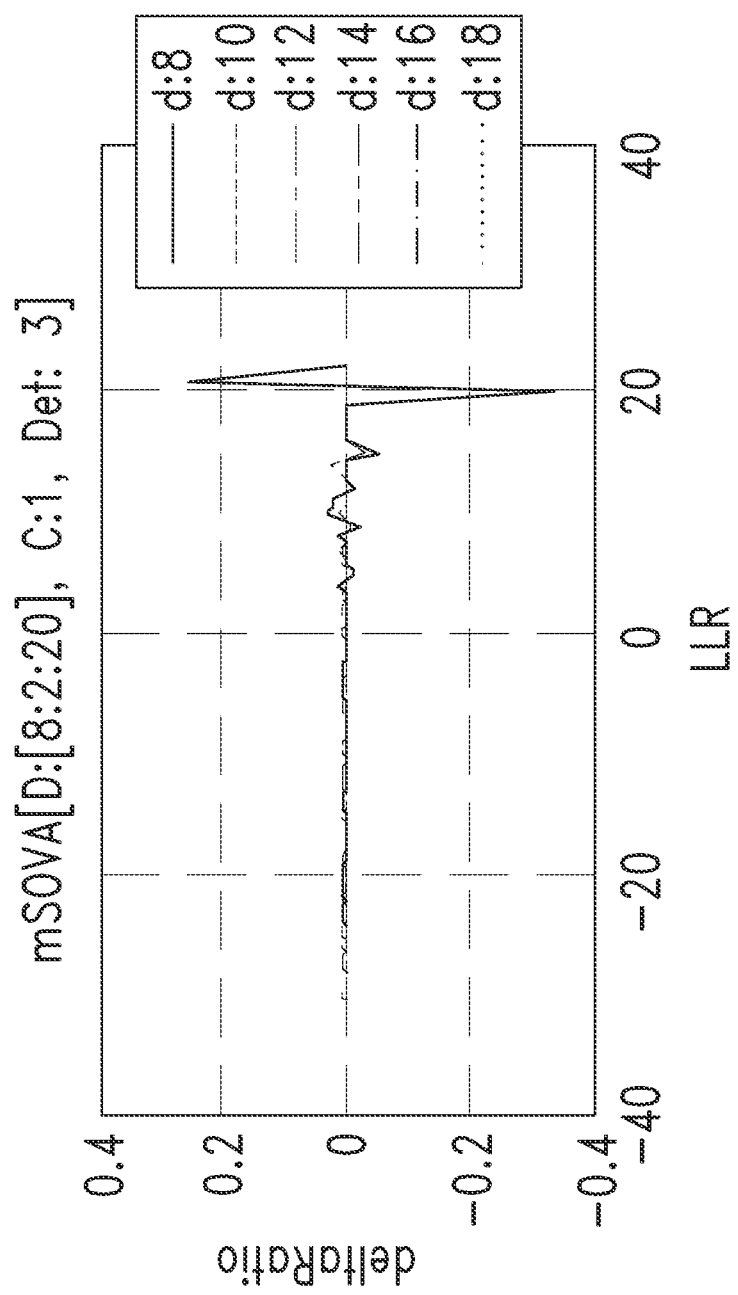
Figure 38:
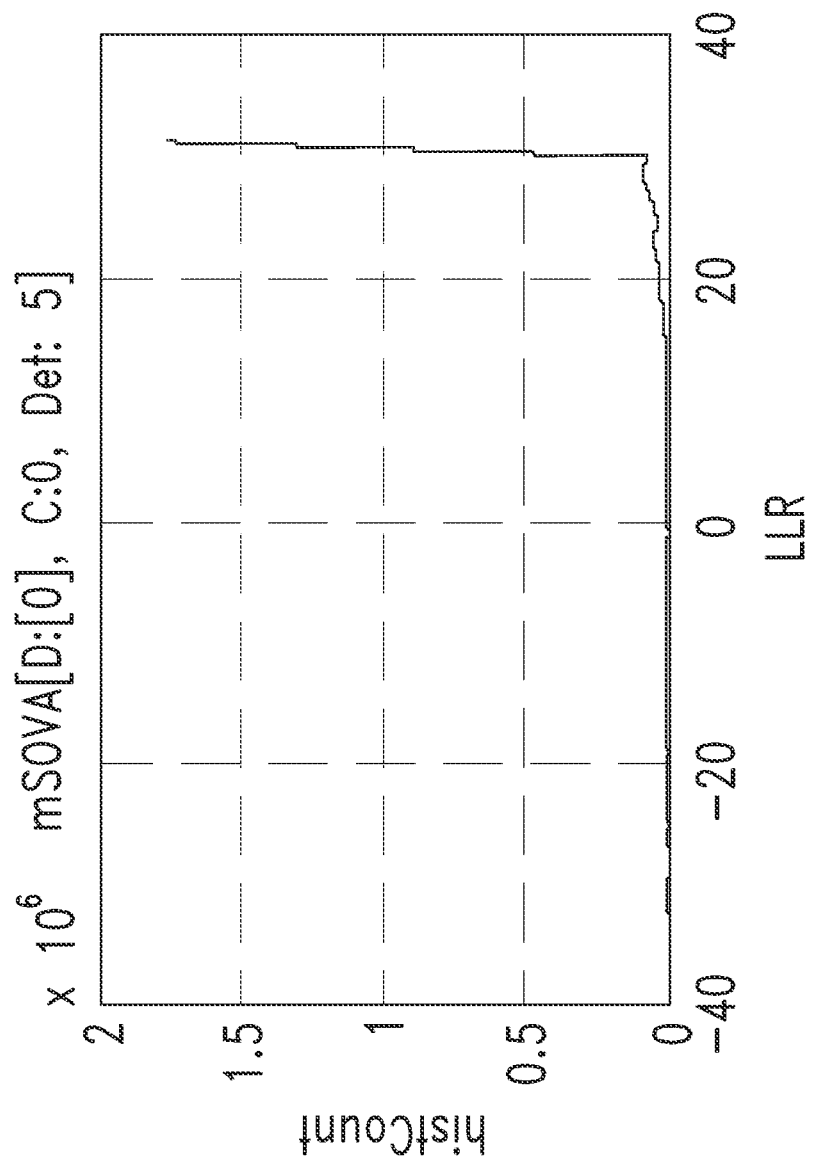
Figure 39:
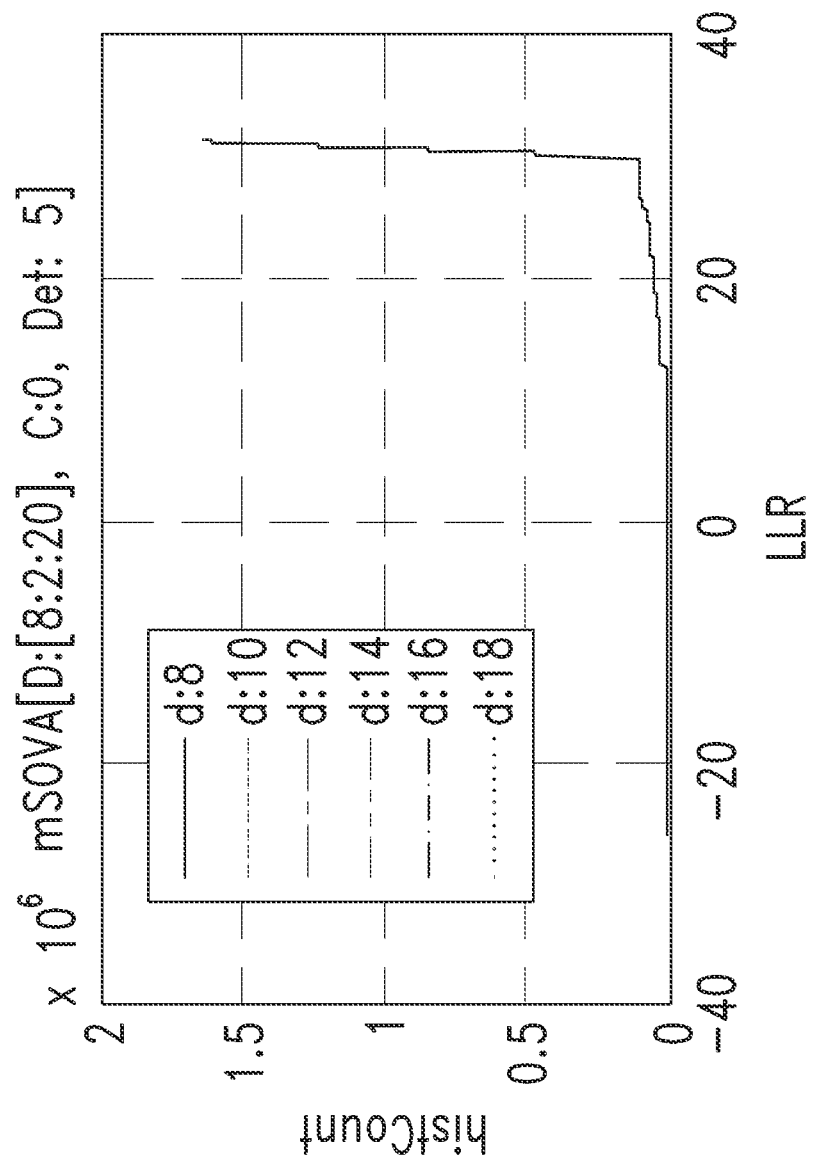
Figure 40:
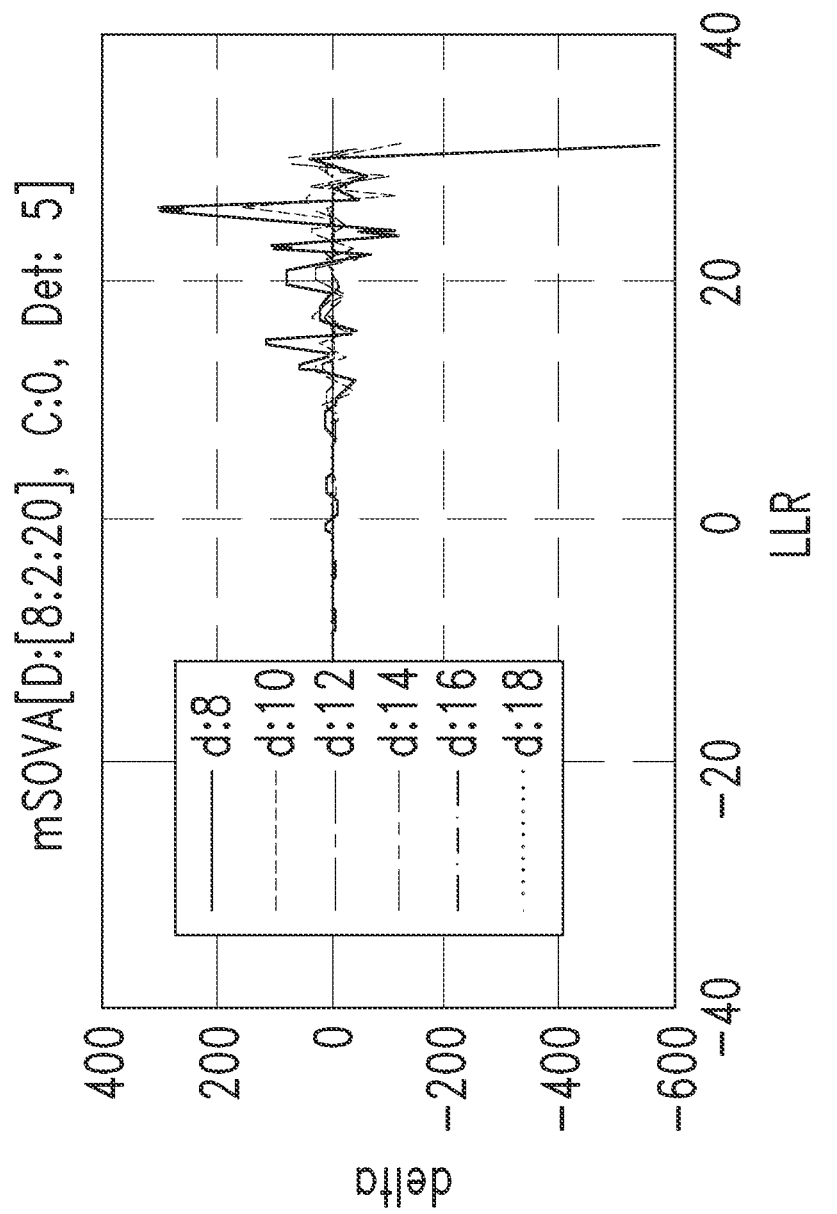
Figure 41:
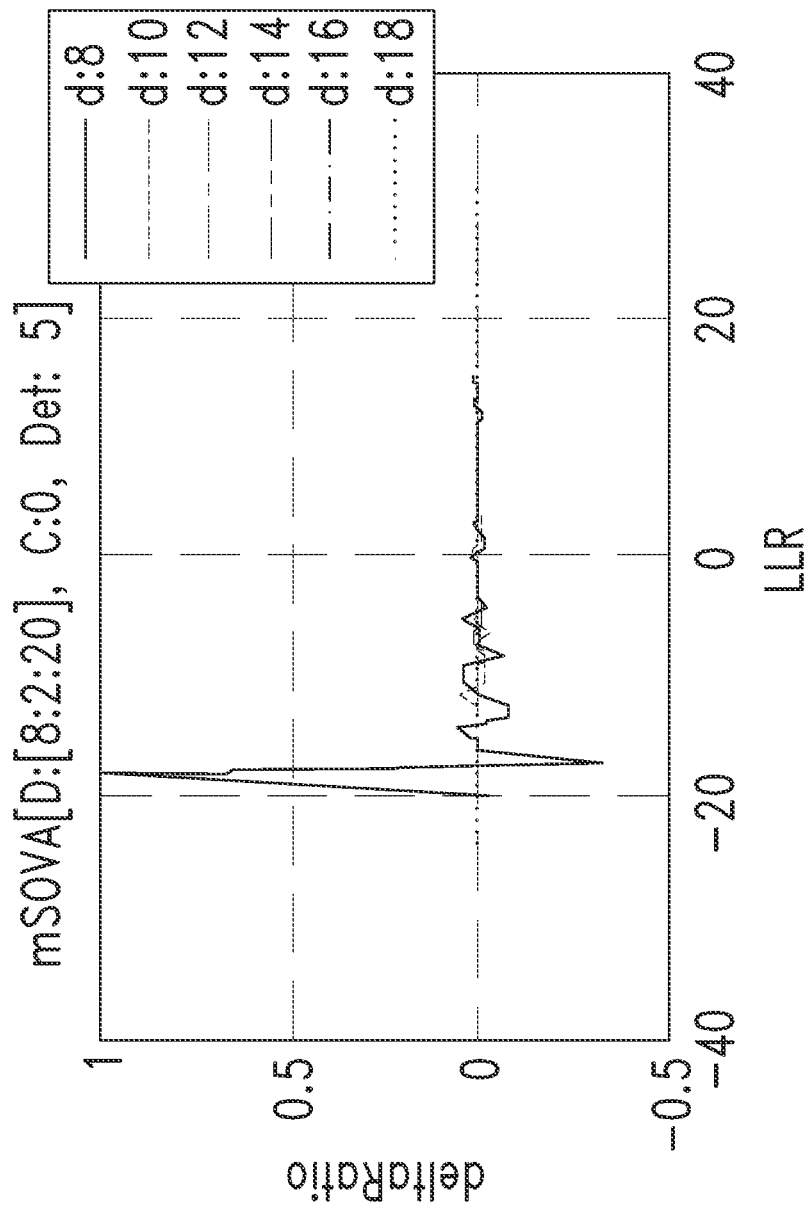
Figure 42:
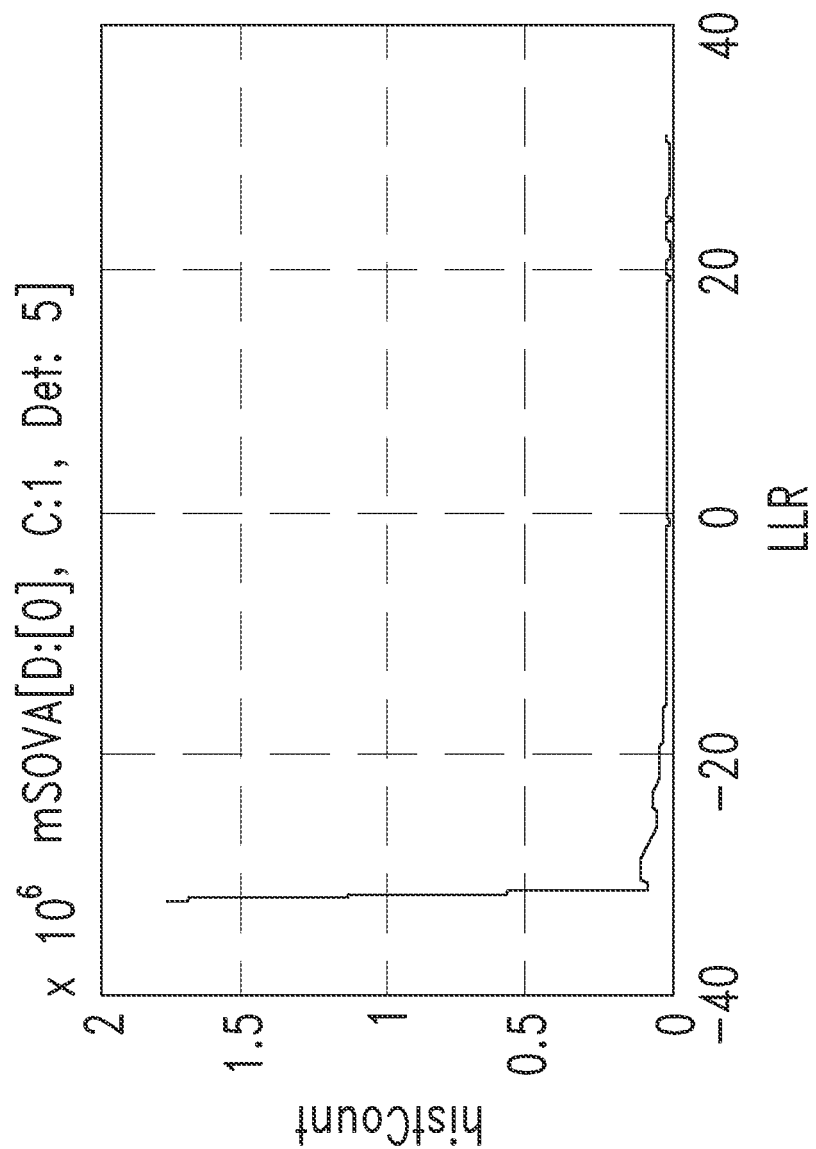
Figure 43:
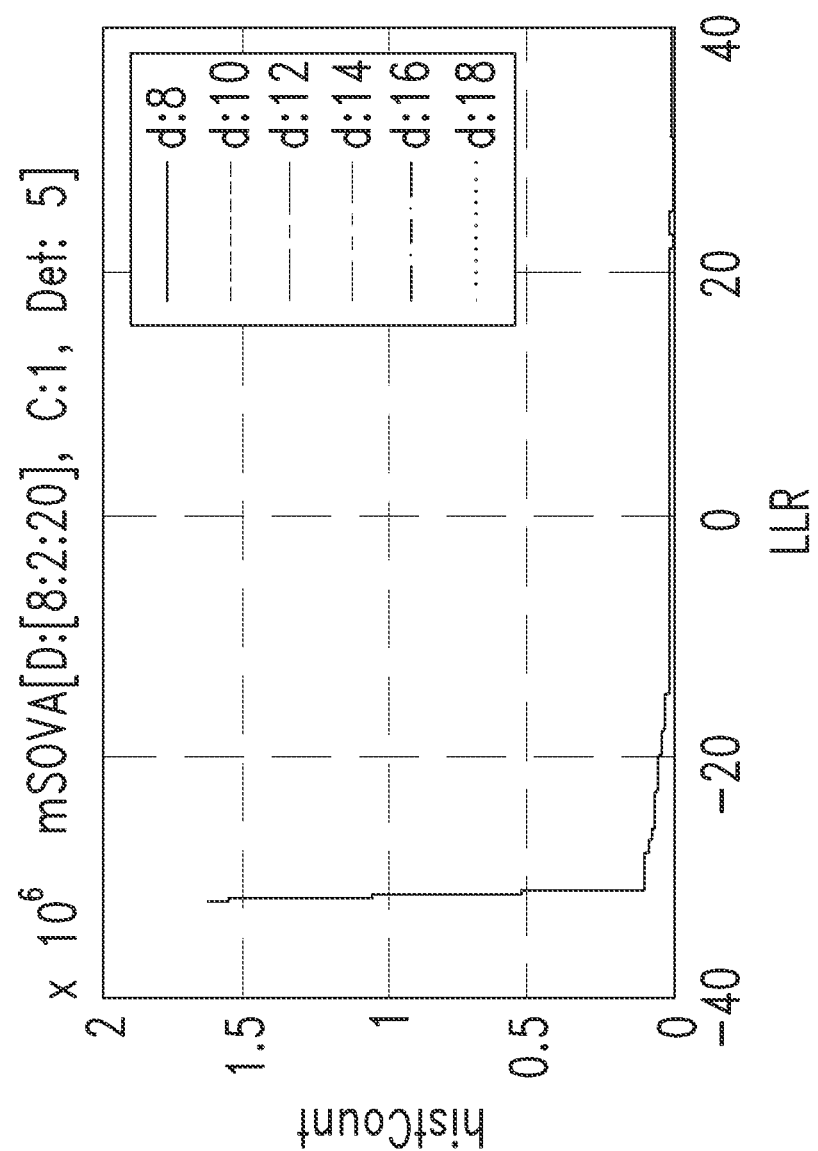
Figure 44:
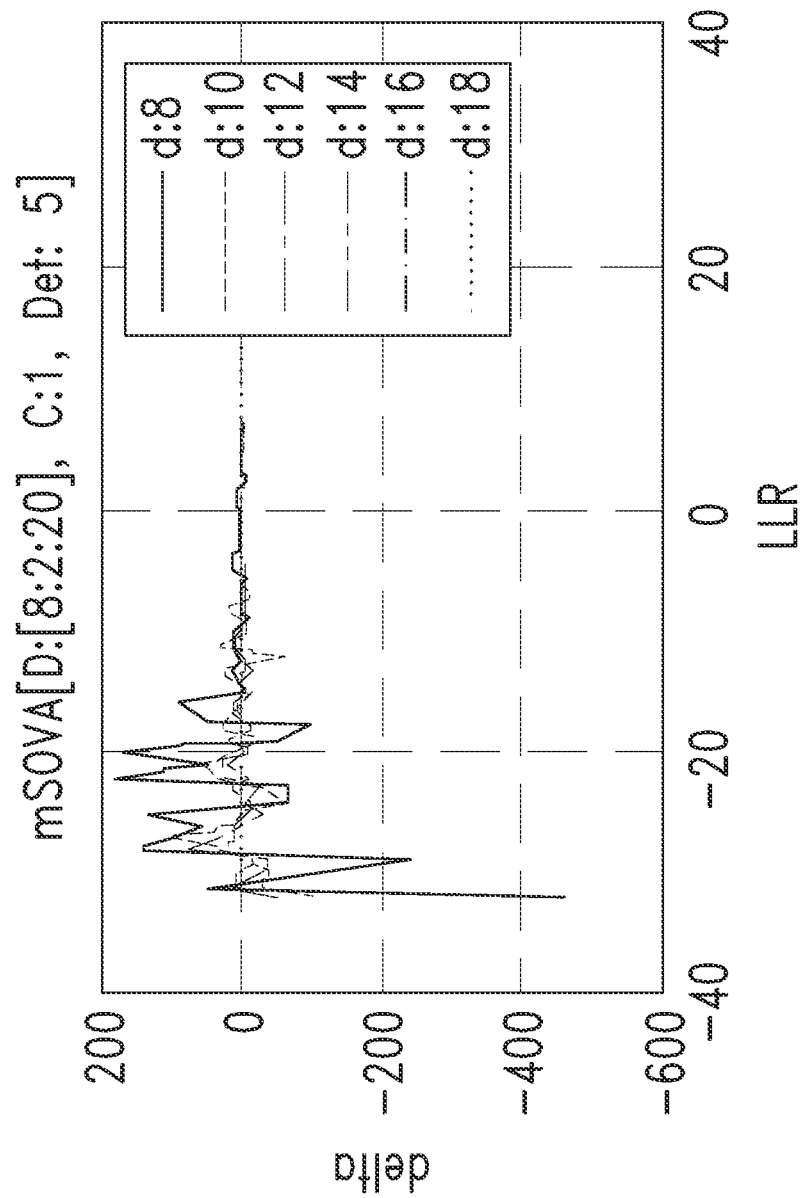
Figure 45:
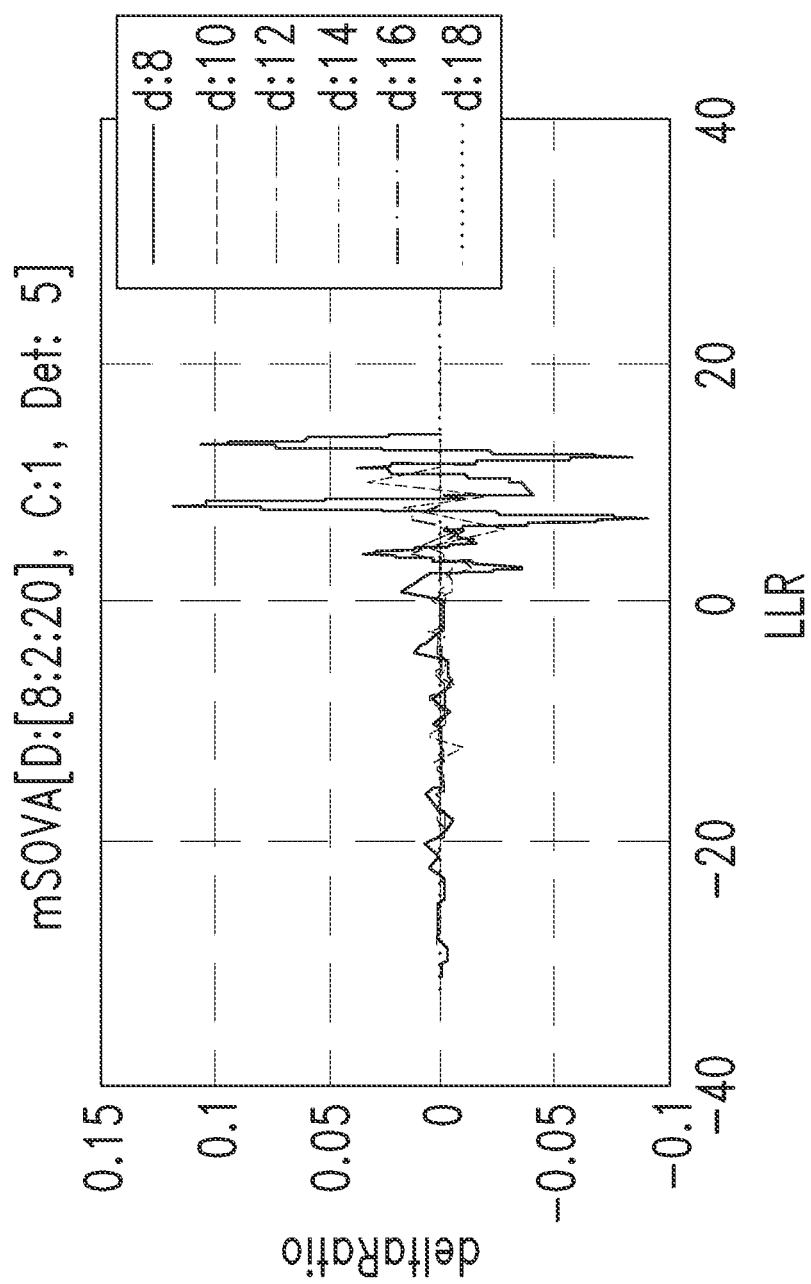

FIG. 20 is a functional block diagram of a modified SOVA detector according to one embodiment. FIG. 21 is a functional block diagram illustrating the internal organization of the modified SOVA detector of FIG. 20 according one embodiment. FIGS. 22-45 are graphs illustrating operation of the modified soft output Viterbi Algorithm detector according to embodiments. The SOVA sub-optimality is seen when the alternate path leads to the same decision as the best path. In this case the traditional SOVA algorithm does consider the path metric difference in updating the reliability information. The Fossorier paper referenced above indicates that if there is a third path departing from the alternate path leads to a opposite decision with respect to the best path, this path should be considered in the update of the reliability of the best path. The problem is to find an implementation for generating max-log-map equivalence LLR ratios that does not compromise on performance and is attractive in terms of SAPL over a traditional SOVA. A traditional SOVA includes register exchange architecture (REA) to compute the best path, a path-metric and decision FIFO (PMD-FIFO) reliability metric unit (RMU) along with register exchange equivalency check logic (REAEQ) to track the best path and the alternate path results.

Given a path memory depth 'p', RMU depth 'r', number of Viterbi states 'v', the resources required for a SOVA detector and a modified SOVA (mSOVA) detector generating max-log-map equivalence LLR are shown in the table below:

| Function | Number of Stages | | |
|---|---|---|---|
| | SOVA | mSOVA: Solution A | mSOVA: Solution B |
| REA | 'p' | 'p' | 'p' |
| PMD-FIFO | 'p' | | (p − q) |
| RMU | 'r' | 'p × v' | '(q × v) + p' |
| REAEQ | 'r' | 'p' | 'p' |

In another approach a modified RMU for (<p) stages and the traditional RMU for the remainder number of stages. The motivation is to reduce the implementation cost of modified RMU which scales by the number of Viterbi states. State metrics can start from any random value. This approach generates a savings in area & power without significantly compromising on performance as evident in the LLR plots.

Typically initial & terminating states of a Viterbi are known and it is important to initialize these states so that the paths are pinned during trace-back. However the traditional method of implementing this function creates an important path in the accumulate-compare-select (ACS) logic. This was the motivation to develop an alternative method to perform this function without exasperating this path. Apriori-based State Metric Initialization solves this problem. This method assumes the following: a) state metrics can start from any random value; b) assuming an n tap DDNP FIR there are at least n equalized samples prior to the user data; and c) at least the ideal p greater than or equal to 4 bits prior to the user data is known to fabricate the apriori. This is equivalent to the last p bits in the Syncmark pattern.

The following sequence is then employed to initialize the state metric to a known state prior to user data:
  a. a. Fabricate the high confidence apriori for the last 'p' bits of the Syncmark pattern.
  b. b. Use the apriori alone for branch metric computation for these 'p' bit times.
  c. c. The DDNP filters will have to see the last 'n' bits of the 'p' bits to warm up its delay lines.
  d. d. By the time the user data arrives the best state will correspond to the last 4-bits of the Syncmark pattern.

Apriori-based State Metric Termination assumes that one can fabricate the high confidence apriori for the pad bits. After the last user data the branch metric computation uses the fabricated 'apriori alone' to prune the trellis. A minimum of 4 pad bits is required for this operation.

Traditionally branch metrics that factor in apriori in its computation tends to keep them signed. However one can see that if it is possible to use unsigned branch metric instead, one can reduce the width of the path metric by a single bit and help improve ACS performance. The following method of factoring in apriori achieves this result and provides an unsigned branch metric and therefore an unsigned path metric.

| ap(k) | Dest | SM | Tiziano Possible Winners | Ares Possible winners | Note |
|---|---|---|---|---|---|
| >0 | (2i) | sm(i) | sm(i) + bm(i) − \|ap(k)\| | sm(i) + bm(i) | Equivalent to adding + \|apk\| to all the Tiziano state metrics when apk > 0 |
| | | sm(i + 4) | sm(i + 4) + bm(i + 4) − \|ap(k)\| | sm(i + 4) + bm(i + 4) | |
| | (2i + 1) | sm(i) | sm(i) + bm(i) | sm(i) + bm(i) + \|ap(k)\| | |
| | | sm(i + 4) | sm(i + 4) + bm(i + 4) | sm(i + 4) + bm(i + 4) + \|ap(k)\| | |
| <0 | (2i) | sm(i) | sm(i) + bm(i) + \|ap(k)\| | sm(i) + bm(i) + \|ap(k)\| | No adjustment to Ares state |
| | | sm(i + 4) | sm(i + 4) + bm(i + 4) + \|ap(k)\| | sm(i + 4) + bm(i + 4) + \|ap(k)\| | |

-continued

| ap(k) | Dest | SM | Tiziano Possible Winners | Ares Possible winners | Note |
|---|---|---|---|---|---|
| | (2i + 1) | sm(i) | sm(i) + bm(i) | sm(i) + bm(i) | metrics when |
| | | sm(i + 4) | sm(i + 4) + bm(i + 4) | sm(i + 4) + bm(i + 4) | apk < 0 |

The problem that is solved relates to the timing of the DDNP parameters that drive the branch metric generation for the SOVA. This problem is quite severe when the gap between two fragments is comparable to the depth of the DDNP pipeline. This is indeed the case for high data rates. Different portions of DDNP parameters are used at different points in the DDNP pipeline. The challenge therefore is to perform an update without disrupting the pipeline and keep the parameters consistent. This problem did not exist until continuous calibration of DDNP parameters is desired.

The mentioned challenge is overcome by performing a rolling update of DDNP parameters with the portions updated in a pipelined lock-step manner. This presents a consistent set of parameters for a branch metric computation. In addition the update allows for independent update of the parameters related to a single condition as & when new parameters are generated.

The ACS (Add-Compare-Select) and REA (L1) (Register Exchange Architecture) blocks implement a standard Viterbi detection that computes through the REA the hard decisions. The SOVA computes the LLR by tracking the minimum Path Metric (Branch Metric+State Metric) difference computed in the presence of an alternate path leading to a different decision.

This is accomplished by aggregating the path metric difference throught the RMU (Reliability Measuring Unit) network that is driven by the equivalency checks performed by the REAEQ block. The REAEQ (REA+equivalence check) replays the REA aggregation once that the hard decisions are computed. The hard decisions are used to select the best state (used to track the best path) for every stage of the REAEQ.

The RMU aggregates the path metric difference computed by the ACS and selected by the hard decision out of the FIFO. The PMFIFO and DECSFIFO are used to hold the Path Metric Difference and the ACS decisions until the hard decision of the REA are ready and the best path is known. Since the Path Metric Difference is an absolute value the final LLR is obtained by combining the hard decision with the RMU LLR to form a signed LLR value.

The Fossorier modification for an 'n' state SOVA with soft-memory depth 'L' requires (n−1)*L additional RMU resources. For our iterative system, 'n'=8, 'L'=28, therefore this amounts to 7×28 additional RMU units. The question therefore is to reduce this cost without significantly affecting the performance. A hybrid solution is therefore proposed with L1 stages of Fossorier update and (L-L1) stages of traditional RMU. This would result in a resource increase of ((n−1)*L1) RMU units to implement this modification. A proper choice of L1 is therefore important and to this end we ran simulations with msimAM in fixed point corresponding to the worst case SNR where BER at the output of 1st SOVA is 1.6 e−2 with an iterative decoder. We used total of 3 instances of SOVA to understand if the choice of 'L' was instance specific. The results are captured in FIGS. 22-45. The two figures in the first row correspond to the conditional histogram for the case with no Fossorier modification.

The two figures in the 2nd row show the conditional histogram for the case with Fossorier modification for L1=[8:2: 18]. The two figures in the 3rd row show to the error in conditional histogram for the case with Fossorier modification for L1=[8:2:18].vs. the case when L1=20. The 4th row includes two figures that show the error ratio/LLR in conditional histogram for the case with Fossorier modification for L1=[8:2:18].vs. the case when L1=20. The operating conditions are: Simulator: msimAM, fixed-point mode, 8-State mSOVA, +Iterative Decoder (8-State) Operating Point: snr: 11.2, ubd: 2.1, jit: 0.9, nsecs=1000, Same Seed for d=8:2:18 Version: arisso__020508

The first SOVA for d=8, the deltaRatio is about is about 0.03 for the worst performing LLR. However, for d=10, the deltaRatio is under 0.01 for the worst case & this corresponds to a LLR of magnitude 18. The second SOVA SOVA again d=10, the deltaRatio is under 0.05 for the worst case LLR. The third SOVA and even in this case for d=10, the deltaRatio is under 0.025 for the worst case LLR.

From the foregoing it will be appreciated that, although specific embodiments have been described herein for purposes of illustration, various modifications may be made without deviating from the spirit and scope of the disclosure.

What is claimed is:

1. A Viterbi detector, comprising:
an input terminal configured to receive a signal that represents a sequence of values;
a register; and
a recovery circuit coupled to the input terminal and to the register, the recovery circuit configured to recover only groups of values having a same parity and load the recovered groups into the register.

2. The Viterbi detector of claim 1 wherein the parity comprises odd parity.

3. The Viterbi detector of claim 1 wherein the groups of values each comprises a respective set of data bits and a respective set of code bits.

4. The Viterbi detector of claim 1 wherein the groups of values each comprises a respective set of data bits, a respective set of code bits, and a respective parity bit.

5. The Viterbi detector of claim 1 wherein the groups of values each comprise a respective code word that includes twenty six bits, one of the bits being a parity bit.

6. The Viterbi detector of claim 1 wherein the recovery circuit is configured to identify the respective beginnings of each of the groups of values.

7. The Viterbi detector of claim 1 wherein the sequence of values comprises a sequence of binary values.

8. The Viterbi detector of claim 1 wherein:
the register comprises a shift register; and
the recovery circuit is configured to shift the recovered groups into the shift register.

9. The Viterbi detector of claim 1 wherein:
the values in the groups comprise respective code words; and
the recovery circuit is configured to generate a recovered sequence of code words.

10. The Viterbi detector of claim 1 wherein the recovery circuit is configured to generate the recovered groups of values by:

calculating a set of path lengths from a first and second sets of branch lengths;

identifying a state path that corresponds to the smallest one of the path lengths; and generating the recovered groups of values equal to the sequence of states in the state path.

11. A system, comprising:
a Viterbi detector, including:
an input terminal configured to receive a signal that represents a sequence of values;
a register; and
a recovery circuit coupled to the input terminal and to the register, the recovery circuit configured to recover only groups of values having a same parity, and load the recovered groups into the register.

12. The system of claim 11 wherein the system comprises a disk-drive system.

13. The system of claim 11 further comprising:
a data-storage disk having a surface and configured to store information values; and
a motor coupled to and configured to rotate the disk.

14. The system of claim 11 further comprising:
a read head configured to generate a read signal; and
a read-head positioning assembly configured to move the read head over the surface of the disk.

15. An integrated circuit, comprising:
a Viterbi detector, including:
an input terminal configured to receive a signal that represents a sequence of values;
a register; and
a recovery circuit coupled to the input terminal and to the register, the recovery circuit configured to recover only groups of values having a same parity, and load the recovered groups into the register.

16. The integrated circuit of claim 15 further comprising a single integrated circuit die.

17. The integrated circuit of claim 15 further comprising multiple integrated circuit dies.

18. The integrated circuit of claim 15 further comprising a processor.

* * * * *